(12) United States Patent
Hwang

(10) Patent No.: US 12,744,080 B2
(45) Date of Patent: Sep. 22, 2026

(54) NEUROMORPHIC DEVICE AND ELECTRONIC DEVICE INCLUDING THE SAME

(71) Applicant: Samsung Electronics Co., Ltd., Suwon-si (KR)

(72) Inventor: Youngnam Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1040 days.

(21) Appl. No.: 17/747,491

(22) Filed: May 18, 2022

(65) Prior Publication Data

US 2023/0005529 A1 Jan. 5, 2023

(30) Foreign Application Priority Data

Jul. 5, 2021 (KR) ........................ 10-2021-0087943
Oct. 19, 2021 (KR) ........................ 10-2021-0139252
(Continued)

(51) Int. Cl.
*G06N 20/00* (2019.01)
*G06F 7/50* (2006.01)
(Continued)

(52) U.S. Cl.
CPC ................ *G11C 11/54* (2013.01); *G06F 7/50* (2013.01); *G06N 3/063* (2013.01); *G06N 3/065* (2023.01);
(Continued)

(58) Field of Classification Search
CPC ..... G11C 11/54; G11C 11/161; G11C 13/004; G11C 7/14; G11C 7/16; G11C 2013/0054;
(Continued)

(56) References Cited

U.S. PATENT DOCUMENTS 10,340,003 B1 * 7/2019 Chang ................. G11C 11/5614
10,706,923 B2 7/2020 Seo et al.
(Continued)

FOREIGN PATENT DOCUMENTS

CN 112152619 A 12/2020
JP 2014-081842 A 5/2014
(Continued)

OTHER PUBLICATIONS

Danial, Loai, et al. "Breaking through the speed-power-accuracy tradeoff in ADCs using a memristive neuromorphic architecture." IEEE Transactions on Emerging Topics in Computational Intelligence 2.5 (2018): 396-409 (Year: 2018).*
(Continued)

*Primary Examiner* — Andrew T Mcintosh
(74) *Attorney, Agent, or Firm* — Fish & Richardson P.C.

(57) ABSTRACT

A neuromorphic device includes a plurality of cell tiles including a cell array including a plurality of memory cells storing a weight of a neural network, a row driver connected to the plurality of memory cells, and cell analog-digital converters connected to the plurality of memory cells and converting cell currents into a plurality of pieces of digital cell data, a reference tile including a plurality of reference cells, a reference row driver connected to the plurality of reference cells, and reference analog-digital converters connected to the plurality of reference cells and converting reference currents read via the plurality of reference column lines into a plurality of pieces of digital reference data, and a comparator circuit configured to compare the plurality of pieces of digital cell data with the plurality of pieces of digital reference data, respectively.

7 Claims, 47 Drawing Sheets

(30) Foreign Application Priority Data

Nov. 11, 2021 (KR) ........................ 10-2021-0154801
Dec. 17, 2021 (KR) ........................ 10-2021-0181445

(51) Int. Cl.
*G06N 3/063* (2023.01)
*G06N 3/065* (2023.01)
*G06N 3/08* (2023.01)
*G11C 11/16* (2006.01)
*G11C 11/54* (2006.01)
*G11C 13/00* (2006.01)

(52) U.S. Cl.
CPC .............. *G06N 3/08* (2013.01); *G11C 11/161* (2013.01); *G11C 13/004* (2013.01)

(58) Field of Classification Search
CPC .............. G11C 7/1006; G11C 11/1653; G11C 11/1673; G11C 13/0021; G06F 7/50; G06N 3/063; G06N 3/065; G06N 3/08; G06N 3/049; G06N 3/0495
See application file for complete search history.

(56) References Cited

U.S. PATENT DOCUMENTS

| | | | |
|---|---|---|---|
| 10,831,860 B2 | 11/2020 | Kim et al. | |
| 10,832,773 B1 | 11/2020 | Kim et al. | |
| 10,878,317 B2 | 12/2020 | Hatcher et al. | |
| 10,984,313 B2 | 4/2021 | Liu et al. | |
| 2016/0284400 A1 | 9/2016 | Yakopcic et al. | |
| 2017/0277628 A1 | 9/2017 | Paul et al. | |
| 2018/0018559 A1 | 1/2018 | Yakopcic et al. | |
| 2020/0050928 A1 | 2/2020 | Narayanan et al. | |
| 2020/0151550 A1 | 5/2020 | Garbin et al. | |
| 2020/0202204 A1 | 6/2020 | Kouno et al. | |
| 2020/0218963 A1 | 7/2020 | Yasuda et al. | |
| 2020/0234114 A1 | 7/2020 | Rakshit et al. | |
| 2020/0293284 A1 | 9/2020 | Vantrease et al. | |
| 2020/0349217 A1 | 11/2020 | Luo | |
| 2020/0349440 A1 | 11/2020 | Gokmen | |
| 2021/0043264 A1 | 2/2021 | Sarin et al. | |
| 2021/0064974 A1 | 3/2021 | Kim et al. | |
| 2021/0072956 A1 | 3/2021 | Seo et al. | |
| 2021/0110244 A1 | 4/2021 | Hoang et al. | |
| 2021/0166110 A1 | 6/2021 | Song | |
| 2021/0182666 A1 | 6/2021 | Han et al. | |
| 2021/0192325 A1 | 6/2021 | Hoang et al. | |
| 2021/0216846 A1 | 7/2021 | Chang et al. | |
| 2021/0266000 A1 | 8/2021 | Ge | |
| 2022/0028444 A1* | 1/2022 | Papageorgiou | G06N 3/048 |
| 2022/0366976 A1 | 11/2022 | Hwang | |

FOREIGN PATENT DOCUMENTS

| | | |
|---|---|---|
| JP | 2021-503644 A | 2/2021 |
| JP | 2021-510888 A | 4/2021 |
| KR | 10-2019-0093932 A | 8/2019 |
| KR | 10-2020-0090089 A | 7/2020 |

OTHER PUBLICATIONS

Kim, Yongtae, Yong Zhang, and Peng Li. "A reconfigurable digital neuromorphic processor with memristive synaptic crossbar for cognitive computing." ACM Journal on Emerging Technologies in Computing Systems (JETC) 11.4 (2015): 1-25 (Year: 2015).*
Notice of Allowance in Korean Appln. No. 10-2021-0087943, ailed on Sep. 9, 2025, 6 pages (with English translation).
Benoit Jacob, et al. "Quantization and Training of Neural Networks for Efficient Integer-Arithmetic-Only Inference," 2018 IEEE/CVF Conference on Computer Vision and Pattern Recognition, Jun. 18-23, 2018.
Notice of Allowance in Korean Appln. No. 10-2021-0139252, mailed on Apr. 22, 2026, 4 pages (with English translation).
Office Action in Korean Appln. No. 10-2021-0181445, mailed on May 28, 2026, 19 pages (with English translation).
Office Action in Chinese Appln. No. 202210774082.X, mailed on Jul. 29, 2026, 11 pages (with English translation).

* cited by examiner

| LAYER | Layer1 | | | | ··· | LayerN |
|---|---|---|---|---|---|---|
| in[32] | 0 | 0 | ··· | 1 | ··· | 0 |
| in[30] | 0 | 0 | ··· | 1 | ··· | 0 |
| ··· | ··· | ··· | ··· | ··· | ··· | |
| in[1] | 0 | 1 | ··· | 1 | ··· | 0 |
| RESULT OF ZERO POINT COMPUTATION | BUF1 | BUF2 | ··· | BUF32 | ··· | BUF1 |

$10^5$
$10^2$
$10^{-1}$
−100
0
100

| LAYER | RESULT OF ZERO POINT COMPUTATION | COUNT RESULT |
|---|---|---|
| LAYER 1 | 0*L1_Z2 | 0 |
| | 1*L1_Z2 | 1 |
| | • • • | • • • |
| | 32*L1_Z2 | 32 |
| LAYER 2 | 0*L2_Z2 | 0 |
| | 1*L2_Z2 | 1 |
| | • • • | • • • |
| | 32*L2_Z2 | 32 |
| • • • | • • • | • • • |
| LAYER N | 0*LN_Z2 | 0 |
| | 1*LN_Z2 | 1 |
| | • • • | • • • |
| | 32*LN_Z2 | 32 |

FIG. 37

NEUROMORPHIC DEVICE AND ELECTRONIC DEVICE INCLUDING THE SAME

CROSS TO REFERENCE TO RELATED APPLICATIONS

This application claims benefit of priority to Korean Patent Application No. 10-2021-0181445 filed on Dec. 17, 2021, Korean Patent Application No. 10-2021-0154801 filed on Nov. 11, 2021, Korean Patent Application No. 10-2021-0139252 filed on Oct. 19, 2021, and Korean Patent Application No. 10-2021-0087943 filed on Jul. 5, 2021 in the Korean Intellectual Property Office, the disclosures of which are incorporated herein by reference in their entirety.

BACKGROUND

Example embodiments of the present disclosure relate to a neuromorphic device and an electronic device including the same.

A neuromorphic device is a semiconductor device simulating an information processing method of the human brain by manufacturing an artificial nervous system at the neuron level, and may implement, e.g., a deep learning neural network for neuromorphic computing. A neuromorphic device may execute a multiply and accumulate (MAC) computation of multiplying input data by a weight and summing results of the multiplication, and may include a plurality of memory cells for storing a weight in the form of data to execute the computation. Various methods for improving performance of a neuromorphic device, increasing integration density, and/or reducing computation burden and power consumption have been suggested.

SUMMARY

An example embodiment of the present disclosure is to provide a neuromorphic device which may, by separately implementing a reference cell array outputting a reference current to obtain accurate results of computations in various environments, improve integration density and power consumption, and also to provide a structure and a method for efficiently processing computation using a zero point weight in a neuromorphic device performing computations by quantizing a weight and an input value.

According to an example embodiment of the present disclosure, a neuromorphic device includes a plurality of cell tiles including a cell array including a plurality of memory cells storing a weight of a neural network, a row driver connected to the plurality of memory cells via a plurality of row lines, and cell analog-digital converters connected to the plurality of memory cells via a plurality of column lines and configured to convert cell currents read via the plurality of column lines into a plurality of pieces of digital cell data, respectively, a reference tile including a reference cell array including a plurality of reference cells, a reference row driver connected to the plurality of reference cells via a plurality of reference row lines, and reference analog-digital converters connected to the plurality of reference cells via a plurality of reference column lines and configured to convert reference currents read via the plurality of reference column lines into a plurality of pieces of digital reference data, and a comparator circuit configured to compare the plurality of pieces of digital cell data with the plurality of pieces of digital reference data, respectively.

According to an example embodiment of the present disclosure, a neuromorphic device includes a plurality of cell arrays in which a plurality of memory cells storing weights included in a plurality of layers of a neural network are disposed, respectively, a reference cell array in which a plurality of reference cells having the same structure as a structure of the plurality of memory cells are disposed, and a comparator circuit configured to compare a plurality of pieces of cell data obtained from at least one of the plurality of cell arrays with a plurality of pieces of reference data obtained from the reference array, wherein the plurality of cell arrays include a first cell array and a second cell array configured to store the weights included in the single layer among the plurality of layers in a distributed manner, and wherein the comparator circuit simultaneously compares the plurality of pieces of reference data obtained from one of the reference cell arrays with the plurality of pieces of cell data obtained from the first cell array and the plurality of pieces of cell data obtained from the second cell array.

According to an example embodiment of the present disclosure, a neuromorphic device includes a plurality of cell tiles in which a plurality of memory cells storing weights included in a plurality of layers of a neural network are disposed, respectively, a buffer configured to store a plurality of pieces of digital reference data obtained by digitally converting reference currents when an inference operation using the neural network starts, and a comparator circuit configured to compare a plurality of pieces of digital cell data output by at least one of the plurality of cell tiles with the plurality of pieces of digital reference data received from the buffer.

According to an example embodiment of the present disclosure, a neuromorphic device includes at least one weight array including a plurality of weight cells connected to a plurality of weight row lines and a plurality of weight column lines, a zero point array including a plurality of zero point cells connected to a plurality of zero point row lines and a plurality of zero point column lines, and a logic circuit configured to generate quantized weights and zero point weights by quantizing real weights included in each of a plurality of layers of a neural network, and to store the quantized weights in the weight cells and to store the zero point weights in the zero point cells, wherein the weight row lines and the zero point row lines are separated from each other, and the weight column lines and the zero point column lines are separated from each other.

According to an example embodiment of the present disclosure, a neuromorphic device includes a weight array including weight cells configured to store quantized weights among quantized weights and zero point weights generated from real weights included in a single layer among a plurality of layers of a neural network system, a zero point array including zero point cells in which the zero point weight is stored, and a logic circuit configured to generate quantized input values and zero point input values by quantizing input values input to the single layer, to obtain a result of weight computation and a result of zero point computation by inputting the quantized input values and the zero point input value to the weight array and the zero point array, respectively, and to obtain output values of the single layer by summing the result of weight computation and the result of zero point computation.

According to an example embodiment of the present disclosure, a neuromorphic device includes weight arrays configured to store quantized weights obtained by quantizing real weights included in respective hidden layers of a neural network, a zero point array configured to store a zero point weight, and a logic circuit configured to input quantized input values obtained by quantizing input values and zero point input values to the weight arrays and the zero point array corresponding to a single layer among the hidden layers and to obtain a result of multiplication and accumulation computations with respect to the single layer, wherein the zero point array includes a plurality of zero point areas storing the zero point weights of the hidden layers, and zero point cells connected to a single zero point column line in each of the zero point areas store the same data, and wherein the logic circuit includes a buffer configured to store results of zero point computation obtained by multiplying the quantized input values and the zero point input value by the zero point weights, and the buffer stores the results of zero point computation according to the number of 1s included in the hidden layers and the input values.

According to an example embodiment of the present disclosure, a neuromorphic device includes a computational processor configured to, from among zero point weights and quantized weights generated by quantizing real weights included in each of a plurality of layers of a neural network, compute quantized weights and input values input to each of the plurality of layers and to output a result of weight computation, a counter circuit configured to count the number of 1s included in the input values, a buffer configured to receive results of zero point computation obtained by computing the input values and the zero point weight from an external host and to store the results, and to output one of the results of zero point computation based on the number of 1s included in the input values, and an adder circuit configured to add the result of zero point computation output by the buffer to the result of weight computation and to output computation results of one of the plurality of layers.

According to an example embodiment of the present disclosure, a neuromorphic device includes a computational processor configured to, from among zero point weights and quantized weights obtained by quantizing real weights included in at least one of a plurality of layers of a neural network, receive the quantized weights, to compute input values input to the at least one of the plurality of layers with the quantized weights and to output a result of weight computation, a buffer configured to receive results of zero point computation obtained by computing the input values and the zero point weight from an external host and to store the result, and to output one of the results of zero point computation based on the number of 1s included in the input values, and an adder circuit configured to add the result of zero point computation output by the buffer to the result of weight computation and to output computation results of one of the plurality of layers.

According to an example embodiment of the present disclosure, an electronic device includes a neuromorphic device configured to generate output data by executing a computation corresponding to a plurality of layers included in a neural network, and a host connected to the neuromorphic device, wherein the host is configured to, from among zero point weights and quantized weights obtained by quantizing real weights included in each of the plurality of layers, generate results of zero point computation obtained by multiplying and accumulating the zero point weights and input values input to the plurality of layers, respectively, and to transmit the results to the neuromorphic device, wherein the neuromorphic device includes a buffer configured to store the results of zero point computation, a computational processor configured to output a result of weight computation obtained by multiplying and accumulating the input values and the quantized weights to execute accumulation and multiplication computations corresponding to each of the plurality of layers, and an adder circuit configured to add the result of zero point computation to the result of weight computation and to output result values of computation for each of the plurality of layers.

BRIEF DESCRIPTION OF DRAWINGS

The above and other aspects, features, and advantages of the present disclosure will be more clearly understood from the following detailed description, taken in conjunction with the accompanying drawings, in which:

FIG. 37 is a diagram illustrating data stored in a buffer of a neuromorphic device according to some example embodiments of the present disclosure;

DETAILED DESCRIPTION

Hereinafter, embodiments of the present disclosure will be described as follows with reference to the accompanying drawings.

Figure 1A:
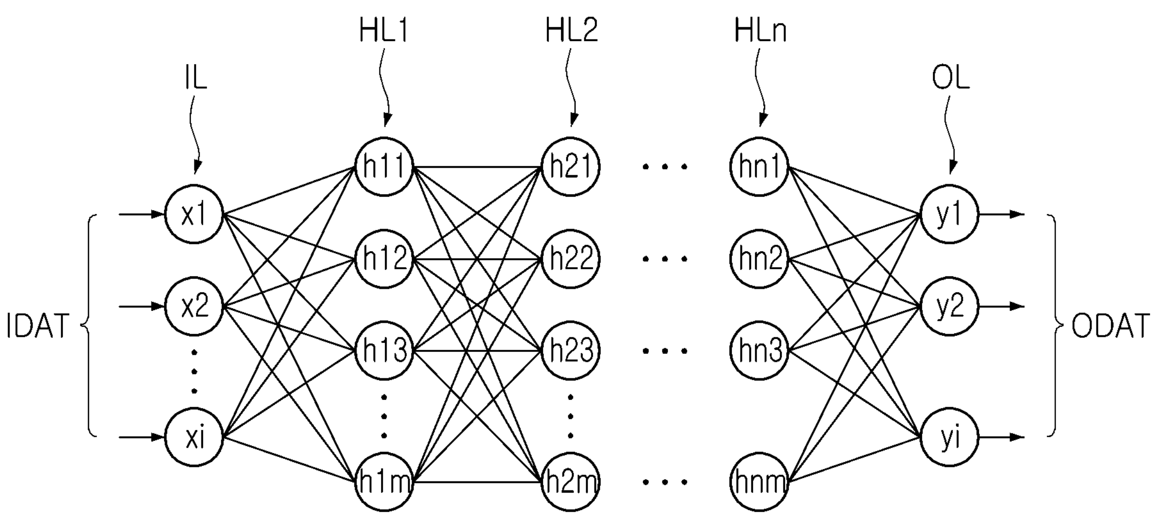
FIGS. 1A and 1B are diagrams illustrating a neural network implemented as a neuromorphic device according to some example embodiments of the present disclosure.
Figure 1B:
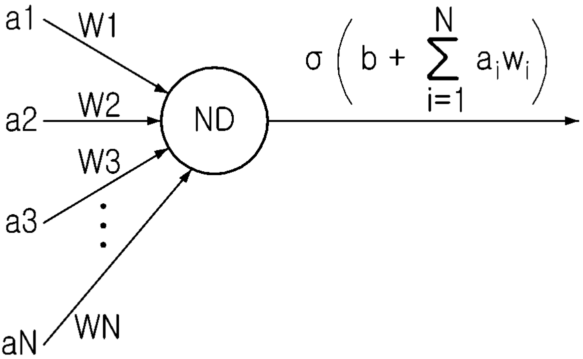

FIGS. 1A and 1B are diagrams illustrating a neural network implemented as a neuromorphic device according to some example embodiments.

Referring to FIG. 1A, a network structure of a general neural network may include an input layer IL, a plurality of hidden layers HL1-HLn, and an output layer OL. The input layer IL may include an i number of input nodes x1-xi (where i is a natural number), and vector input data IDAT having a length of i may be input to each input node.

The input data IDAT may be input to a hidden layer including n number of hidden layers HL1-HLn (where n is a natural number), and each of the hidden layers HL1-HLn may include a plurality of hidden nodes. For example, the first hidden layer HL1 may include m number of hidden nodes h11-h1*m* (where m is a natural number), and the n-th hidden layer HLn may include them number of hidden nodes hn1-hnm.

In the example illustrated in FIG. 1A, each of the hidden layers HL1 to HLn may include the same number of hidden nodes, but the example embodiments are not limited thereto. For example, at least a portion of the hidden layers HL1-HLn may include different numbers of hidden nodes.

The output layer OL may include a j number of output nodes y1-yj (where j is a natural number) corresponding to the class to be classified. For example, the output layer OL may output a result (e.g., a score and/or a class score) for each class with respect to the input data IDAT as the output data ODAT. For example, in some example embodiments, the score (and/or class score) may include the probabilities of the input data IDAT being related to (and/or included in) the classifications corresponding to the output nodes. The result may also be referred to as an inference, and the operation resulting in the inference may be referred to as an inference operation.

The neural network illustrated in FIG. 1A may include a branch between nodes illustrated as a linear line between two nodes, and a weight used in each branch. In some examples, the nodes included in single layer may not be connected to each other, and the nodes included in different layers may be entirely or partially connected to each other. For example, a node (e.g., node h11 of the HL1 layer) may be connected to all and/or some of the nodes of a subsequent layer (e.g., nodes h21 through h2*m* of the HL2 layer).

Each node in FIG. 1A may receive an output of a previous node and perform a computation, and may output a result of the computation to a subsequent node. For example, each node may apply the input value to a specific function (for example a nonlinear function) and may compute a value to be output.

Generally, the structure of a neural network may be predetermined (and/or otherwise determined), and the weights according to the branches between nodes may be determined as appropriate values using, e.g., a data set of which a correct answer is already known. A data set of which a correct answer is already known and which may be used to determine the weights, may be referred to as training data, and the process of determining weights using the training data may be referred to as learning.

FIG. 1B is a diagram illustrating some example embodiments of a computation performed in a single node ND among the nodes included in, e.g., the neural network in FIG. 1A. Referring to FIG. 1B, when n number of inputs A1-An are provided to a single node ND, the node ND may multiply the n number of inputs A1-An with an n number of weights W1-Wn corresponding thereto, may sum the products, and may add an offset (b) to the summed value. Also, the node ND may generate a single output value z by applying the value reflected with the offset to a specific function 6.

When one of the layers included in the neural network according to the example embodiment illustrated in FIG. 1A includes an m number of nodes ND illustrated in FIG. 1B, the output values of the layer may be obtained as in Equation 1 as below:

$$Z=W*A \quad \text{[Equation 1]}$$

In Equation 1 above, W represents a weight corresponding to all branches included in the layer, and may be represented in the form of an (m×n) matrix. A represents an n number of inputs A1-An received by the layer, and may be implemented in the form of an (n×1) matrix. Z represents an m number of outputs Z1-Zm output by the layer, and may be represented in the form of an (m×1) matrix.

Figure 2A:
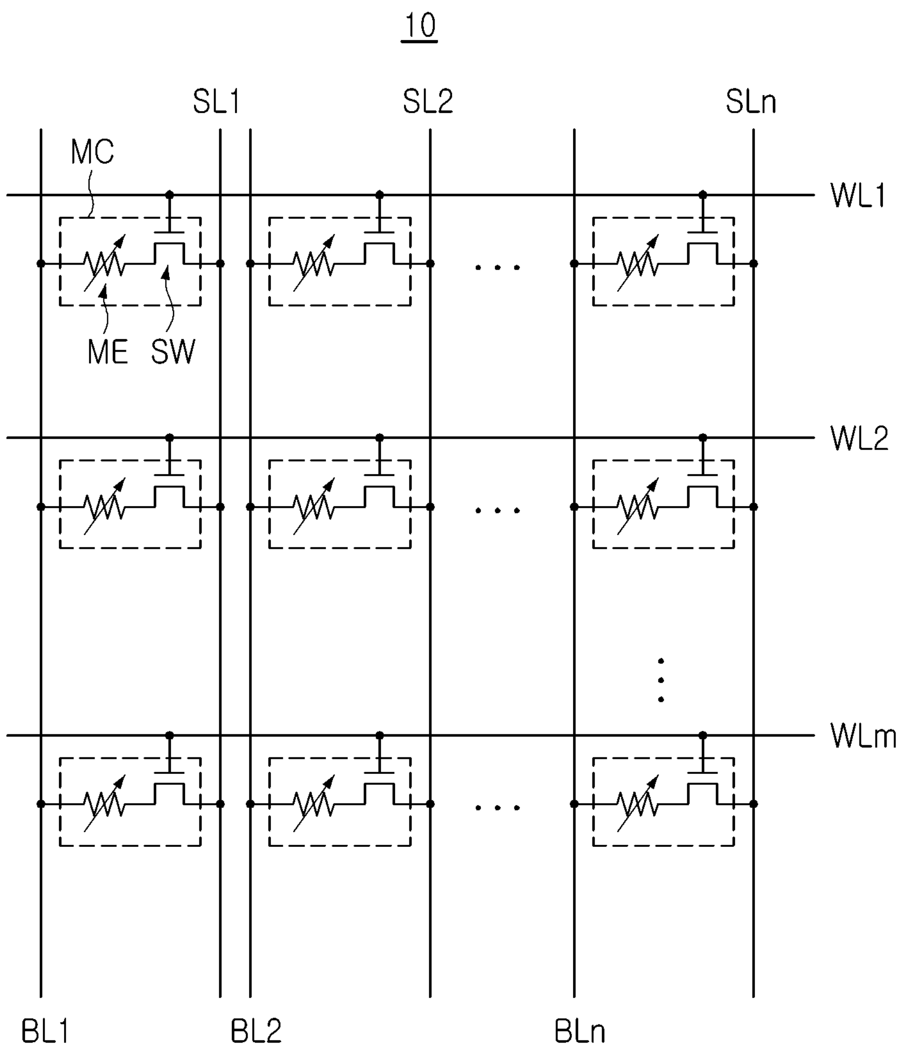
FIGS. 2A and 2B are diagrams illustrating a cell array included in a neuromorphic device according to some example embodiments of the present disclosure.
Figure 2B:
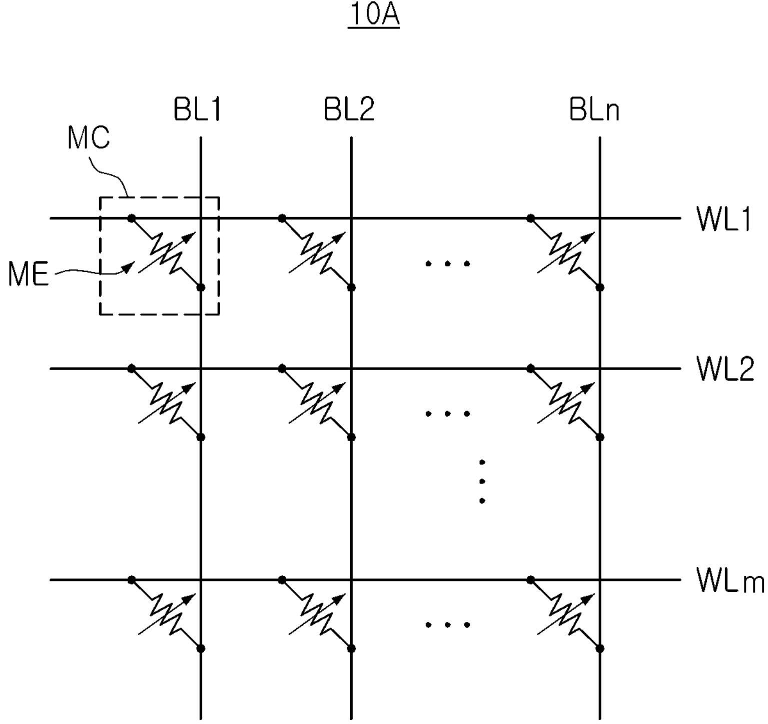

FIGS. 2A and 2B are diagrams illustrating a cell array included in a neuromorphic device according to an example embodiment.

Referring first to FIG. 2A, a cell array 10 may include a plurality of row lines, a plurality of column lines, and a plurality of memory cells MC. Each of the plurality of memory cells MC may include a switch device SW and a memory device ME. For example, the plurality of row lines may include a plurality of word lines WL1-WLm, and the plurality of column lines may include a plurality of bit lines BL1-BLn and a plurality of source lines SL1-SLn.

The memory device ME included in each of the plurality of memory cells MC may be a variable resistor device, and a resistance value of the memory device ME may be determined by a voltage/current applied via a plurality of word lines WL1-WLm and a plurality of bit lines BL1-BLn, and a plurality of source lines SL1 to SLn. For example, a turn-on voltage for turning the switch device SW on may be input to a selected word line, and a predetermined (and/or otherwise determined) bias voltage may be input to a selected bit line and a selected source line, such that a resistance value of the memory device ME included in the selected memory cell may increase or decrease. Data may be stored in the selected memory cell according to the resistance value of the memory device ME, and the relationship between the data stored in the selected memory cell and the resistance value of the memory device ME may be determined in various manners. The stored data may be digital (e.g., “0” and/or “1”) and/or analog data.

For example, in some example embodiments, when a neural network including the cell array 10 is determined, weights corresponding to a plurality of layers included in the neural network may be converted into data and may be stored in the memory cells MC. When inference using the neural network starts, a voltage and/or a current corresponding to input data may be input via the plurality of source lines SL1-SLn while the plurality of word lines WL1-WLm are activated in sequence, and a voltage and/or a current may be detected via the plurality of bit lines BL1-BLn. Accordingly, the computation of multiplying one of the n number of inputs A1-An by one of an n number of weights W1-Wn described above with reference to FIG. 1B may be executed. When entirety of the plurality of layers included in the neural network are implemented in the form of the cell array 10 as described above, a neuromorphic device storing data and performing computational operations may be implemented.

Each of the plurality of memory cells MC may be implemented as a resistive memory cell such as a floating gate cell, a phase change random access memory (PRAM) cell, a Resistance Random Access Memory (RRAM) cell, a magnetic random access memory (MRAM) cell, a ferroelectric random access memory (FRAM) cell, and/or the like. In some example embodiments, the memory device ME may include a phase change material of which crystal state changes according to an amount of current. The phase change material may include various types of materials such as compound materials like GaSb, InSb, InSe, $Sb_2Te_3$, and GeTe which may be a combination of two elements, GeSbTe, GaSeTe, InSbTe, $SnSb_2Te_4$, and InSbGe which may be a combination of three elements, and/or AgInSbTe, (GeSn)SbTe, GeSb(SeTe), and $Te_{81}Ge_{15}Sb_2S_2$ which may be a combination of four elements, and/or the like. In some example embodiments, the memory device ME may include perovskite compounds, transition metal oxides, magnetic materials, ferromagnetic materials, antiferromagnetic materials, and/or the like. However, the material and/or materials included in the memory device ME are not limited to the above-described materials.

Referring to FIG. 2B, a cell array 10A may include a plurality of memory cells MC, and the plurality of memory cells MC may be connected to a plurality of row lines and a plurality of column lines. The plurality of row lines may include a plurality of word lines WL1-WLm, and the plurality of column lines may include a plurality of bit lines BL1-BLn. Each of the plurality of memory cells MC may include a memory device ME, and for example, the memory device ME may be implemented as a resistive device. Resistance and conductivity of the memory device ME may correspond to a weight included in the neural network.

In the example embodiment described with reference to FIGS. 2A and 2B, the cell arrays 10 and 10A may have a two-dimensional array structure, but the example embodiments thereof are not limited thereto. For example, the cell array may be formed in a three-dimensional vertical array structure. The structure of the plurality of memory cells MC may also be varied in some example embodiments.

Figure 3:
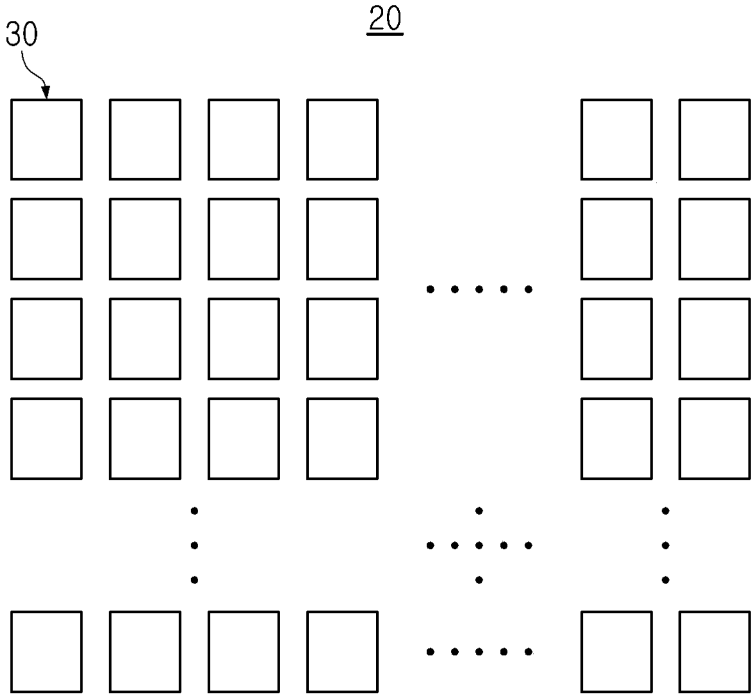
FIGS. 3, 4A, and 4B are diagrams illustrating a neuromorphic device according to a comparative example and some example embodiments of the present disclosure.
Figure 4A:
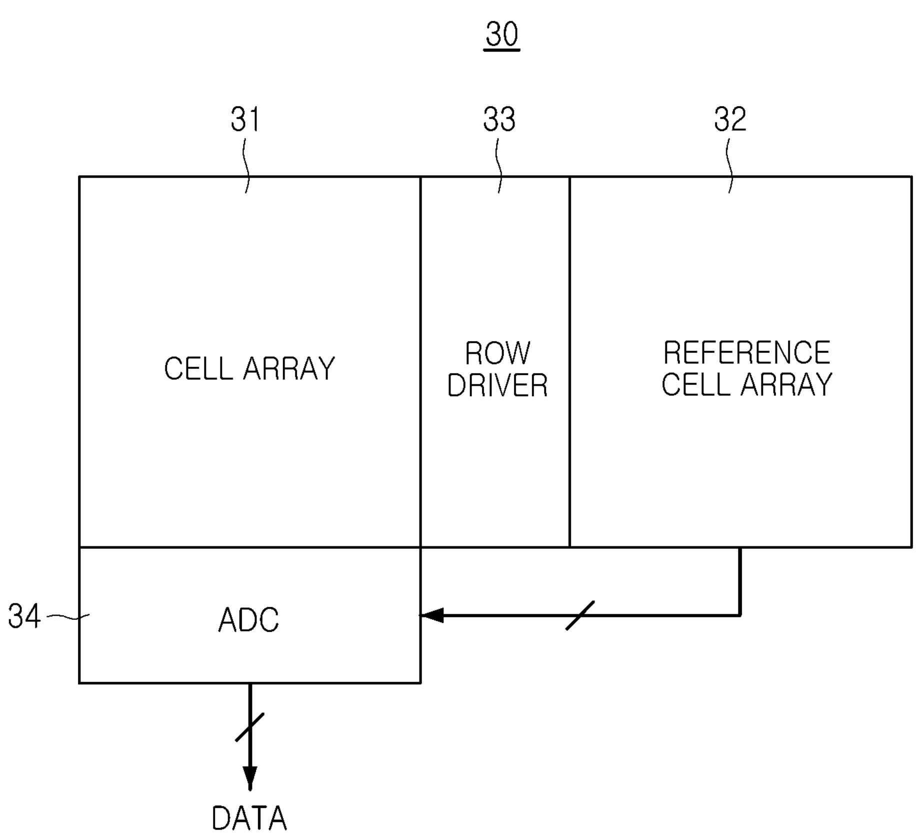
Figure 4B:
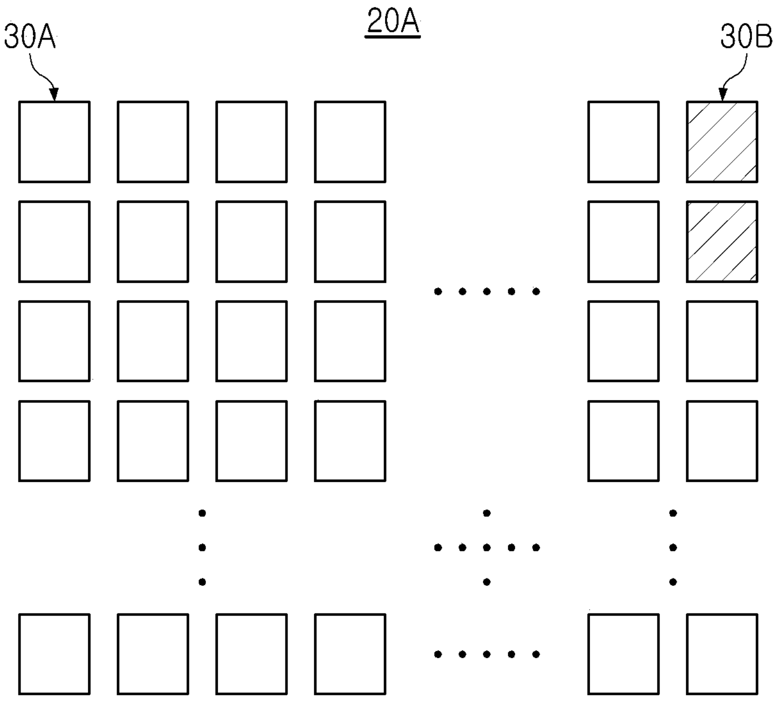

FIGS. 3, 4A, and 4B are diagrams illustrating a neuromorphic device according to a comparative example and some example embodiments.

Referring FIG. 3, a neuromorphic device 20 may include a plurality of tiles 30. Each of the plurality of tiles 30 may include a plurality of memory cells. A plurality of memory cells in each of the plurality of tiles 30 may store weights included in each of a plurality of layers of a neural network. For example, the weights may be quantized and stored in a plurality of memory cells.

In some example embodiments, weights included in a single layer among a plurality of layers included in a neural network may be stored in two or more tiles 30 in a distributed manner Two or more tiles 30 dividing and storing weights included in a single layer may be disposed adjacent to each other in the neuromorphic device 20.

Each of the plurality of tiles 30 may include a cell array in which a plurality of memory cells is disposed, a row driver connected to the cell array via row lines, and an analog-to-digital converter (ADC) connected to the cell array via column lines. Similarly to the example described above with reference to FIG. 2, the row driver may be connected to a plurality of memory cells via word lines, and the ADC circuit may be connected to a plurality of memory cells via a plurality of bit lines and a plurality of source lines. The ADC circuit may include at least one ADC. For example, when the ADC circuit includes a plurality of ADCs, the number of the plurality of ADCs may be equal to the number of the plurality of bit lines and the number of the plurality of source lines.

FIG. 4A is a diagram illustrating the structure of a plurality of tiles 30 in a comparative example (different from an example embodiment). Referring to FIG. 4A, in the comparative example, each of the plurality of tiles 30 may include a cell array 31, a reference cell array 32, a row driver 33, and an ADC circuit 34. A plurality of memory cells for storing weights of the neural network may be disposed in the cell array 31, and a plurality of reference cells may be disposed in the reference cell array 32.

Each of the plurality of memory cells may include a memory device having variable resistance properties as described above, and when learning of the neural network is completed, the weight of the neural network may be stored in the plurality of memory cells. However, resistance of the memory device programmed to store the weights may change depending, for example, on the time elapsed from the time at which the weights are stored and/or the temperature during the execution of the inference operation using the neuromorphic device 30.

To address the issue above, a plurality of reference cells disposed in the reference cell array 32 may be formed to have the same structure as that of the plurality of memory cells, and when an inference operation is executed, the plurality of reference cells output by a plurality of reference currents may be input to the ADC circuit 34. Similarly to the resistance of the plurality of memory cells disposed in the cell array 31, the resistance of the plurality of reference cells may also change, and accordingly, reference currents may also change according to time elapsed and a temperature. Accordingly, the ADC circuit 34 may output accurate result data DATA for the MAC computation of the inference operation.

However, in the comparative example illustrated in FIG. 4A, since each of the plurality of tiles 30 includes the reference cell array 32, the integration density of the neuromorphic device 20 may be reduced. For example, when weights of a single layer among a plurality of layers included in the neural network are divided and stored in two or more of the plurality of tiles 30, the number of reference cell arrays 32 may increase, which may further reduce integration density of the neuromorphic device 20.

In some example embodiments, as illustrated in FIG. 4B, a plurality of cell tiles 30A in which a plurality of memory cells storing weights are disposed, and at least one reference tile 30B in which a plurality of reference cells for generating reference currents are disposed may be separately implemented. For example, in the example illustrated in FIG. 3, a portion of the plurality of tiles 30 may be allocated as the plurality of cell tiles 30A, and at least one tile may be allocated as the reference tile 30B. For example, reference currents output by one reference tile 30B may be shared by two or more cell tiles 30A. Accordingly, the area occupied by the tiles 30 included in the neuromorphic device 20A may be reduced, and integration density of the neuromorphic device 20A may improve.

In some example embodiments, each of the plurality of cell tiles 30A may include a cell array, a row driver, and a cell ADC circuit. At least one reference tile 30B may include a reference cell array, a reference row driver, and a reference ADC circuit. Accordingly, the plurality of cell tiles 30A and the at least one reference tile 30B may operate independently of each other.

Figure 5:
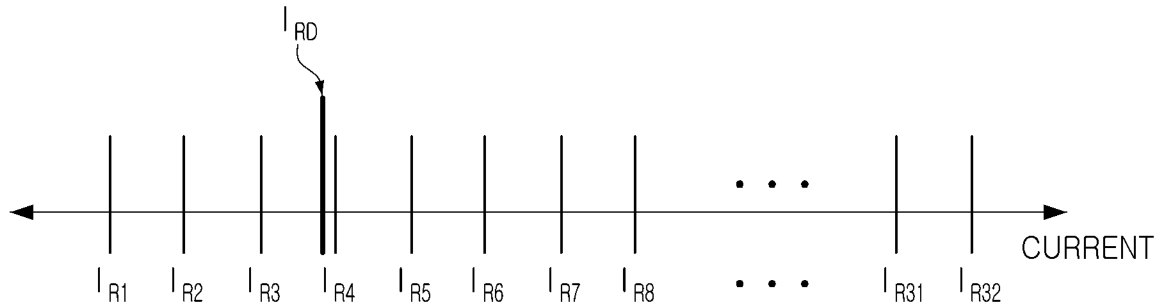
FIGS. 5 and 6 are diagrams illustrating operations of a neuromorphic device according to some example embodiments of the present disclosure.
Figure 6:
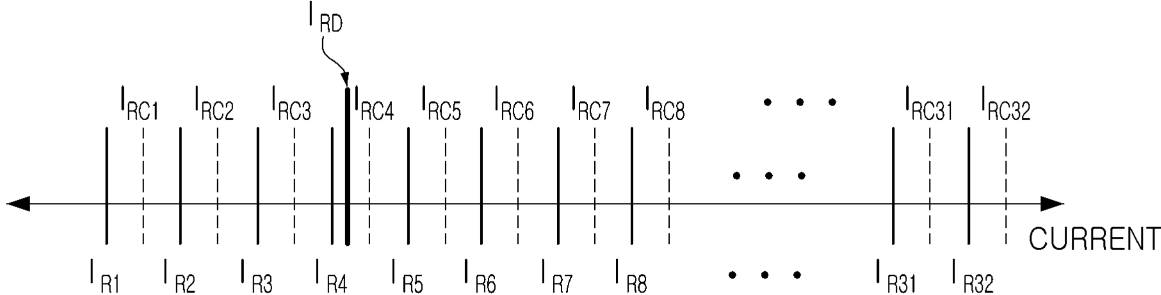

FIGS. 5 and 6 are diagrams illustrating operations of a neuromorphic device according to some example embodiments.

The diagrams illustrate example operations of a cell ADC circuit connected to a cell array when the neuromorphic device executes an inference operation in different operating environments. In the first operating environment illustrated in FIG. 5, the neuromorphic device may obtain a read current $I_{RD}$ from one of a plurality of cell tiles to execute a MAC computation for an inference operation. For example, the read current $I_{RD}$ may be obtained from one of a plurality of column lines by selecting one of a plurality of row lines connected to a plurality of memory cells.

The read current $I_{RD}$ may be converted into digital data in the ADC. The ADC may compare the read current $I_{RD}$ with the plurality of reference currents $I_{R1}$-$I_{R31}$. The number of reference currents compared to the read current $I_{RD}$ in the ADC may be varied depending on precision of the ADC. In the example in FIGS. 5 and 6, the ADC may output digital data by comparing the read current $I_{RD}$ with 31 reference currents $I_{R1}$-$I_{R31}$, and accordingly, the ADC may have 5-bit precision. For example, in the example embodiment illustrated in FIG. 5, the ADC may convert the read current $I_{RD}$ into digital data of "00011."

However, as described above, conductivity of each of the plurality of memory cells may change due to the elapsed time after the program operation for storing the weight of the neural network in the plurality of memory cells, and/or the temperature during the execution of the inference operation. Accordingly, even when the same input data is input to the memory cell due to the elapsed time and/or temperature, the magnitude of the read current $I_{RD}$ may be varied. For example, as the elapsed time increases, the resistance of the memory device included in each of the plurality of memory cells may decrease, and accordingly, the magnitude of the read current $I_{RD}$ may increase. Accordingly, when the read current $I_{RD}$ is digitally converted using constant reference currents $I_{R1}$-$I_{R31}$ without compensation for the elapsed time and temperature, as illustrated in FIG. 6, the read current $I_{RD}$ may be erroneously converted to digital data of "00100."

In an example embodiment, the magnitude of the reference currents $I_{R1}$-$I_{R31}$ input to the ADC may change according to the elapsed time and/or temperature similarly to conductivity of the memory cells, and accordingly, the above issue may be addressed. Referring to FIG. 6, as the read current $I_{RD}$ increases due to the elapsed time, the magnitude of each of the reference currents $I_{R1}$-$I_{R31}$ may also increase. Accordingly, the ADC may accurately convert the read current $I_{RD}$ obtained from the memory cell into digital data of "00011" as in FIG. 5.

Also, in some example embodiments, as described above, the reference cell array outputting the reference currents $I_{R1}$-$I_{R31}$ may be disposed in a reference tile implemented independently of the cell tiles including a plurality of memory cells. Accordingly, two or more cell tiles may share the reference currents $I_{R1}$-$I_{R31}$ output by a single reference cell array, and integration density of the neuromorphic device may improve. Also, since the plurality of cell tiles use the reference currents $I_{R1}$-$I_{R31}$ output by a single reference tile, by reducing the number of computations for generating the reference currents $I_{R1}$-$I_{R31}$, power consumption of the neuromorphic device may be reduced.

Figure 7:
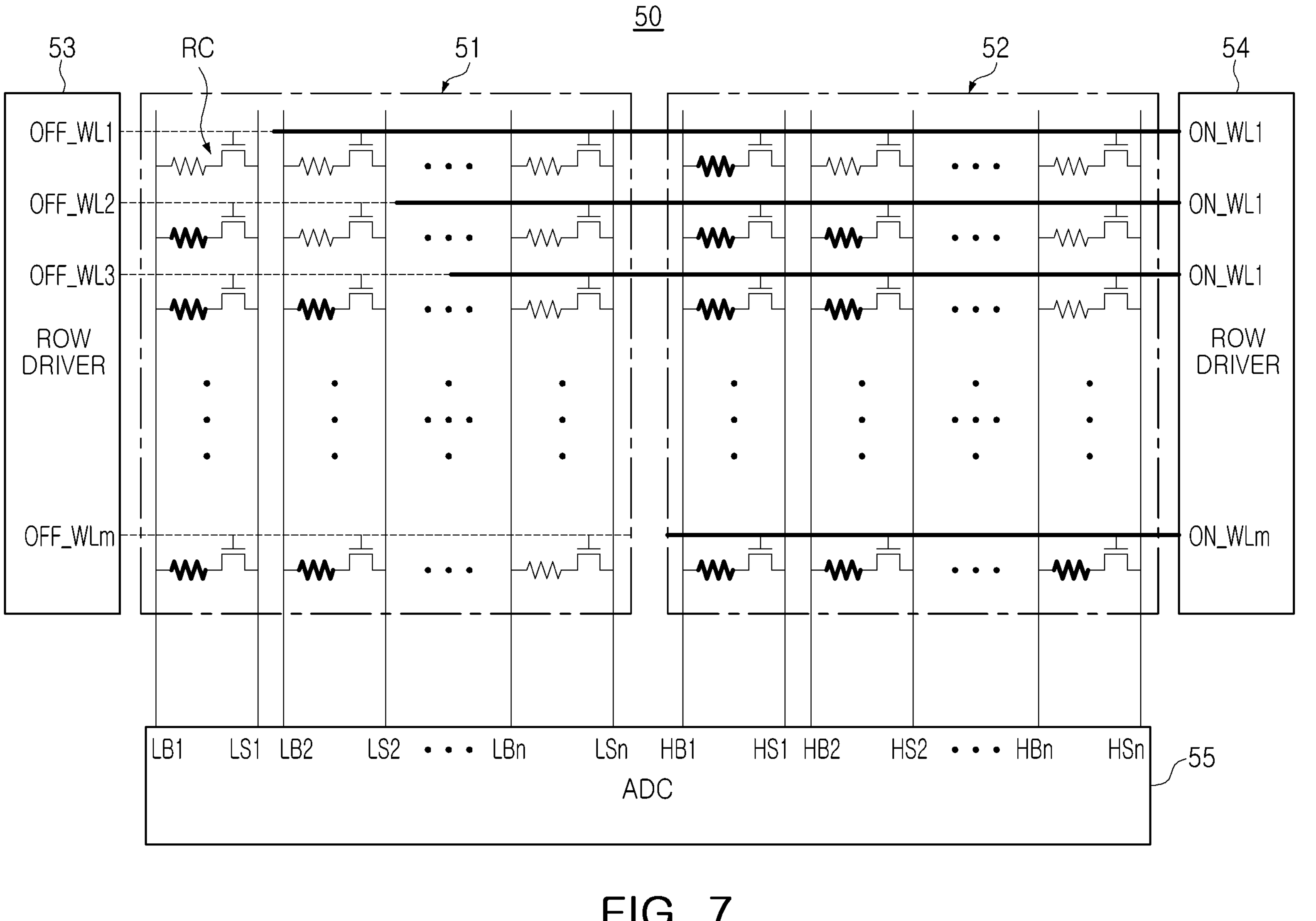
FIG. 7 is a diagram illustrating a structure of a reference tile included in neuromorphic device according to some example embodiments of the present disclosure.

FIG. 7 is a diagram illustrating a structure of a reference tile included in a neuromorphic device according to some example embodiments.

Referring to FIG. 7, the neuromorphic device according to some example embodiments may include a reference tile 50 for outputting reference currents. The reference tile 50 may include a first reference cell array 51, a second reference cell array 52, a first reference row driver 53, a second reference row driver 54, and an ADC circuit 55. A plurality of reference cells RC may be disposed in each of the first reference cell array 51 and the second reference cell array 52, and each of the plurality of reference cells RC may include a switch device SW and a memory device ME. The plurality of reference cells RC may have the same structure as that of a memory cell included in each of the cell tiles implemented as a separate tile different from the reference tile 50 and storing a weight.

Each of the first reference row driver 53 and the second reference row driver 54 may be connected to a plurality of reference cells RC via a plurality of word lines. For example, the first reference row driver 53 may be connected to the plurality of reference cells RC via the plurality of off-row lines OFF_WL1-OFF_WLm, and the second reference row driver 54 may be connected to the plurality of reference cells RC via the plurality of off-row lines OFF_WL1-OFF_WLm.

The ADC circuit 55 may be connected to the plurality of reference cells RC via the plurality of reference column lines LB1-LBn, HB1-HBn, LS1-LSn, and HS1-HSn.

While the reference currents for the inference operation are generated, the first reference row driver 53 may maintain the switch device SW of each of the reference cells RC connected to the plurality of off-row lines OFF_WL1-OFF_WLm in a turned-off state. The second reference row driver 54 may maintain the switch device SW of each of the reference cells RC connected to the plurality of on-row lines ON_WL1-ON_WLm in a turned-on state.

Each of the plurality of reference cells RC may be programmed into one of a first state in which the memory device ME has a low resistance or a second state in which the memory device ME has a high resistance. In the example in FIG. 7, the memory device ME marked a thick line may have high resistance, and the memory device ME marked a thin line may have low resistance. For example, among the plurality of reference cells RC connected to the first row bit line LB1 and the first row source line LS1, only the memory device ME of the reference cell RC connected to the first off-row line OFF_WL1 may have low resistance. However, the example embodiments are not limited thereto.

The ADC circuit 55 may obtain currents via the bit lines LB1-LBn and HB1-HBn among the plurality of reference column lines LB1-LBn, HB1-HBn, LS1-LSn, and HS1-HSn, and may output a plurality of reference currents using an average value of currents obtained from a pair of bit lines among the bit lines LB1-LBn and HB1-HBn. For example, the ADC circuit 55 may output an average value of currents obtained from the first low bit line LB1 and the first high bit line HB1 as a first reference current. In the example embodiment illustrated in FIG. 7, the ADC circuit 55 may output an n number of reference currents.

Figure 8:
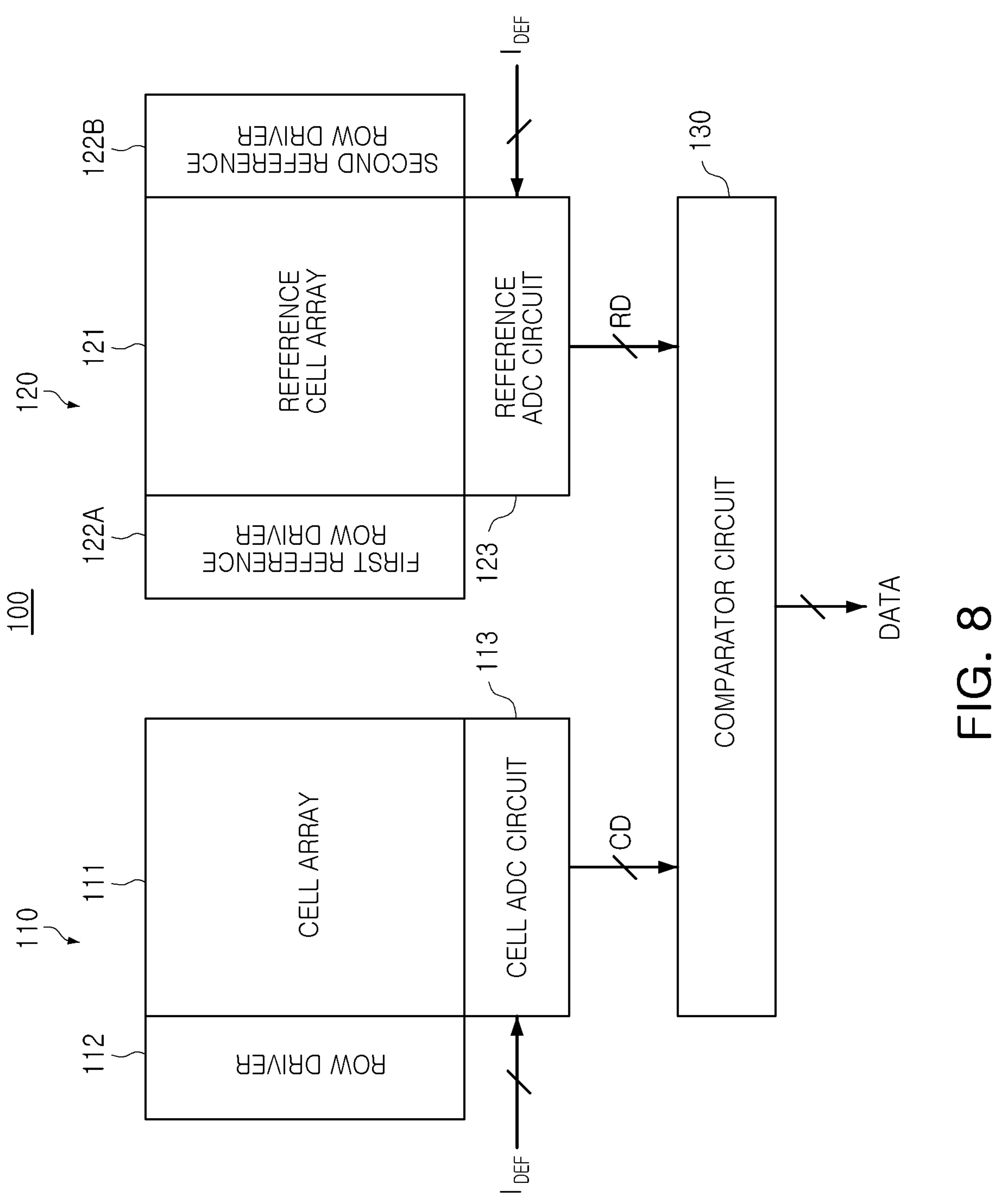
FIG. 8 is a diagram illustrating a neuromorphic device according to some example embodiments of the present disclosure.

FIG. 8 is a diagram illustrating a neuromorphic device according to some example embodiments.

Referring to FIG. 8, a neuromorphic device 100 according to some example embodiments may include a plurality of cell tiles 110, a reference tile 120, and a comparator circuit 130. The neuromorphic apparatus 100 may include only a single reference tile 120, and/or the number of reference tiles 120 may be two or more. The number of the reference tiles 120, however, may be less than the number of the plurality of cell tiles 110.

Each of the plurality of cell tiles 110 may include a cell array 111, a row driver 112, and a cell ADC circuit 113. The cell array 111 may include a plurality of memory cells, may be connected to the row driver 112 via a plurality of row lines, and may be connected to the cell ADC circuit 113 via a plurality of column lines. The cell ADC circuit 113 may include at least one cell ADC converting cell currents read from a plurality of memory cells via a plurality of column lines into a plurality of pieces of digital cell data CD.

The reference tile 120 may include a reference cell array 121, a first reference row driver 122A, a second reference row driver 122B, and a reference ADC circuit 123. The reference cell array 121 may include a plurality of reference cells, and the reference cells may have the same structure as that of memory cells. The plurality of reference cells may be connected to the first reference row driver 122A and/or the second reference row driver 122B via a plurality of row lines, and may be connected to the reference ADC circuit 123 via a plurality of reference column lines. The reference ADC circuit 123 may include at least one reference ADC converting reference currents read from a plurality of reference cells via a plurality of reference column lines into a plurality of pieces of digital reference data RD.

The comparator circuit 130 may compare each of pieces of the digital cell data CD with the digital reference data RD and may output result data DATA required for an inference operation. For example, the result data DATA may include a result of MAC computation using an input value and a weight.

Each of the cell ADC circuit 113 and the reference ADC circuit 123 may receive a plurality of default currents $I_{DEF}$. The cell ADC circuit 113 may compare each of the cell currents with a plurality of default currents $I_{DEF}$ and may generate digital cell data CD, and the reference ADC circuit 123 may compare each of the reference currents with the plurality of default currents $I_{DEF}$ and may generate a plurality of pieces of digital reference data RD.

Each of the plurality of default currents $I_{DEF}$ may have a fixed magnitude not affected by an operating environment such as time elapsed after programming and a temperature of the neuromorphic apparatus 100. However, the magnitude of each of the cell currents which the cell ADC circuit 113 obtains from the cell array 111 and the reference currents which the reference ADC circuit 123 obtains from the reference cell array 121 may be varied depending on the operating environment such as time and temperature. For example, without being limited to a specific theory and/or cause, the magnitude of each of the cell currents may change because the conductivity of each of the plurality of reference cells disposed in the reference cell array 121 may change according to temperature (e.g., during an inference operation) and/or based on the time elapsed after programming.

Accordingly, depending on the elapsed time after programming and/or temperature, the magnitudes of the cell currents and the reference currents may become the same as the magnitudes of the plurality of default currents $I_{DEF}$. In these cases, accuracy of the cell ADC circuit 113 and the reference ADC circuit 123 may decrease. To address the above issue, in some example embodiments, the number of the plurality of default currents $I_{DEF}$ may be determined to be greater than the number of the cell ADC circuit 113 and the reference ADC circuit 123 determined in consideration of precision. For example, when each of the data CD and RD output by the cell ADC circuit 113 and the reference ADC circuit 123 is N-bit data, the number of the plurality of default currents $I_{DEF}$ may be greater than $2^N$.

Figure 9:
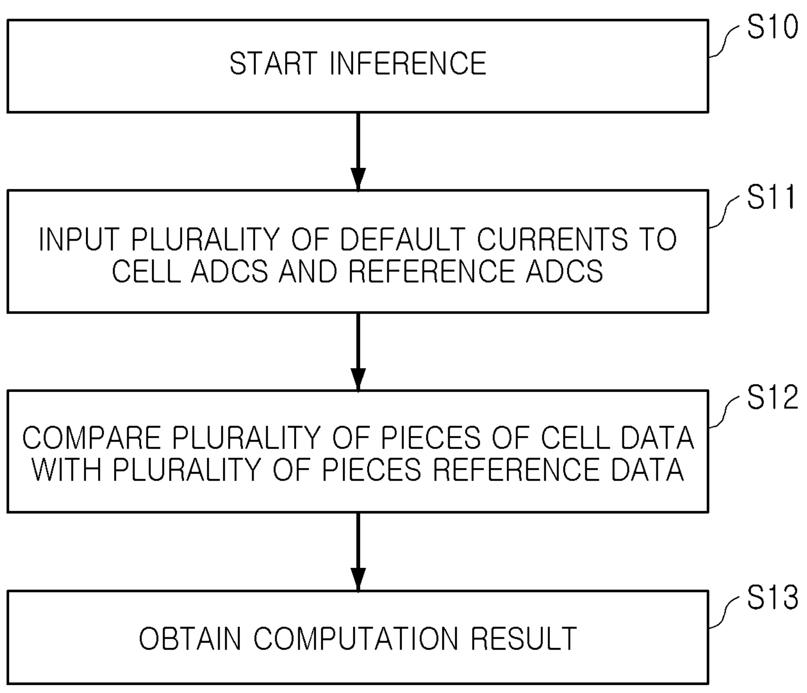
FIG. 9 is a flowchart illustrating operations of a neuromorphic device according to some example embodiments of the present disclosure.

FIG. 9 is a flowchart illustrating operations of a neuromorphic device according to some example embodiments.

Referring to FIG. 9, the neuromorphic device according to some example embodiments may start an inference operation based on a neural network (S10). The neuromorphic device may include a plurality of tiles, and as described above, the plurality of tiles may include a plurality of cell tiles and at least one reference tile. For example, the plurality of cell tiles and the reference tile may have a structure similarly to the structures described in the example embodiments described above with reference to FIG. 8.

Once the inference operation starts, the neuromorphic device may input a plurality of default currents to the cell ADCs and the reference ADCs included in each of the plurality of cell tiles (S11). The plurality of default currents may have a fixed value regardless of time elapsed after programming and/or the temperature of the memory cells and the reference cells. However, in some example embodiments, the number of the cell ADCs included in the plurality of cell tiles, the number of the plurality of default currents input to the ADCs included in the reference tile, and/or the magnitude of each of the plurality of default currents may be varied depending on at least one of time information and/or temperature information.

As an example, each of the plurality of cell tiles may include a plurality of memory cells and weights allocated to branch paths of a plurality of nodes in a neural network trained (e.g., in advance) may be stored in the plurality of memory cells. Cell ADCs connected to a plurality of memory cells may, by comparing cell currents read from the plurality of memory cells with a plurality of default currents, output digital cell data corresponding to a result of computation using an input value and a weight in the neural network.

At least one reference tile may include a plurality of reference cells, and the plurality of reference cells may have the same structure as that of a plurality of memory cells. Reference ADCs connected to the plurality of reference cells may compare reference currents read from the plurality of reference cells with the plurality of default currents and may output digital reference data.

The neuromorphic device may include a comparator circuit connected to cell ADCs and reference ADCs, and the comparator circuit may compare digital cell data with digital reference data, respectively (S12). For example, each of the digital cell data may be compared with digital reference data. The comparator circuit may compare cell currents converted into digital data with reference currents. Accordingly, the output of the comparator circuit may correspond to the result of computation in the neural network, and the result of computation may be obtained (S13).

For example, weights of a neural network of which training has been completed may be quantized and may be stored in a plurality of memory cells. Also, input values input to a plurality of nodes in each of a plurality of layers included in the neural network may also be quantized and may be input via a plurality of row lines. For example, the input values may be quantized as "q1" and "Z1", respectively, and Z1 may be a zero point input value which may be a reference for quantizing the input values. Similarly, the weights may be quantized as "q2" and "Z2", respectively, and Z2 may be a zero point weight which may be a reference for quantizing weights.

When the quantized weight q2 and the zero point weight Z2 are stored in a plurality of cell tiles, the digital cell data output by the cell ADCs may be data obtained by converting the result of computations such as q1*q2, q1*Z2, q2*Z1, Z1*Z2 output in the form of currents. The comparator circuit may perform digital processing by comparing digital cell data with digital reference data, and an output of the comparator circuit may be transferred to an adder circuit. The adder circuit may include an adder tree, and the data of "q1*q2−q1*Z2−q2*Z1+Z1*Z2" corresponding to the result of MAC computation of each node included in the neural network may be output.

Figure 10A:
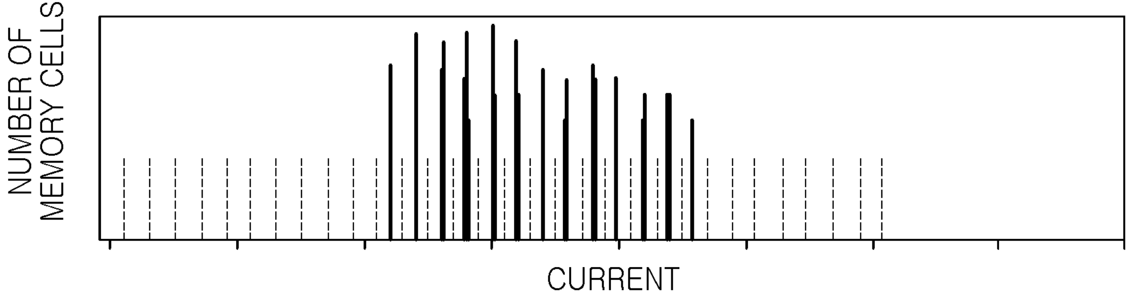
FIGS. 10A to 10C are diagrams illustrating operations of a neuromorphic device according to some example embodiments of the present disclosure.
Figure 10B:
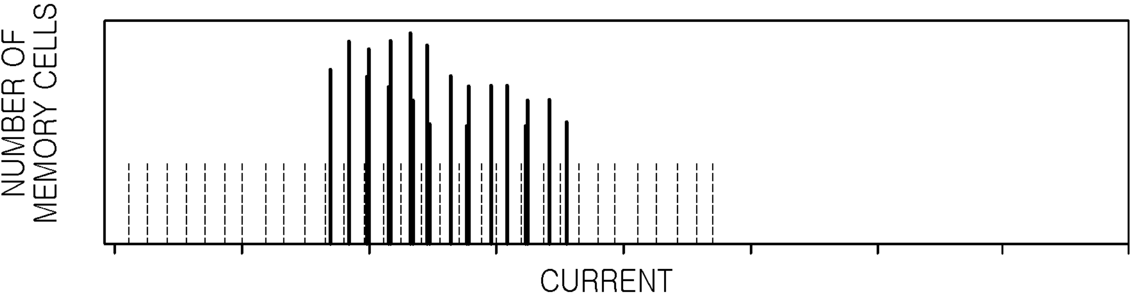
Figure 10C:
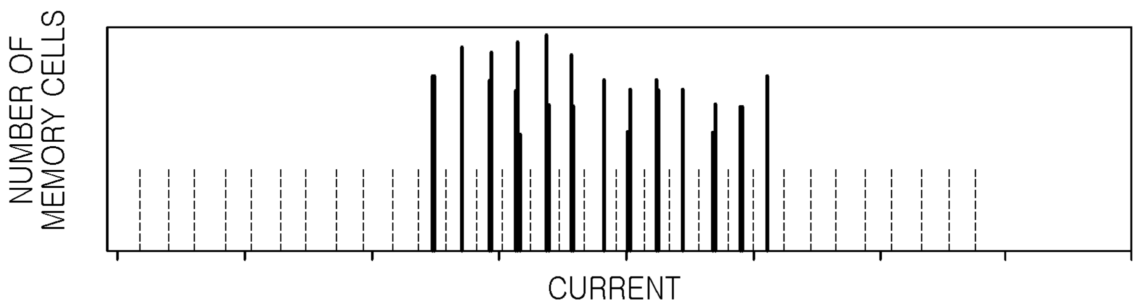

FIGS. 10A to 10C are diagrams illustrating operations of a neuromorphic device according to some example embodiments.

FIGS. 10A to 10C may be diagrams illustrating a method of determining a plurality of default currents input to cell ADCs and reference ADCs in a neuromorphic device according to some example embodiments. For example, in each of FIGS. 10A to 10C, a dotted line may indicate a plurality of default currents $I_{DEF}$, and a solid line may correspond to currents $I_{RD}$ read from a plurality of memory cells or a plurality of reference cells.

Each of the examples illustrated in FIGS. 10A to 10C may represent operations in neuromorphic devices having different time information and temperature information. As an example, FIG. 10A may correspond to an example in which a first elapsed time has elapsed from a programming time point in which a plurality of memory cells and a plurality of reference cells are programmed, and an inference operation is executed at a first temperature. Similarly, FIG. 10B may correspond to an example in which a second elapsed time has elapsed from a program time point and an inference operation is executed at a second temperature.

Referring to FIGS. 10A to 10C, the number of the plurality of default currents may be the same, and the plurality of default currents $I_{DEF}$ may have different magnitudes. However, according to some example embodiments, the number of the plurality of default currents $I_{DEF}$ may also vary as time elapsed and temperature change. Referring to FIGS. 10A to 10C, the number of the plurality of default currents $I_{DEF}$ and a magnitude of each of the plurality of default currents $I_{DEF}$ may be determined such that the currents $I_{RD}$ read from the plurality of memory cells and the plurality of reference cells and the plurality of default currents $I_{DEF}$ may not have the same value. The number of the plurality of default currents $I_{DEF}$ and the magnitude of each of the plurality of default currents $I_{DEF}$ according to the elapsed time and temperature may be predetermined (and/or otherwise determined) via simulation and may be stored in an internal or external memory of the neuromorphic device.

FIGS. 11 to 14 are diagrams illustrating neuromorphic devices according to some example embodiments.

Figure 11:
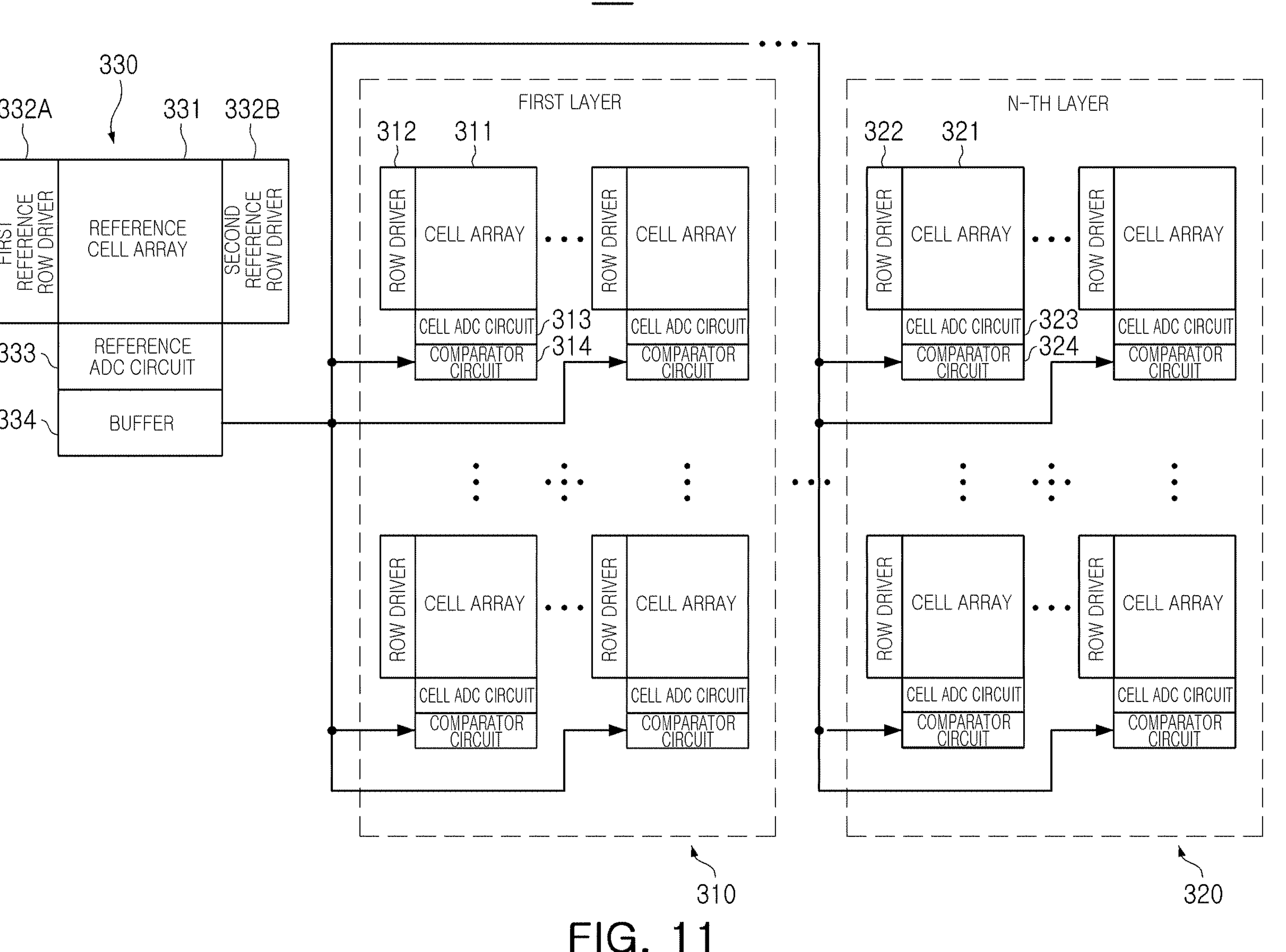
FIGS. 11 to 14 are diagrams illustrating neuromorphic devices according to some example embodiments of the present disclosure.

Referring first to FIG. 11, a neuromorphic device 300 according to some example embodiment may include a plurality of cell tiles 310 and 320 and at least one reference tile 330. For example, weights corresponding to a plurality of layers, respectively, included in the neural network, may be stored in two or more cell tiles 310 and 320 in a distributed manner.

For example, the weights included in the first layer may be stored in the plurality of cell tiles 310 in a distributed manner, and the weights included in the N-th layer may also be stored in the plurality of cell tiles 320 in a distributed manner. The number of cell tiles 310 and 320 allocated to store weights of each of the plurality of layers may be varied according to, e.g., the number of nodes included in each of the plurality of layers. For example, the number of the plurality of cell tiles 310 storing the weights of the first layer may be different from the number of the plurality of cell tiles 320 storing the weights of the N-th layer.

The plurality of cell tiles 310 and 320 may have similar structures. For example, the cell tile 310 storing the weights of the first layer may include a cell array 311 in which a plurality of memory cells is disposed, a row driver 312, and a cell ADC circuit 313, and may be connected to a comparator circuit 314. The cell tile 320 storing the weights of the N-th layer also may include a cell array 321, a row driver 322, and a cell ADC circuit 323, and may be connected to the comparator circuit 324. In some example embodiments, each of the cell ADC circuits 313 and 323 may include a plurality of cell ADCs, and each of the comparator circuits 314 and 324 may include a plurality of comparators. For example, the number of the plurality of comparators included in each of the comparator circuits 314 and 324 may be the same as the number of the plurality of cell ADCs included in each of the cell ADC circuits 313 and 323. Accordingly, an output terminal of each of the plurality of cell ADCs may be connected to an input terminal of each of the plurality of comparators.

The at least one reference tile 330 may include a reference cell array 331 in which a plurality of reference cells are disposed, a first reference row driver 332A, a second reference row driver 322B, a reference ADC circuit 333, and a buffer 334. The reference ADC circuit 333 may include a plurality of reference ADCs. While reference currents are obtained from the plurality of reference cells, the first reference row driver 332A may maintain a portion off-row lines in a turned-off state, and the second reference row driver 322B may maintain the other on-row lines in a turned-on state.

Once an inference operation starts, while the first reference row driver 332A maintains off-row lines in a turned-off state and the second reference row driver 322B maintains on-row lines in a turned-on state in the reference tile 330, the reference ADC circuit 333 may read the reference currents and may output digital reference data. The digital reference data may be stored in the buffer 334. Accordingly, digital reference data required for the inference operation may be generated and may be stored in the buffer 334 only by a single read operation of reading the reference currents, and power consumed by the neuromorphic device 300 in the inference operation may be reduced.

The inference operation may be performed according to the order of a plurality of layers included in the neural network. In some example embodiments, an inference operation may be preferentially performed on the plurality of cell tiles 310 corresponding to a first layer. When the row driver 312 inputs input values to the cell array 311 via row lines, the cell ADC circuit 313 may obtain cell currents from the cell array 311 via column lines. The cell ADC circuit 313 may generate digital cell data by comparing cell currents with a plurality of default currents and may output the digital cell data to the comparator circuit 314.

Referring to FIG. 11, the comparator circuit 314 may receive a plurality of pieces of digital cell data output by the cell ADC circuit 313 and a plurality of pieces of digital reference data output by the buffer 334. Each of the plurality of comparators included in the comparator circuit 314 may receive one of digital cell data and digital reference data. Accordingly, each of the plurality of comparators may compare a single piece of received digital cell data among the plurality of pieces of digital cell data with digital reference data and may output result data corresponding to the result of MAC computation. The operation of the plurality of cell tiles 320 corresponding to the N-th layer may also be understood with reference to the aforementioned example embodiments.

In some example embodiment, each of the cell ADC circuits 313 and 323 in each of the plurality of cell tiles 310 and 320 may include a plurality of cell ADCs, and each of the comparator circuits 314 and 324 may include a plurality of comparators. Accordingly, the operation of comparing a single piece of digital cell data with the plurality of pieces of digital reference data may be simultaneously executed in each of the plurality of comparators, such that a high computation speed may be realized.

Figure 12:
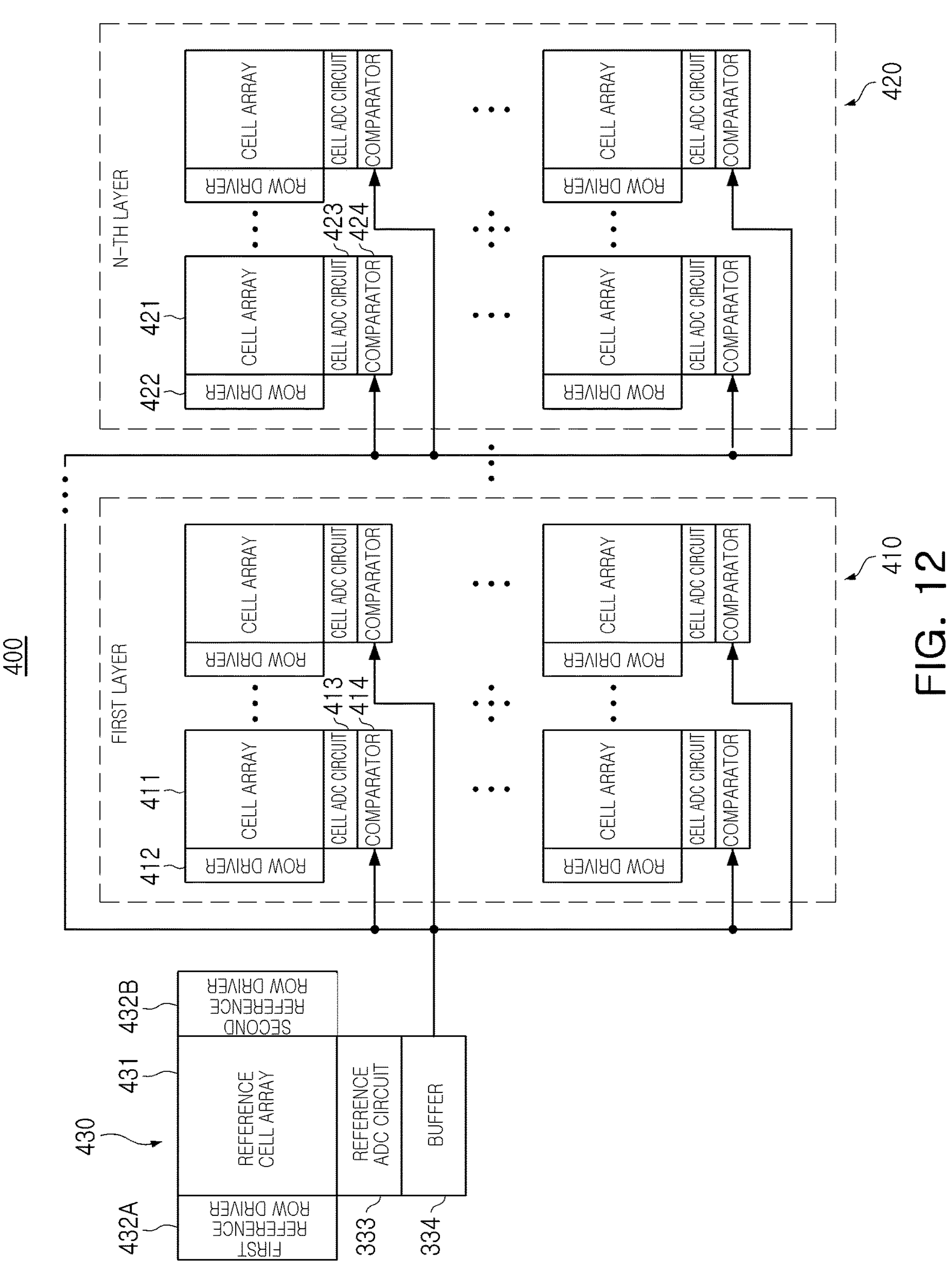

Referring to FIG. 12, a neuromorphic device 400 may include a plurality of cell tiles 410 and 420 and at least one reference tile 430. Weights corresponding to each of a plurality of layers included in a neural network may be stored in two or more cell tiles 410 and 420 in a distributed manner, and the number of the plurality of cell tiles 410 and 420 included in each layer may be varied depending on the structure of the neural network and the number of memory cells included in each of the plurality of cell tiles 410 and 420.

The structures of the plurality of cell tiles 410 and 420 and the at least one reference tile 430 may be similar to those of the aforementioned example embodiments, e.g., as described with reference to FIG. 11. However, in the example illustrated in FIG. 12, each of the plurality of cell tiles 410 and 420 may include only one comparator 414 and 424.

Once an inference operation starts, the reference ADC circuit 433 may generate a plurality of pieces of digital reference data by comparing the reference currents obtained from the reference cell array 431 with a plurality of default currents. The plurality of pieces of digital reference data may be stored in the buffer 434 and may be transferred to comparators 414 and 424 included in each of the plurality of cell tiles 410 and 420.

As described above, each of the plurality of cell tiles 410 and 420 may include only one comparator 414 and 424, respectively. For example, the comparator 414 of each of the cell tiles 410 corresponding to the first layer may receive the plurality of pieces of digital cell data output by the cell ADC circuit 413 in sequence and may compare the data with a plurality of pieces of digital reference data. Accordingly, in the example embodiments illustrated in FIG. 12, the computation speed may be slower than in the example embodiments illustrated in FIG. 11. However, the number of wirings connecting the reference tile 430 to the plurality of cell tiles 410 and 420 may be reduced, difficulty of wiring design may be reduced, and integration density of the neuromorphic device 400 may improve.

Figure 13:
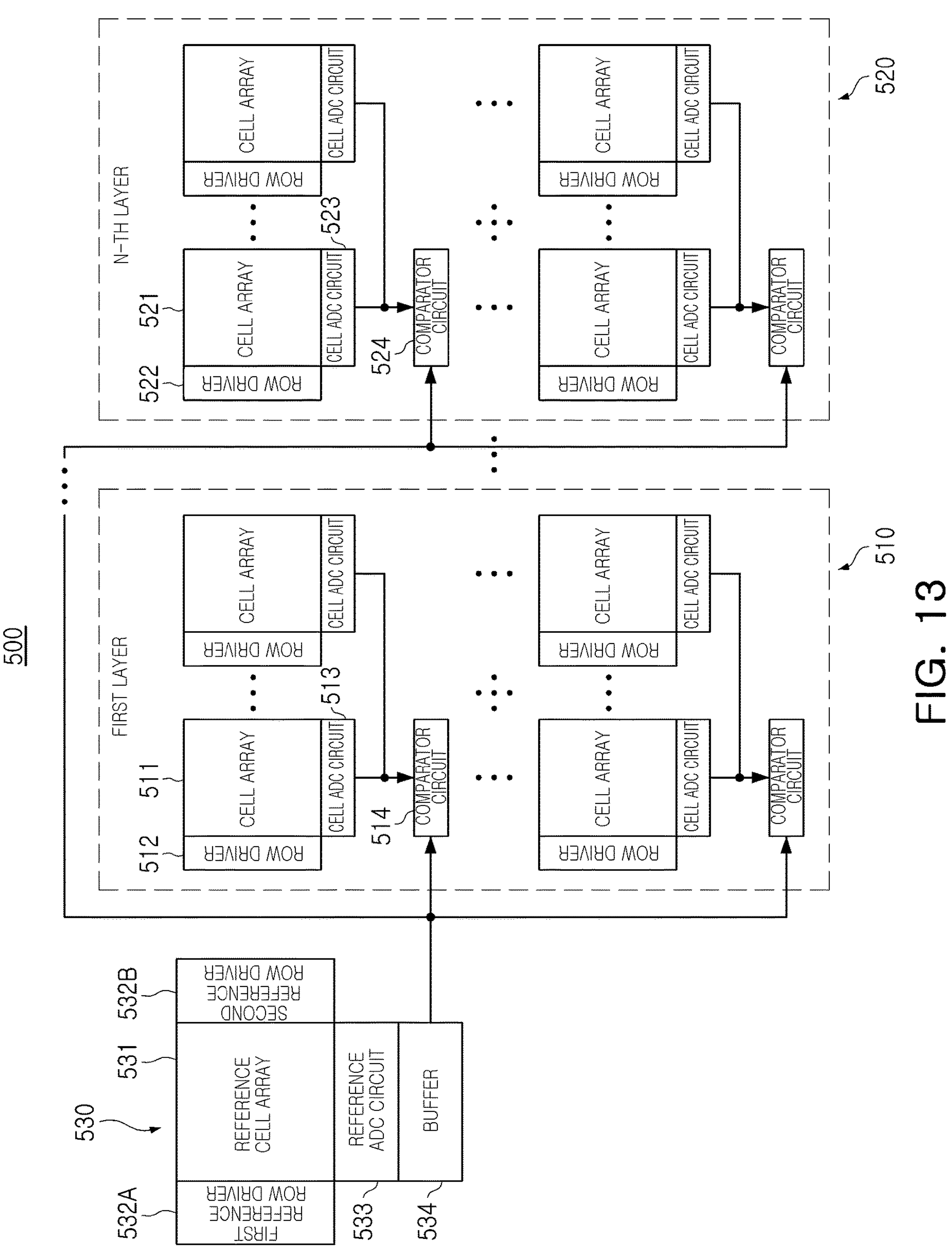

Referring to FIG. 13, a neuromorphic device 500 may include a plurality of cell tiles 510 and 520 and at least one reference tile 530. Weights corresponding to each of a plurality of layers included in a neural network may be stored in two or more cell tiles 510 and 520 in a distributed manner, and the number of the plurality of cell tiles 510 and 520 included in each layer may be varied depending on the structure of the neural network and the number of memory cells included in each of the plurality of cell tiles 510 and 520.

The structures of the plurality of cell tiles 510 and 520 and the at least one reference tile 530 may be similar to those of the aforementioned example embodiments described with reference to FIG. 11. However, in the example illustrated in FIG. 13, two or more of the plurality of cell tiles 510 and 520 may share a single comparator circuit 514 and 524. For example, two or more of the plurality of cell tiles 510 corresponding to a first layer may share a single comparator circuit 514. Similarly, two or more of the plurality of cell tiles 520 corresponding to the N-th layer may share a single comparator circuit 524. Each of the comparator circuits 514 and 524 may include a plurality of comparators. For example, the number of the plurality of comparators included in each of the comparator circuits 514 and 524 may be the same as the number of the plurality of cell ADCs included in each of the cell ADC circuits 513 and 523.

Once an inference operation starts, the reference ADC circuit 533 may generate digital reference data by comparing the reference currents obtained from the reference cell array 531 with a plurality of default currents. The digital reference data may be stored in the buffer 534 and may be transferred to the comparator circuits 514 and 524 included in each of the plurality of cell tiles 510 and 520.

Each of the comparator circuits 514 may be connected to two or more cell tiles 510. Each of the comparator circuits 514 may receive a plurality of pieces of digital cell data output by each of the two or more cell tiles 510 in sequence, and may compare the data with a plurality of pieces of digital reference data received from the buffer 534.

Accordingly, a computation speed of the neuromorphic device 500 according to the example illustrated in FIG. 13 may be slower than the computation speed of the neuromorphic device 300 in the example illustrated in FIG. 11, but may be faster than the computation speed of the neuromorphic apparatus 400 in the example illustrated in FIG. 12. Also, the number of wirings connecting the reference tile 530 to the plurality of cell tiles 510 and 520 and complexity of the wirings may also be intermediate between the example illustrated in FIG. 11 and the example illustrated in FIG. 12.

Figure 14:
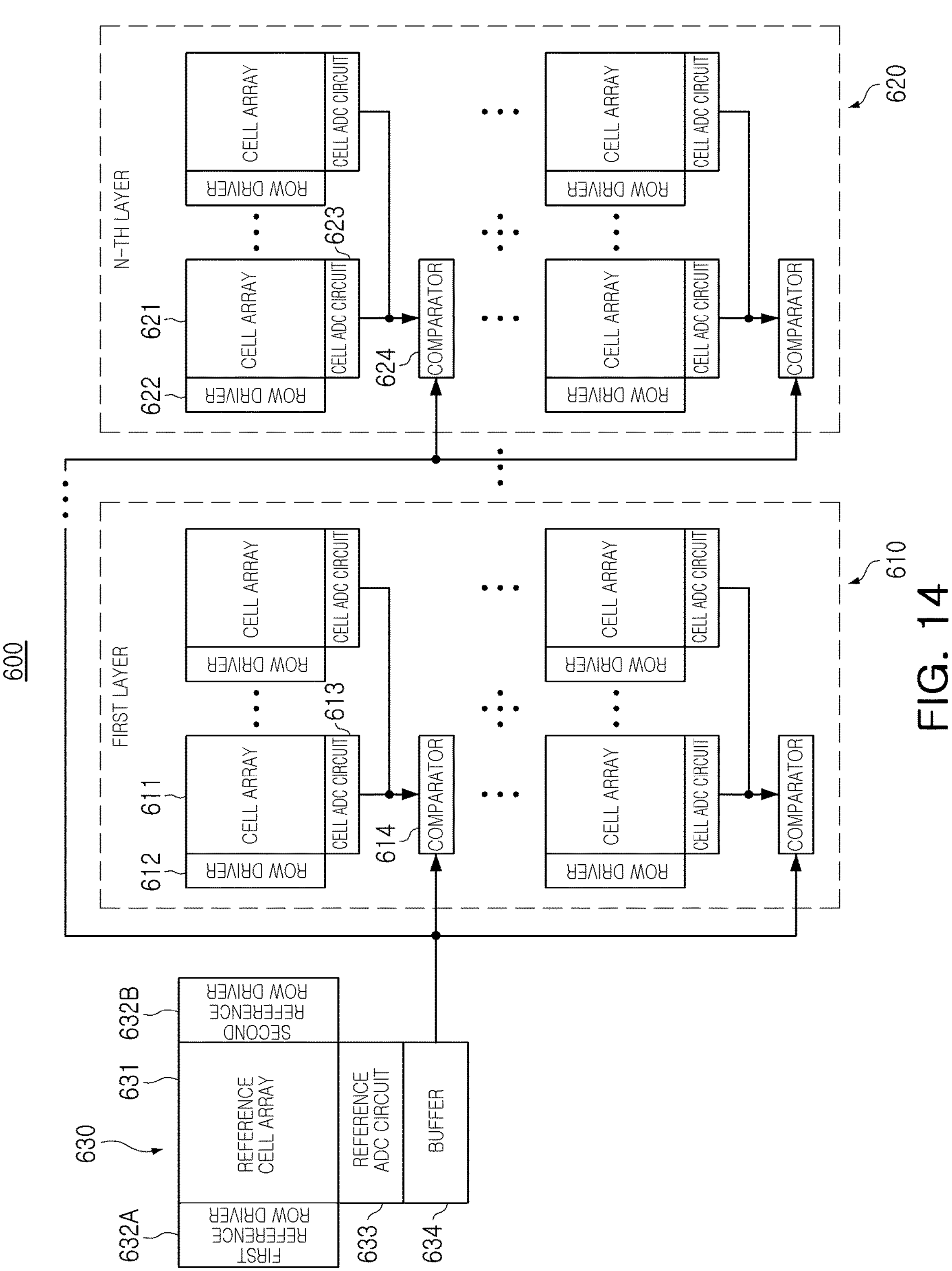

Referring to FIG. 14, a neuromorphic device 600 in an example may include a plurality of cell tiles 610 and 620 and at least one reference tile 630. Weights corresponding to each of a plurality of layers included in the neural network may be stored in two or more cell tiles 610 and 620 in a distributed manner, and the number of the plurality of cell tiles 610 and 620 included in each layer may be varied depending on the structure of the neural network and the number of memory cells included in each of the plurality of cell tiles 610 and 620.

The structures of the plurality of cell tiles 610 and 620 and the at least one reference tile 630 may be similar to those of the aforementioned example embodiments described with reference to FIG. 11. However, in the example illustrated in FIG. 14, two or more of the plurality of cell tiles 610 and 620 may share a single comparator 614 and 624. Referring to FIG. 14, two or more of the plurality of cell tiles 610 corresponding to the first layer may share the comparator 614. Similarly, two or more of the plurality of cell tiles 620 corresponding to the N-th layer may share the comparator 624.

Once an inference operation starts, a plurality of pieces of digital reference data output by the reference ADC circuit 633 may be stored in the buffer 634. The plurality of pieces of digital reference data stored in the buffer 634 may be transferred to the comparators 614 and 624 included in the plurality of cell tiles 610 and 620, respectively. Each of the comparators 614 corresponding to a first layer may receive a plurality of pieces of digital cell data output by each of the two or more cell tiles 610 in sequence, and may compare the plurality of pieces of digital cell data with the plurality of pieces of digital reference data received from the buffer 634.

Since the single comparator 614 receives a plurality of digital cell data output by two or more cell tiles 610 one by one and may compare the data with the plurality of pieces of digital reference data, the computation speed of the neuromorphic device 600 in FIG. 14 may be slower than those of the neuromorphic devices 300-500 in the examples described with reference to FIGS. 11 to 13. However, since two or more cell tiles 610 and 620 may share a single comparator 614 and 624, the integration density of the neuromorphic device 600 may improve more than the other example embodiments described above.

Figure 15:
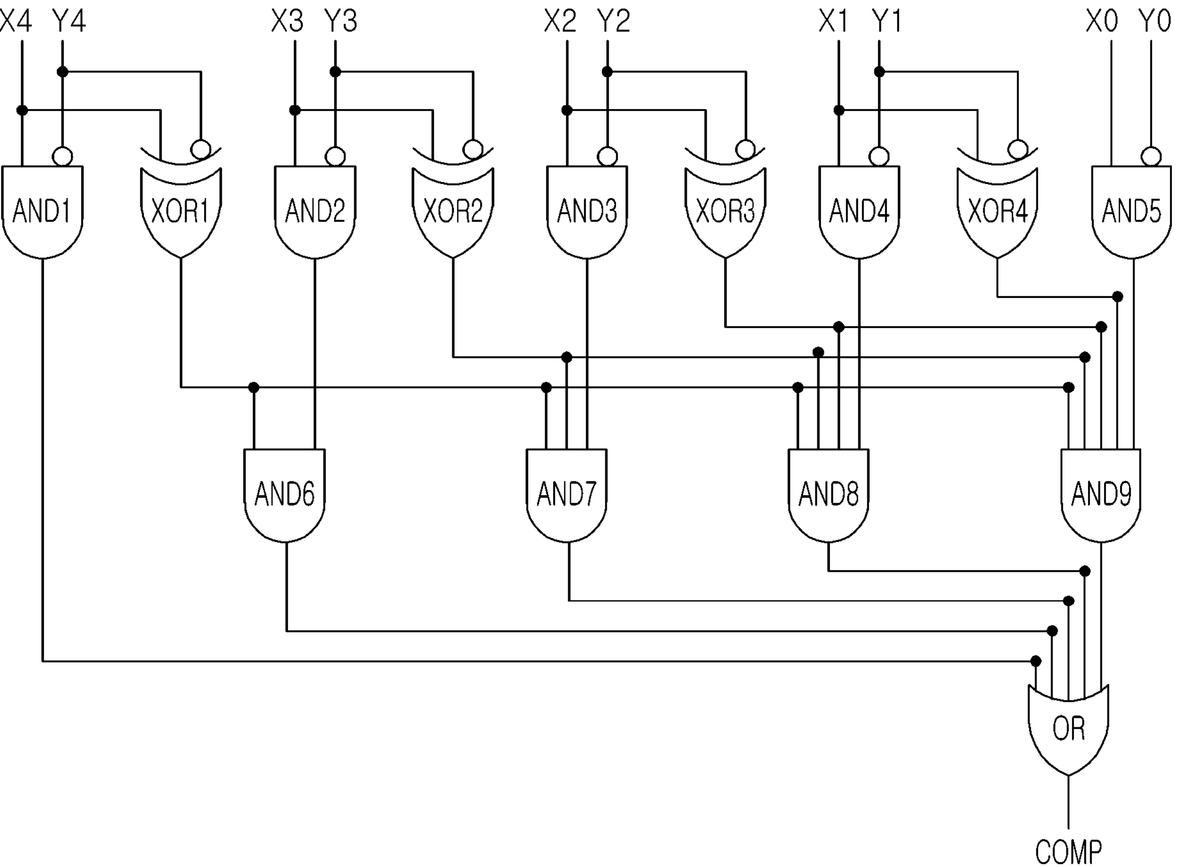
FIGS. 15 and 16 are diagrams illustrating comparator circuits included in a neuromorphic device according to some example embodiments of the present disclosure.
Figure 16:
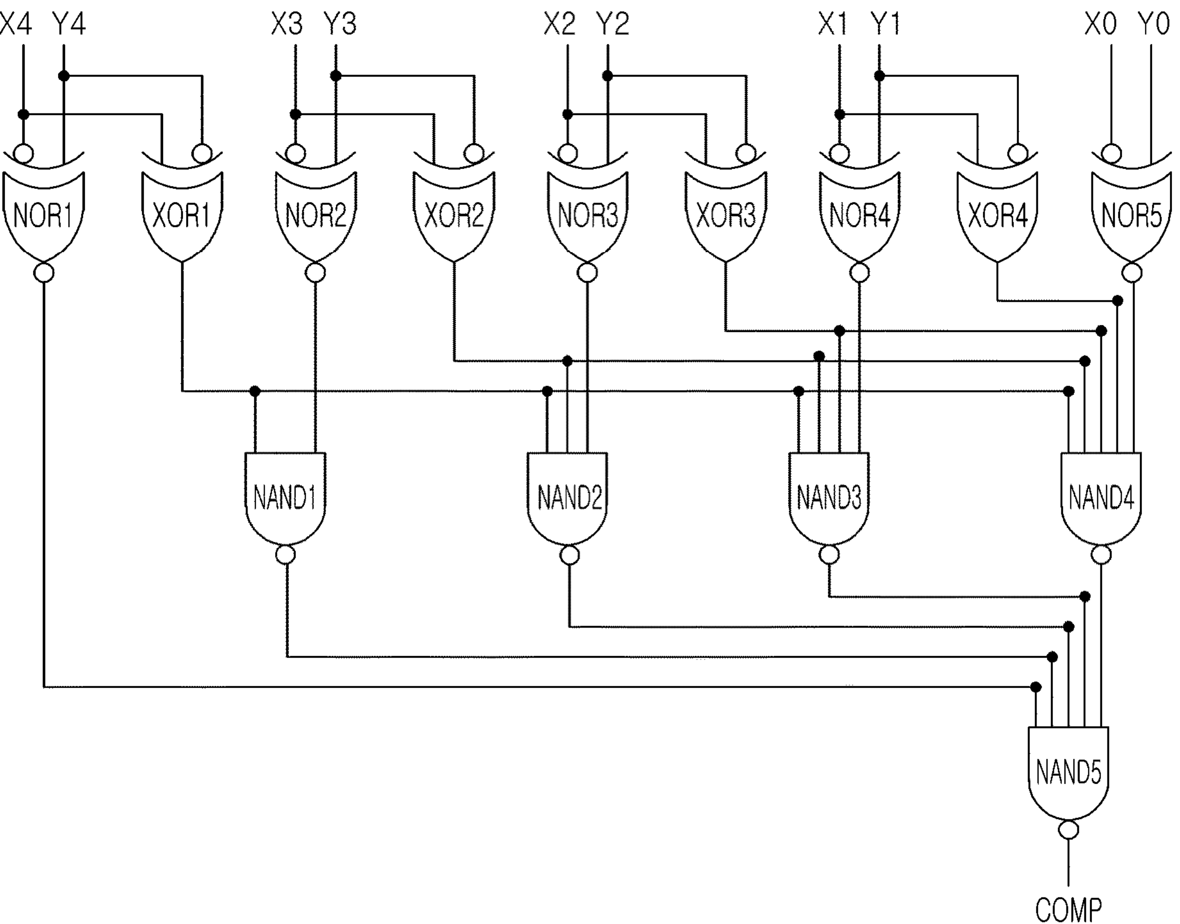

FIGS. 15 and 16 are diagrams illustrating comparator circuits included in a neuromorphic device according to some example embodiments.

FIGS. 15 and 16 may be circuit diagrams illustrating implementation examples of a comparator included in a neuromorphic device. When a comparator circuit connected to a single cell tile includes a plurality of comparators, a single comparator circuit may include two or more comparators according to at least one of the example embodiments illustrated in FIGS. 15 and 16.

Referring to FIG. 15, the comparator may include an AND gate, an OR gate, and an XOR gate. The comparator may compare 5-bit digital cell data (X4-X0: X) and 5-bit digital reference data (Y4-Y0: Y) bit by bit. The output COMP of the comparator may have a high logic value when the digital cell data X is greater than the digital reference data Y.

In some example embodiments, the comparator may compare the digital cell data (X) and the digital reference data (Y) from upper bits. The operations of the comparator according to the example illustrated in FIG. 15 may be as in Table 1.

TABLE 1

| X4Y4 | X3Y3 | X2Y2 | X1Y1 | X0Y0 | COMP |
|---|---|---|---|---|---|
| X4 > Y4 | DON'T CARE | DON'T CARE | DON'T CARE | DON'T CARE | 1 |
| X4 = Y4 | X3 > Y3 | DON'T CARE | DON'T CARE | DON'T CARE | 1 |
| X4 = Y4 | X3 = Y3 | X2 > Y2 | DON'T CARE | DON'T CARE | 1 |
| X4 = Y4 | X3 = Y3 | X2 = Y2 | X1 > Y1 | DON'T CARE | 1 |
| X4 = Y4 | X3 = Y3 | X2 = Y2 | X1 = Y1 | X0 > Y0 | 1 |

Referring to FIG. 16, a comparator may include a NAND gate, a NOR gate and an XOR gate. The comparator may compare 5-bit digital cell data (X4-X0: X) and 5-bit digital reference data (Y4-Y0: Y) bit by bit. The output COMP of the comparator may be a high logic value when the digital cell data (X) is greater than the digital reference data (Y), and the comparator may compare the digital cell data (X) and the digital reference data (Y) from upper bits. The operations of the comparator according to the embodiment illustrated in FIG. 16 may also be as in Table 1 above.

Several tens of NMOS transistors and several tens of PMOS transistors may be included in the comparator according to the example illustrated in FIG. 16. Even when assuming a structure in which each of the plurality of cell tiles is connected to a comparator circuit including a plurality of comparators, the area of the neuromorphic device may be further reduced than a general structure in which each of the plurality of cell tiles includes a plurality of reference cells, and accordingly, integration density may improve.

Figure 17:
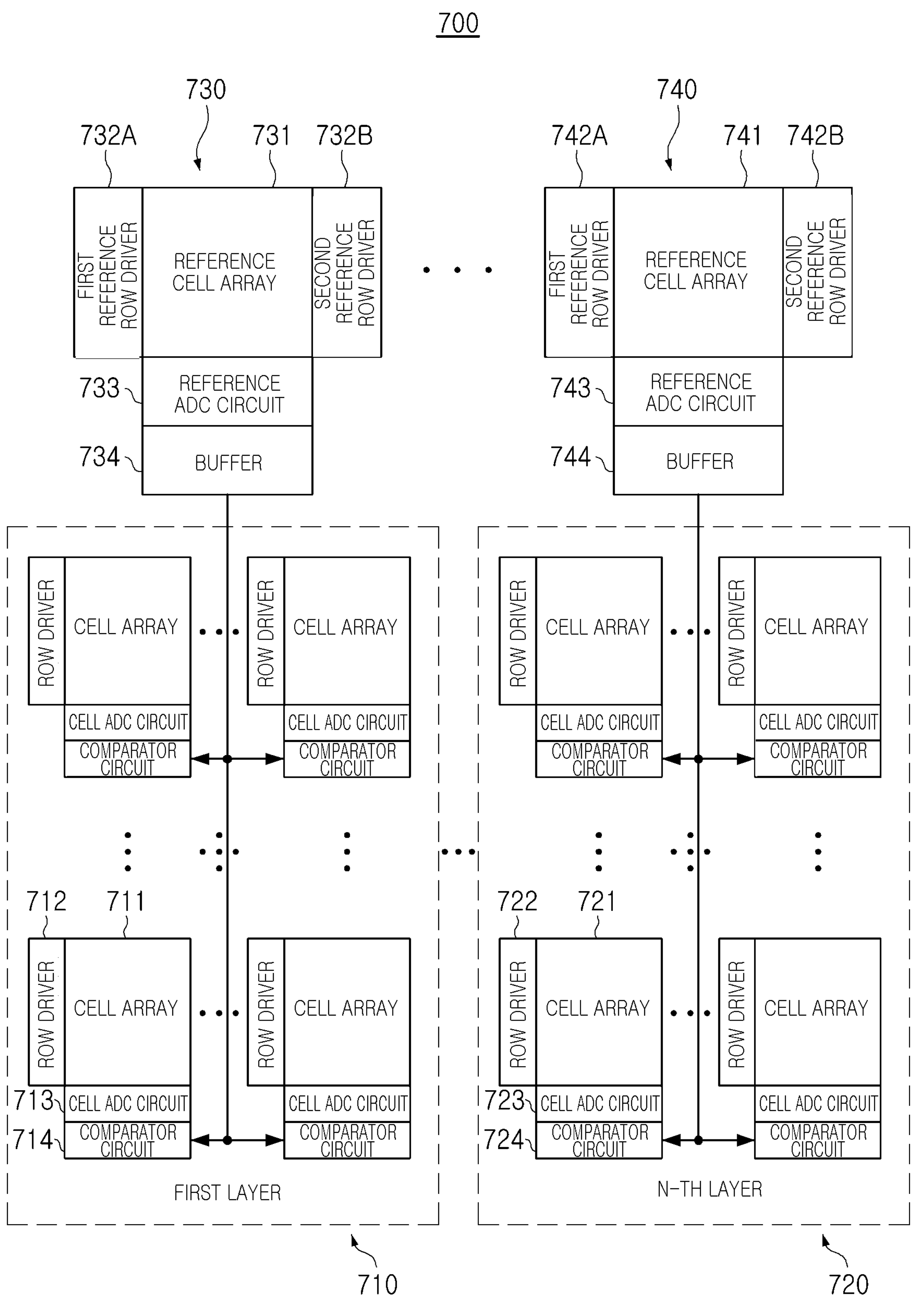
FIG. 17 is a diagram illustrating a neuromorphic device according to some example embodiments of the present disclosure.

FIG. 17 is a diagram illustrating a neuromorphic device according to some example embodiments.

Referring to FIG. 17, a neuromorphic device 700 may include a plurality of cell tiles 710 and 720 and a plurality of reference tiles 730 and 740. For example, weights corresponding to each of a plurality of layers included in a neural network may be stored in two or more cell tiles 710 and 720 in a distributed manner A structure of each of the plurality of cell tiles 710 and 720 may be understood with reference to the aforementioned example illustrated in FIGS. 11 to 14. For example, though the plurality of cell tiles 710 and 720 are illustrated as including the comparative circuits 714 and 724 (which may be substantially similar to the comparative circuits 314 and 324 of FIG. 11), the example embodiments are not limited thereto, and the plurality of cell tiles 710 and 720 may be substantially similar to the plurality of cell tiles 410, 420, 510, 520, 610, and/or 620, of FIGS. 12 to 14. Therefore, for brevity, the similarities between the example of FIG. 17 and the aforementioned examples will be omitted. In the embodiment in FIG. 17, the neuromorphic apparatus 700 may include a plurality of reference tiles 730 and 740.

For example, the number of the plurality of reference tiles 730 and 740 included in the neuromorphic device 700 may be equal to the number of layers included in a neural network to be implemented as the neuromorphic device 700.

The comparator circuits 714 connected to the plurality of cell tiles 710 corresponding to a first layer may receive digital reference data from the buffer 734 of the first reference tile 730. The comparator circuits 724 connected to the plurality of cell tiles 720 corresponding to the N-th layer may receive digital reference data from the buffer 744 of the N-th reference tile 740.

Once an inference operation starts, a plurality of default currents may be input to the cell ADC circuits 713 and 723 and the reference ADC circuits 733 and 734. For example, a plurality of pieces of digital reference data output by the buffer 734 of the first reference tile 730 and a plurality of pieces of digital reference data output by the buffer 744 of the N-th reference tile 740 may obtained by comparing the reference currents with the same default currents and converting the currents into digital data.

In the inference operation, each of the comparator circuits 714 and 724 may receive the plurality of pieces of digital cell data output by the cell ADC circuits 713 and 723 and may compare the data with the plurality of pieces of digital reference data. In some example embodiments, each of the comparator circuits 714 and 724 may include a plurality of comparators, and each of the plurality of comparators may compare a single piece of received digital cell data from among the plurality of pieces of digital cell data with the plurality of pieces of digital reference data and may output result data corresponding to the MAC computation. However, a method of implementing each of the comparator circuits 714 and 724 may be varied in consideration of integration density, power consumption, a computation speed of the neuromorphic device 700 as described above with reference to FIGS. 11 to 14.

Figure 18:
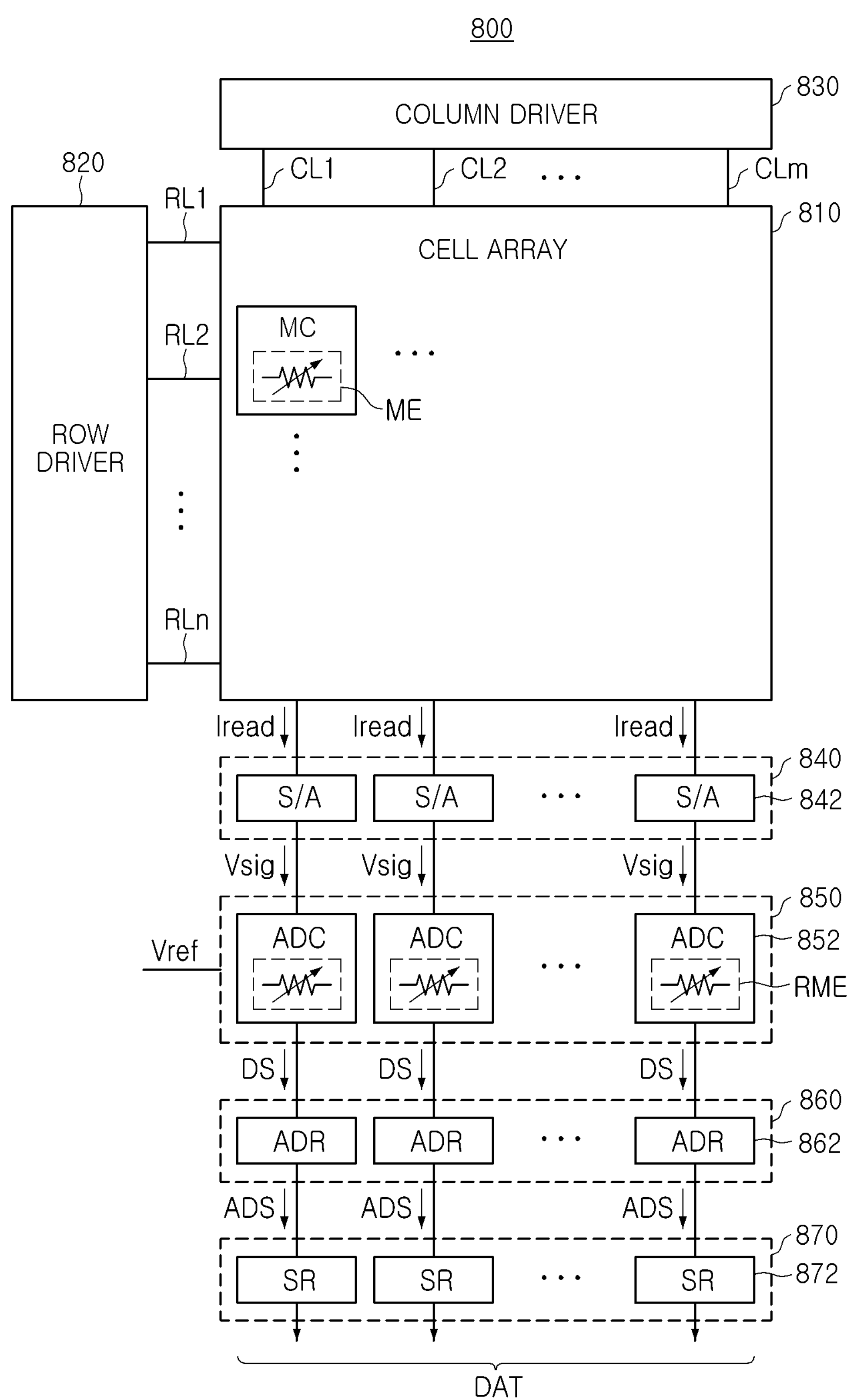
FIG. 18 is a block diagram illustrating a neuromorphic device according to some example embodiments of the present disclosure.

FIG. 18 is a block diagram illustrating a neuromorphic device according to some example embodiments.

Referring to FIG. 18, a neuromorphic device 800 may include a cell array 810, a row driver 820, a column driver 830, a current-voltage converter circuit 840, an analog-to-digital converter circuit 850, an adder circuit 860, and a shift register circuit 870.

The cell array 810 may include a plurality of memory cells MC, and the plurality of memory cells MC may be connected to a plurality of row lines RL1-RLn and a plurality of column lines CL1-CLm. Each of the plurality of memory cells MC may include a memory device ME, and for example, the memory device ME may be implemented as a resistive device.

The row driver 820 may be connected to the cell array 810 via the plurality of row lines RL1-RLn. The row driver 820 may include a circuit for selecting and driving at least one of the plurality of row lines RL1 to RLn. Similarly, the column driver 830 may be connected to the cell array 810 via the plurality of column lines CL1-CLm, and may include a circuit for selecting and driving at least one of the plurality of column lines CL1-CLm.

Data may be stored in the plurality of memory cells MC of the cell array 810. For example, data may be stored in the cell array 810 using changes in the resistance of the memory device ME included in each of the plurality of memory cells MC. Also, the cell array 810 may output read current Iread via a plurality of column lines CL1-CLm based on a plurality of input voltages input to the plurality of row lines RL1 to RLn and data stored in the plurality of memory cells MC. The read current Iread may be converted into a signal voltage Vsig by sense amplifiers 842 included in a sense amplifier circuit 840 and connected to the plurality of column lines CL1-CLm, respectively.

The signal voltage Vsig may be converted into a digital signal DS by analog-to-digital converters 852 included in the analog-to-digital converter circuit 850. For example, each of the analog-to-digital converters 852 may include at least one resistive memory device RME including the same resistive material as that of the memory device ME included in the cell array 810, and may generate a full scale voltage using a reference voltage Vref and at least one resistive memory device RME. Each of the analog-to-digital converters 852 may generate a plurality of divided voltages using a full-scale voltage, may compare the signal voltage Vsig with the plurality of division voltages and may output a digital signal DS.

The adder circuit 860 may include a plurality of adders 862. Each of the plurality of adders 862 may generate a summed digital signal ADS by summing the digital signal DS. For example, the adder circuit 860 may sum up the digital signals DS output by the plurality of memory cells MC connected to one of the plurality of column lines CL1-CLm and may output the summed digital signal ADS.

The shift register circuit 870 may include a plurality of shift registers 872. The plurality of shift registers 872 may generate output data DAT using the summed digital signal ADS. For example, the output data DAT may correspond to a final result of multiplication and accumulation computations executed in a neural network system implemented by a neuromorphic device.

In some example embodiments, at least one of the number of sense amplifiers 842, the number of analog-to-digital converters 852, the number of adders 862, and the number of shift registers 872 may be equal to or less than the number of the plurality of column lines CL1 to CLm. The neuromorphic device 800 may include a logic circuit for controlling a row driver 820, a column driver 830, a sense amplifier circuit 840, an analog-to-digital converter circuit 850, and an adder circuit 860, and a shift register circuit 870, and a voltage regulator in addition to the components illustrated in FIG. 18.

Figure 19:
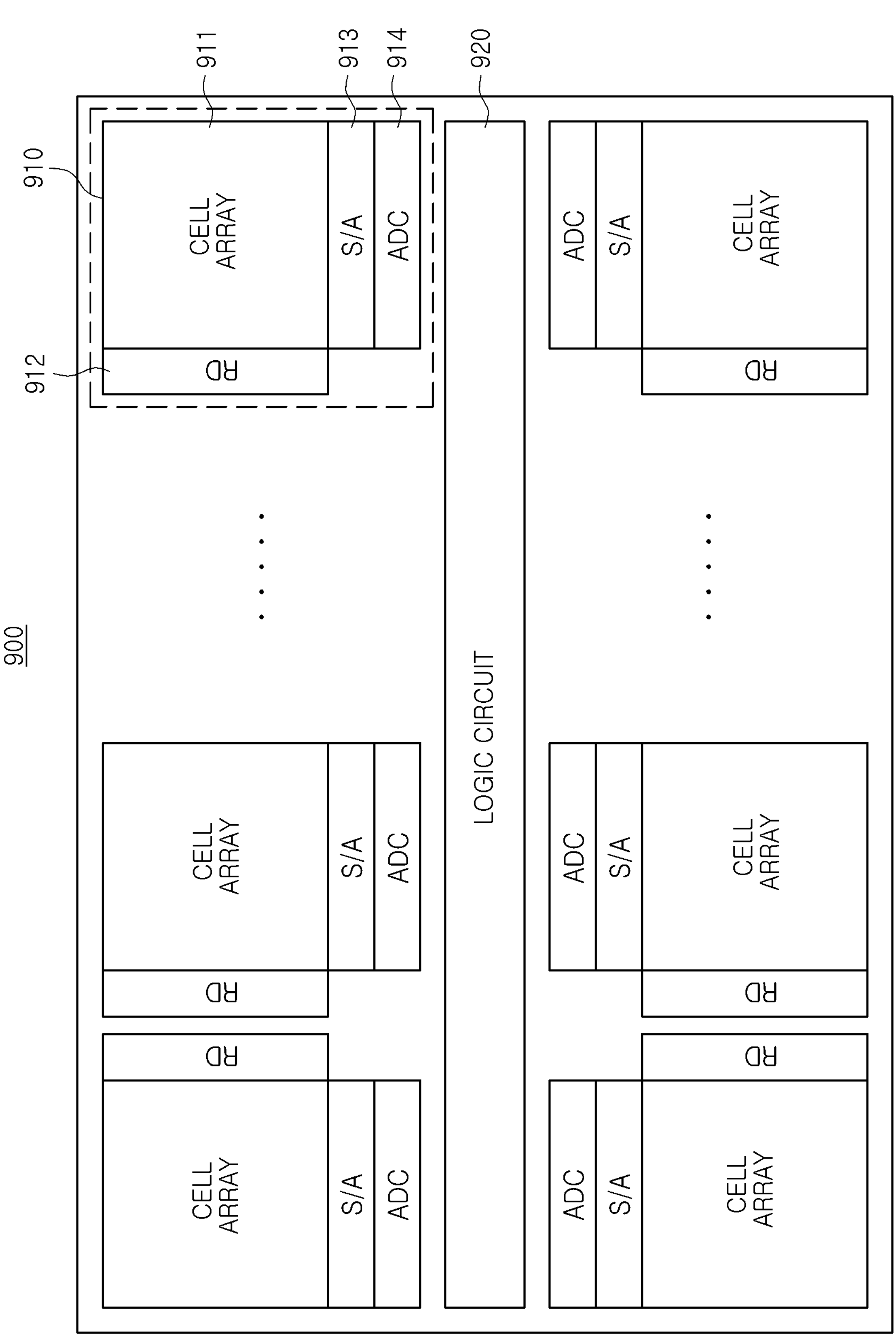
FIG. 19 is a block diagram illustrating a neuromorphic device according to some example embodiments of the present disclosure.

FIG. 19 is a block diagram illustrating a neuromorphic device according to some example embodiments.

Referring to FIG. 19, a neuromorphic device 900 may include a plurality of tiles 910. Each of the plurality of tiles 910 may include a cell array 911 in which a plurality of memory cells is disposed, a row driver 912, sense amplifiers 913, and an analog-to-digital converter circuit 914. For example, a plurality of memory cells disposed in the cell array 911 may be connected to the row driver 912 via a plurality of row lines, and may be connected to the sense amplifiers 913 and the analog-to-digital converter circuit 914 via the plurality of column lines.

A plurality of tiles 910 may share a logic circuit 905, and the logic circuit 905 may store weights of a neural network of which training has been completed in the plurality of tiles 910, and may execute a computation corresponding to the operation of the neural network. Also, the logic circuit 905 may include input/output pads connected to an external device.

In some example embodiments, the number of the plurality of tiles 910 may be equal to or greater than the number of hidden layers included in the neural network. When the neural network implemented by the neuromorphic device 900 includes an n number of hidden layers, the hidden layers may be implemented using an n number of tiles 910. For example, the n number of tiles 910 may correspond to the hidden layers, respectively. Alternatively, a single hidden layer may be implemented with two or more tiles 910. For example, the number of tiles 910 may be greater than the number of hidden layers.

As described above, the plurality of memory cells included in the cell array 911 may store weights (e.g., between nodes) included in different layers in a neural network of which training has been completed. In some example embodiments, each value of weights in a neural network of which training has been completed may be represented as a floating point and may have a positive or negative sign. Since weights are recorded as resistance values or conductance values in each of the plurality of memory cells, the weights may be quantized to store the weights in the cell array.

As an example, weights may be quantized according to distribution of weights included in each of the hidden layers in a neural network of which training has been completed. For example, a reference value may be determined based on the distribution of weights in each of the hidden layers, the reference value may be determined as a zero point weight, and weights greater than the reference value and weights less than the reference value may be quantized as quantized weights. Accordingly, when the quantization is completed, each value of the real weights represented as floating points may be represented as quantized weights and zero point weights. In some example embodiments, both the quantized weight and the zero point weight may be represented in the form of natural numbers. Hereinafter, a process of quantizing weights will be described in greater detail with reference to FIGS. 20A to 20C.

Figure 20A:
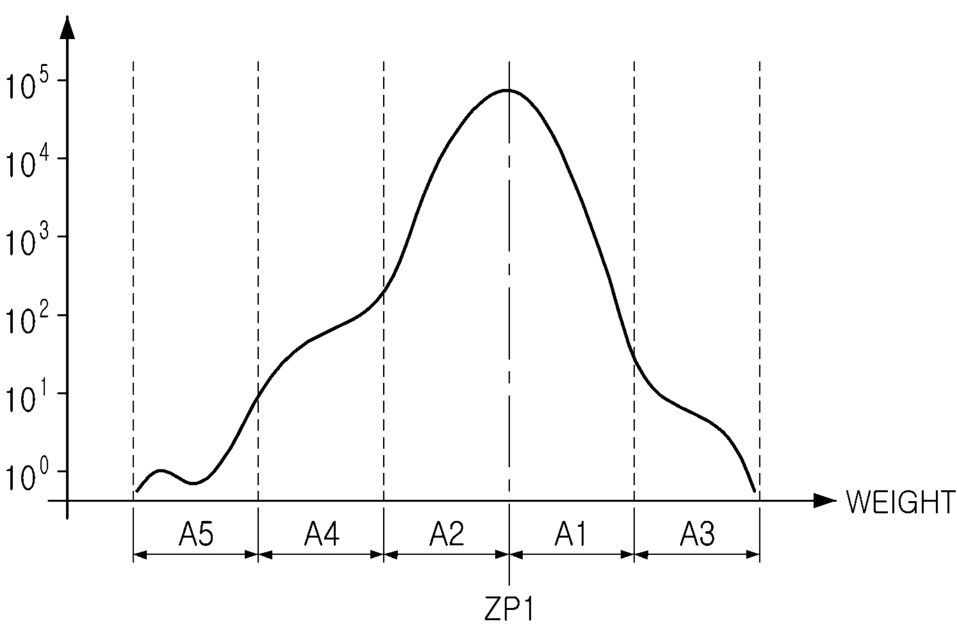
FIGS. 20A to 20C are diagrams illustrating quantization in a neuromorphic device according to some example embodiments of the present disclosure.
Figure 20B:
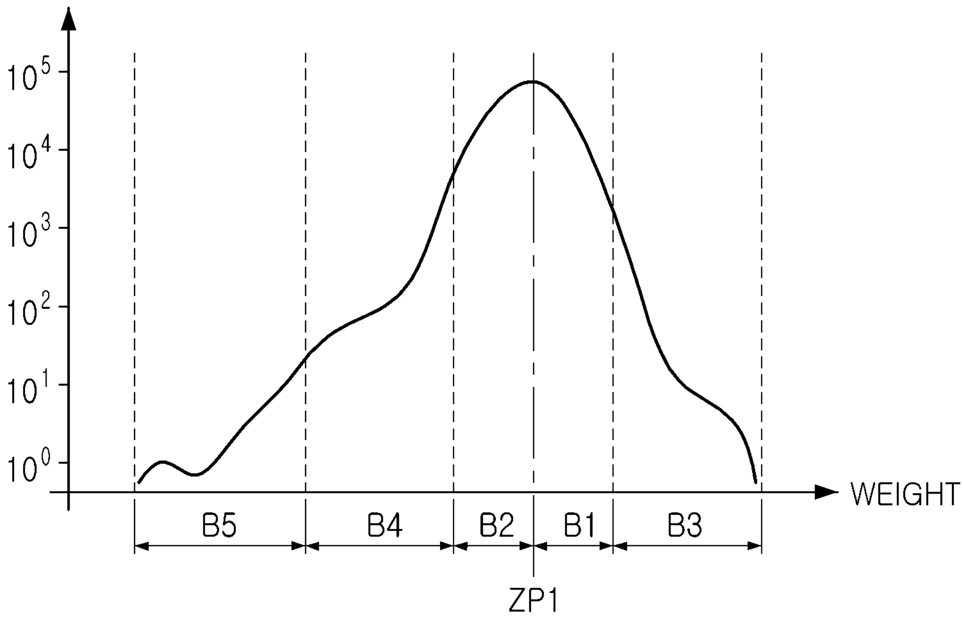
Figure 20C:
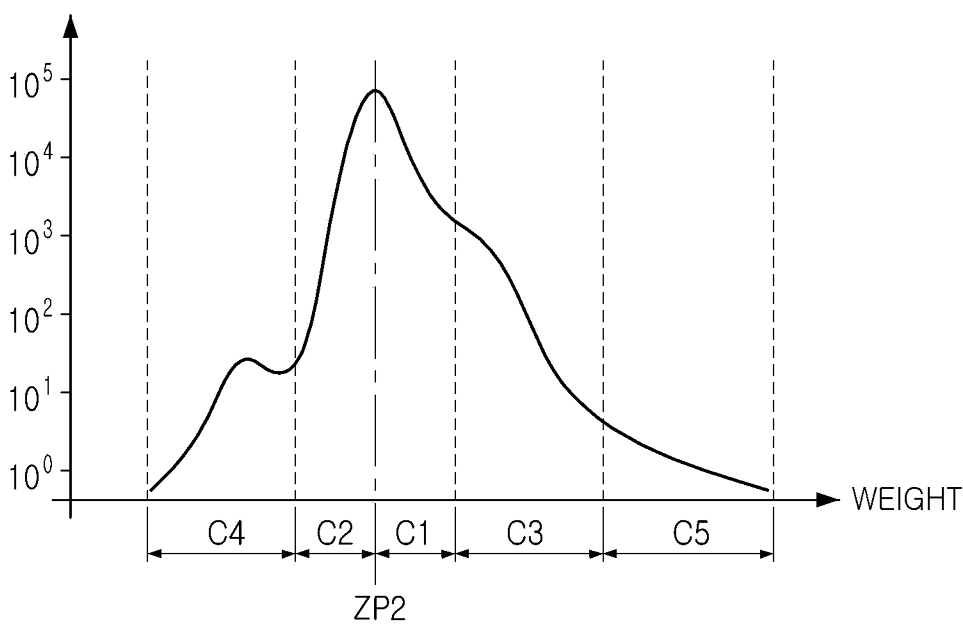

FIGS. 20A to 20C are diagrams illustrating quantization in a neuromorphic device according to some example embodiments.

FIGS. 20A to 20C illustrate graphs indicating distribution of weights included in one of layers in a neural network of which training has been completed. In the example embodiments in FIGS. 20A to 20C, the horizontal axis may indicate values of weights, and the vertical axis may correspond to the number of weights having the respective values.

Referring to FIG. 20A, the distribution of real weights included in one of the layers of the neural network of which training has been completed may be obtained, and a representative value of the distribution may be selected as a zero point weight ZP1. In the example illustrated in FIG. 20A, the real weights represented as floating points may be quantized by dividing the weights into a plurality of sections A1-A5 having the same length. As an example, the quantization may be performed as in Equation 2 below:

$$r=s(q-z) \quad \text{[Equation 2]}$$

In Equation 2, r may correspond to a real weight, q may correspond to a quantized weight allocated to each of the plurality of sections A1-A5, and z may correspond to a zero point weight ZP1, and s may be a scale value applied to the quantization. For example, the real weights included in the first section A1, greater than the zero point weight ZP1, may be quantized as first quantized weights, and the real weights included in the second section A2, smaller than the zero point weight ZP1, may be quantized as second quantized weights. For example, a difference between the first quantized weight and the zero point weight ZP1 may be the same as the difference between the second quantized weight and the zero point weight ZP1 and may have an opposite sign. For example, when the difference between the first quantized weight and the zero point weight ZP1 is +α, the difference between the second quantized weight and the zero point weight ZP1 may be −α.

In the example illustrated in FIG. 20A, the plurality of sections A1-A5 divided with reference to the zero point weight ZP1 may have the same length. In the example illustrated in FIG. 20B, the plurality of sections B1-B5 determined for quantization may have different lengths.

In the example illustrated in FIG. 20B, a different quantization method may be applied to the weights of the same layer. For example, at least a portion of the plurality of sections B1-B5 determined with reference to the same zero point weight ZP1 as in FIG. 20A may have different lengths. For example, the first section B1 and the second section B2 approximate to the zero point weight ZP1 may have a relatively smaller length than those of the other sections B3-B5. Accordingly, in the sections closer to the zero point weight ZP1, the quantized weights may be arranged more densely, and a lower quantization error may be obtained as compared to the example illustrated in FIG. 20A.

FIG. 20C is a diagram illustrating quantization of weights included in a layer different from the examples illustrated in FIGS. 20A and 20B. Referring to FIG. 20C, as the distribution of weights in different layers is different, a zero point weight ZP2 different from the example embodiments described with reference to FIGS. 20A and 20B may be selected. Also, a plurality of sections C1-C5 are selected with reference to the zero point weight ZP2, and quantized weights for quantization may be determined for each of the plurality of sections C1-C5.

In the examples illustrated in FIGS. 20A to 20C, the number of the plurality of sections A1-A5, B1-B5, and C1-C5 determined with reference to the zero point weights ZP1 and ZP2 may be varied. For example, to reduce a quantization error, the number of the plurality of sections A1-A5, B1-B5, and C1-C5 may be increased. To reduce computation burden and power consumption in the neuromorphic device implementing a neural network, the number of the plurality of sections A1-A5, B1-B5, and C1-C5 may be reduced.

The quantized weights and the zero point weights obtained by quantizing the weights included in the layers of the neural network may be stored in tiles included in the neuromorphic device. Only one zero point weight may be applied to the weights of a single layer among the layers included in the neural network, and the zero point weight may be stored in zero point cells connected to a portion of column lines in a tile for storing the weights of a single layer.

As an example, when each of the memory cells operates as a single level cell SLC and the zero point weight is represented as 3-bit binary data, 3-bit data of the zero point weight may be stored in a plurality of zero point cells connected to three column lines. Also, since the same zero point weight is applied to the weights of a single layer, the same data may be stored in zero point cells at points in which a plurality of row lines and one of the three column lines intersect.

In some example embodiments, the quantized weights obtained in the process of quantizing the weights of the layers included in the neural network may be stored in weight arrays, and the zero point weights may be stored in a zero point array different from the weight array. Each of the weight arrays may be included in the weight tile, and the zero point array may be included in the zero point tile.

Accordingly, multiplication and accumulation computation of input values and quantized weights may be performed separately from the multiplication and accumulation computation of input values and zero point weights, and the computation burden of the neuromorphic device may be reduced. Also, when quantized weights corresponding to weights included in a single layer are stored in a plurality of weight arrays in a distributed manner in the neural network, it may not be necessary to store a zero point weight in each of the weight tiles including the plurality of weight arrays, integration density and power consumption of the neuromorphic device may improve.

Similarly to the weights, input values received by nodes of each of the layers of the neural network may also be represented in floating point values, such that, in some example embodiments, the input values may also be quantized and may be input to the weight arrays and the zero point array, which will be described with reference to FIG. 21 in the description below.

Figure 21:
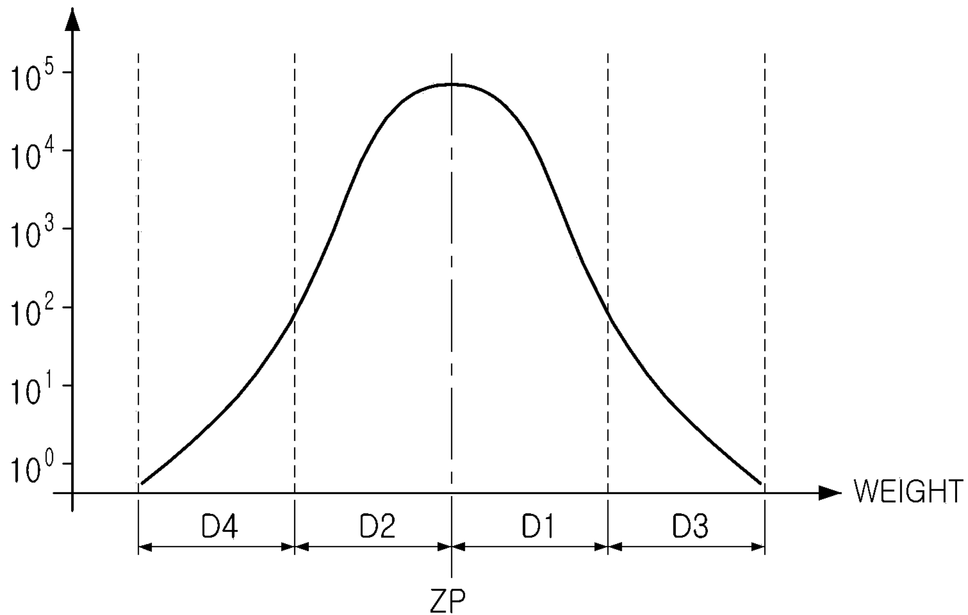
FIG. 21 is a diagram illustrating quantization in a neuromorphic device according to some example embodiments of the present disclosure.

FIG. 21 is a diagram illustrating quantization in a neuromorphic device according to an example embodiment.

In the neural network, nodes included in each of the layers may receive input values from nodes included in a previous layer. For example, output values of nodes included in the previous layer may be input values of the respective nodes. Since the output values of the nodes included in the previous layer are known values, the distribution of input values received by each of the layers of the neural network may be indicated as illustrated in FIG. 21.

The zero point input value ZP may be determined by a representative value in the distribution of input values, and the input values may be quantized by setting a plurality of sections D1-D4 with reference to the zero point weight ZP. The input values may be quantized as in Equation 2 described above, and may be represented as a quantized input value, a zero point input value, and a scale value. The quantized input value may have different values in the plurality of sections D1-D4.

Hereinafter, an operation process executed in nodes included in layers of a neural network will be described. The nodes included in different layers may be connected to each other by weights. As an example, assuming a first hidden layer and a second hidden layer connected to each other, the first hidden nodes included in the first hidden layer and the second hidden nodes included in the second hidden layer may be connected to each other by predetermined (and/or otherwise determined) weights. The weights may be determined as training of the neural network is completed.

Input values r1 output by the first hidden nodes and received by the second hidden nodes, and real weights r2 connecting the first hidden nodes to the second hidden nodes may be quantized as in Equation 3 as below:

$$r1=s1(q1-z1)$$

$$r2=s2(q2-z2) \quad \text{[Equation 3]}$$

As described above, multiplication and accumulation computations may be performed between the layers included in the neural network. Accordingly, the output values r3 output by the second hidden nodes may be represented as in Equation 4 as below. In Equation 4, q3 is a quantized output value obtained by quantizing the actual output values r3, z3 is a zero point output value determined in the process of quantizing the output values r3, and s3 is a scale value determined in the process of quantizing the output values r3.

$$r3=s3(q3-z3)=\Sigma s1(q1-z1)*s2(q2-z2) \quad \text{[Equation 4]}$$

Equation 4 may also be represented as in Equation 5 as below, where M is a value calculated from the scale values s1-s3 and may be s1*s2/s3.

$$q3=z3+M\Sigma(q1*q2-q1*z2-q2*z1+z1*z2) \quad \text{[Equation 5]}$$

In the process of quantizing the weights of each of the layers included in the neural network, a single zero point weight z2 may be applied to each of the layers. For example, the real weights r2 included in one of the layers may have different values due to the quantized weight q2, and the zero point weight z2 may have the same value.

In some example embodiments, the zero point weight z2 applied to each of the layers included in the neural network may be collected and implemented as an array. For example, the quantized weight q2 generated by quantizing the real weights r2 included in one of the layers may be stored in memory cells of the cell array, and the zero point weight z2 may be stored in the zero point cells of the zero point array different from the cell array. As described above, by storing the zero point weight z2 applied to quantize the weights of each layer in a zero point array different from the cell array, integration density of the neuromorphic device, power consumption and computation burden may be reduced.

Figure 22:
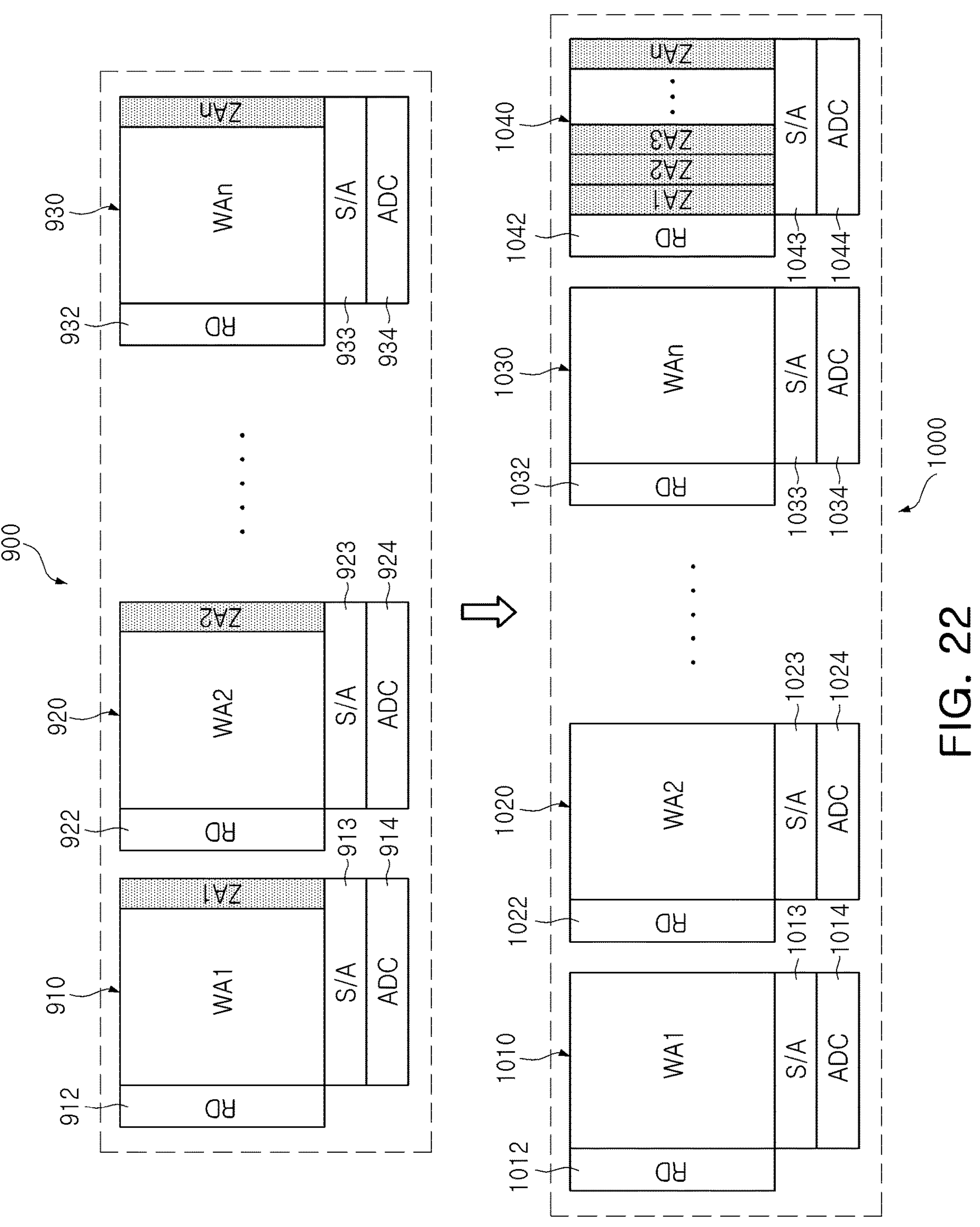
FIG. 22 is a diagram illustrating a neuromorphic device according to some example embodiments of the present disclosure.

FIG. 22 is a diagram illustrating a neuromorphic device according to some example embodiments.

FIG. 22 illustrates a plurality of tiles included in a neuromorphic device. In the neuromorphic apparatus 900 according to an example embodiment, the plurality of tiles 910-930 may correspond to layers included in a neural network to be implemented by the neuromorphic apparatus 900, respectively. For example, the first tile 910 may correspond to a first hidden layer connected to the input layer, and the second tile 920 may correspond to a second hidden layer connected to the first hidden layer.

Referring to the first tile 910 as an example, the cell array of the first tile 910 may include a plurality of memory cells and may be divided into a first weight area WA1 and a first zero point area ZA1. Memory cells of the first weight area WA1 may be allocated as weight cells, and memory cells of the first zero point area ZA1 may be allocated as zero point cells. The weight cells included in the first weight area WA1 and the zero point cells included in the first zero point area ZA1 may share a plurality of row lines and may be connected to different column lines.

In the weight cells, quantized weights generated by quantizing the weights of the first hidden layer may be stored. The zero point weight obtained by quantizing the weights of the first hidden layer may be stored in the zero point cells. In the process of quantizing the weights of the first hidden layer, a single zero point weight may be generated, such that zero point cells connected to a single column line in common in the first zero point area ZA1 may store the same data. The first weight area WA1 and the first zero point area ZA1 may be connected to the row driver 912, the sense amplifier circuit 913, and the analog-to-digital converter circuit 914. The sense amplifier circuit 913 may include a current-voltage converter converting a current output to a plurality of column lines into a voltage.

In the neuromorphic apparatus 900, each of the plurality of tiles 910-930 may include zero point areas ZA1-ZAn, whereas, in the neuromorphic apparatus 1000 according to another example embodiment, at least one zero point tile 1040 among a plurality of tiles 1010-1040 may store the zero point weights obtained in the process of quantizing weights included in layers of a neural network. However, the number of zero point tiles 1040 may be varied in the example embodiments.

Accordingly, the neuromorphic apparatus 1000 may include a plurality of weight tiles 1010-1030 and at least one zero point tile 1040. Each of the cell arrays of the plurality of weight tiles 1010-1030 may be a weight array, and may correspond to the above-described weight areas WA1-WAn.

For example, memory cells included in a cell array of each of the plurality of weight tiles 1010-1030 may be allocated to weight cells, and the weight cells may store the quantized weights obtained by quantizing real weights included in each layer of the neural network. For example, the quantized weights obtained by quantizing real weights included in the first hidden layer of the neural network may be stored in weight cells of the first weight tile 1010.

The zero point weights applied in the process of quantizing weights included in each of the layers of the neural network may be stored in the zero point tile 1040. As an example, referring to FIG. 22, the zero point array of the zero point tile 1040 may include a first zero point area ZA1 in which a first zero point weight of the first hidden layer is stored, and a second zero point area ZA2 in which a second zero point weight of the second hidden layer is stored. The zero point areas ZA1-ZAn included in the zero point array of the zero point tile 1040 may share a plurality of row lines and may be connected to different column lines.

For example, the number of column lines connected to each of the zero point areas ZA1-ZAn may be the same, which may be because, in the process of quantizing the weights included in the neural network and converting the weights into binary data, the zero point weights may be converted into binary data having the same number of bits. However, when a portion of the weights are converted into binary data having a different number of bits, the number of column lines connected to a portion of the zero point areas ZA1-ZAn may be different from each other.

Accordingly, in some example embodiments of the neuromorphic apparatus 1000, the zero point weight and the quantized weights obtained by quantizing the weights included in one of the layers of the neural network may be stored in the plurality of tiles 1010-1040 in a distributed manner. For example, the quantized weights obtained by quantizing the weights of the first hidden layer may be stored in the first weight tile 1010, and the zero point weight may be stored in the first zero point area ZA1.

In the operation process of the neuromorphic apparatus 1000, one of the plurality of weight tiles 1010-1030 and the zero point tile 1040 may operate simultaneously. For example, when multiplication and accumulation computations corresponding to the second hidden layer of the neural network are performed in the neuromorphic apparatus 1000, the second weight tile 1020 and the zero point tile 1040 may operate simultaneously. The logic circuit of the neuromorphic apparatus 1000 may output a result of computation corresponding to the second hidden layer using the result of weight computation of the second weight tile 1020 and the result of zero point computation of the zero point tile 1040.

As an example, the result of weight computation output by the second weight tile 1020 may include (q1*q2) and (q2*z1) in Equation 5, and the result of zero point computation output via at least one column line connected to the second zero point area ZA2 may include (z1*z2) and (q1*z2) in Equation 5. The logic circuit may obtain the result of computation of the second hidden layer by summing the result of weight computation and the result of zero point computation as in Equation 5.

The result of zero point computation output by the zero point tile 1040 may be, e.g., a dot product operation of input values and a zero point weight. Also, since a single zero point weight is stored in each of the first to N-th zero point areas ZA1-ZAn, the result of zero point computation may be varied only according to the number of ones included in the input values. Accordingly, in some example embodiments, the result of zero point computation according to the number of 1s included in the input values may be previously stored in a buffer, and the number of 1s included in the input values input to one of the weight tiles 1010-1030 may be counted and one of the values stored in the buffer may be selected, thereby swiftly calculating the result of zero point computation. For example, the buffer may be included in a logic circuit of the neuromorphic device. The computation operation as above will be described in greater detail later.

Each of the plurality of tiles 1010-1040 may include a row driver 1012, 1022, 1032, and 1042, sense amplifier circuits 1013, 1023, 1033, and 1043, and analog-to-digital converter circuit 014, 1024, 1034, and 1044. In some example embodiments, a reference current may be input to the analog-to-digital converter circuits 1014, 1024, 1034, and 1044 of each of the plurality of tiles 1010-1040. Alternatively, the reference current may not be input to the analog-to-digital converter circuits 1014, 1024, 1034, and 1044, and as described above with reference to FIGS. 3 to 17, the result of computation may be digitally converted by comparing the digital cell data with the digital reference data.

Figure 23:
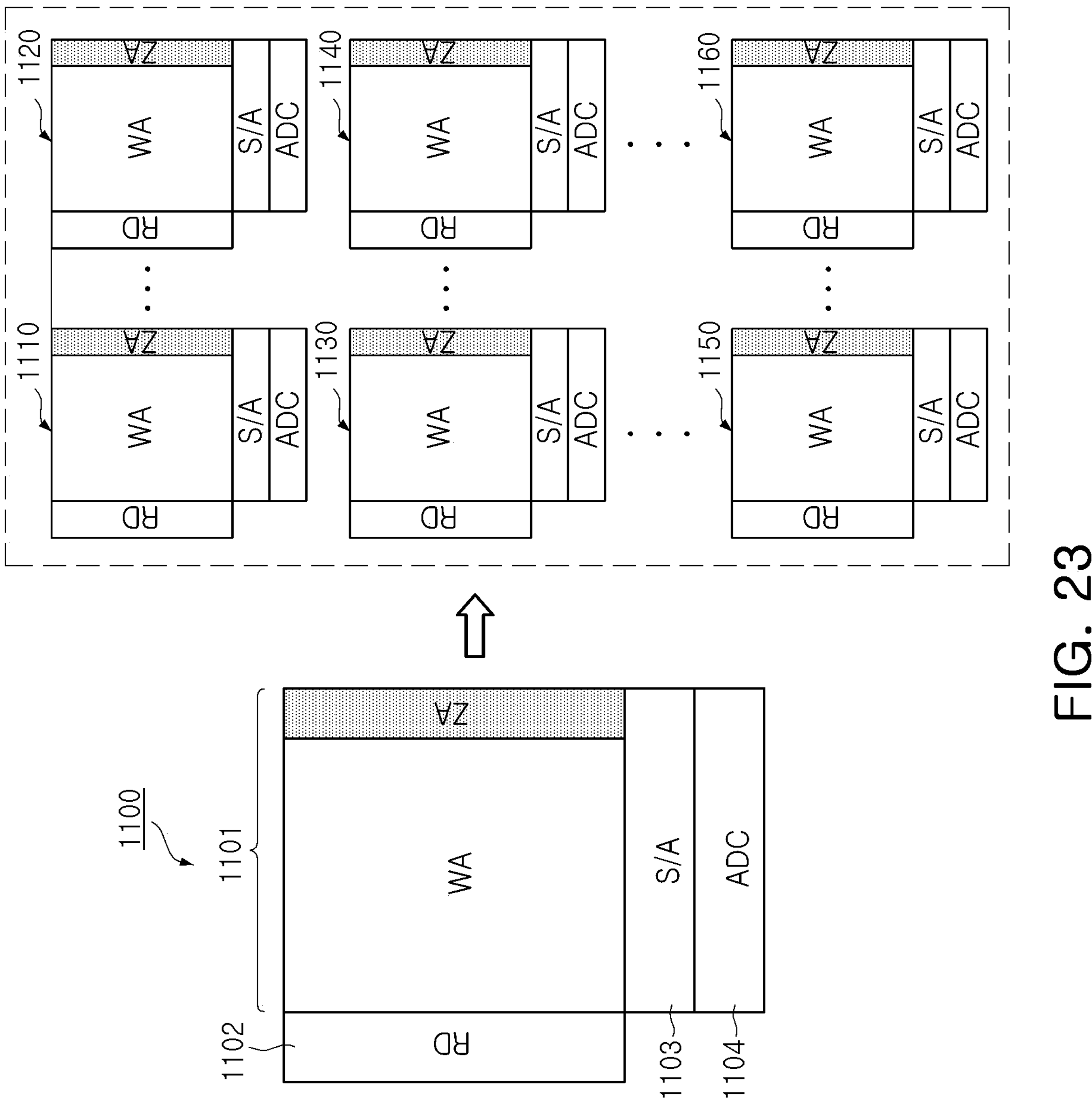
FIGS. 23 and 24 are diagrams illustrating neuromorphic devices according to some example embodiments of the present disclosure.
Figure 24:
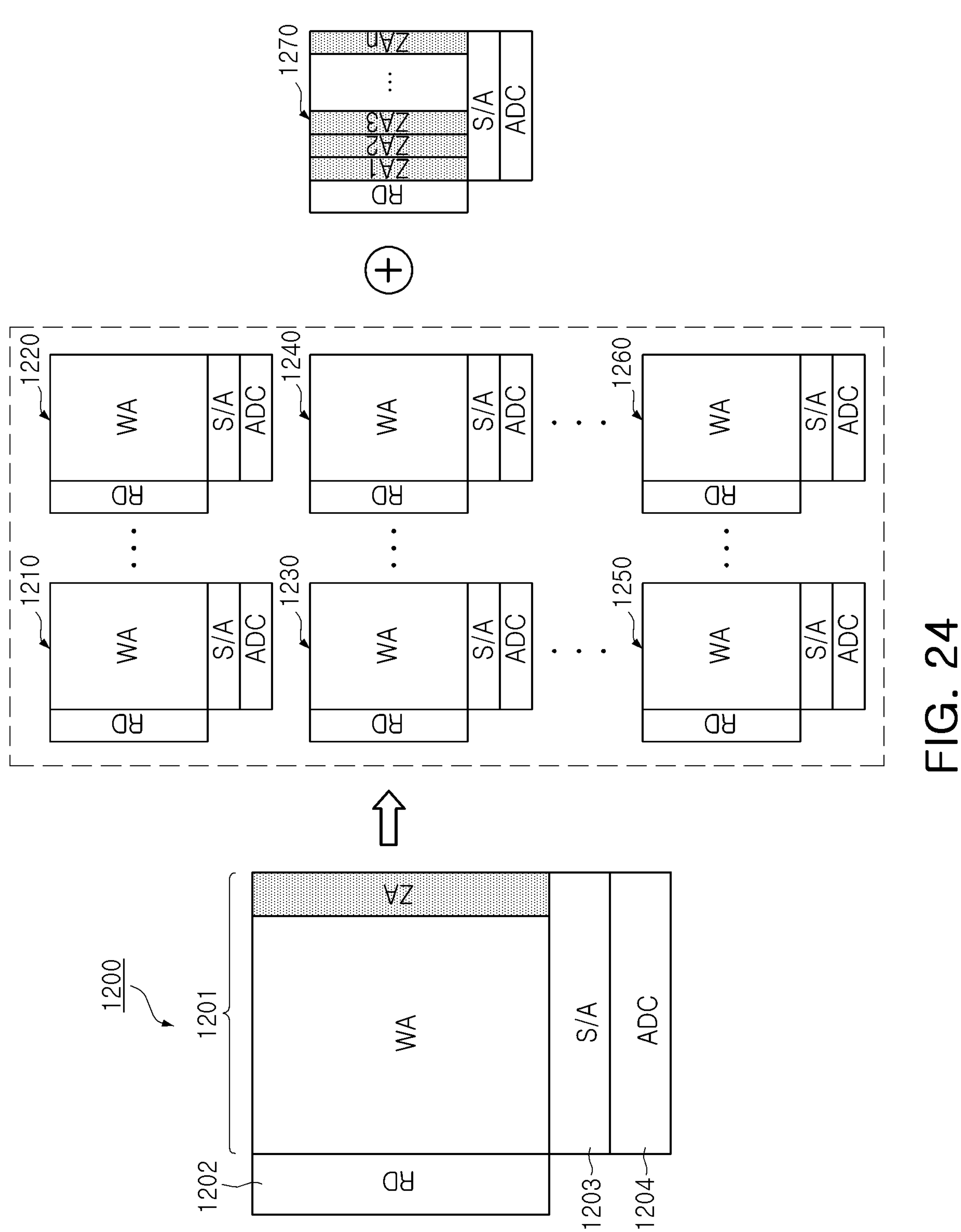

FIGS. 23 and 24 are diagrams illustrating a neuromorphic device according to some example embodiments.

Referring to FIG. 23, to implement one of the layers of the neural network, a single tile 1100 included in the neuromorphic device may include a cell array 1101, a row driver 1102, a sense amplifier circuit 1103, and an analog-to-digital converter circuit 1104. The tile 1100 may obtain zero point weights and quantized weights by quantizing real weights included in the single layer. The zero point weight may be stored in zero point cells disposed in the zero point area ZA of the cell array 1101, and the quantized weights may be stored in memory cells disposed in the weight area WA of the cell array 1101.

However, it may be difficult to implement a layer with the single tile 1101 depending on the number of nodes included in each of the layers in the neural network. Accordingly, as illustrated in FIG. 23, the tile 1101 for implementing the layer may be divided into a plurality of tiles 1110-1160. For example, when the tile 1101 includes 496 row lines and 128 column lines, the tile 1101 may be divided into tiles 1110-1160 each having 31 row lines and 32 column lines. In this case, the number of tiles 1110-1160 may be 64.

In each of the plurality of tiles 1110-1160 in which weights included in a single layer are stored, the cell array may include a weight area WA and a zero point area ZA. Since the plurality of tiles 1110-1160 store real weights included in single layer in a divided manner, the weight area WA may store different data. Since only a single zero point weight is generated by quantizing real weights included in a single layer, the zero point area ZA of each of the plurality of tiles 1110-1160 may include the same data.

The number of zero point cells included in the zero point area ZA in each of the plurality of tiles 1110-1160 may be smaller than the number of weight cells included in the weight area WA. For example, when the zero point weight is 3-bit data, the zero point area ZA in each of the plurality of tiles 1110-1160 may include first to third zero point column lines. Also, the zero point cells connected to the first zero point column line may store the same data, the zero point cells connected to the second zero point column line may also store the same data, and the zero point cells connected to the third zero point column line may also store the same data.

In the example illustrated in FIG. 23, since the zero point area ZA storing a single zero point weight as data is included in each of the plurality of tiles 1110-1160, integration density of the neuromorphic device may be lowered. Accordingly, in some example embodiments, the zero point weight stored in the zero point area ZA of each of the plurality of tiles 1110-1160 may be stored in a different tile. Hereinafter, it will be described in greater detail with reference to FIG. 24.

Referring to FIG. 24, to implement one of the layers of the neural network, a single tile 1200 included in the neuromorphic device may include a cell array 1201, a row driver 1202, a sense amplifier circuit 1203, and an analog-to-digital converter circuit 1204. As described with reference to FIG. 23, zero point weights and quantized weights may be generated by quantizing real weights included in a single layer, and the zero point weights may be stored in the zero point area ZA of the cell array 1201 and quantized weights may be stored in the weight area WA of the cell array 1201.

The tile 1200 in which weights included in a single layer are stored may be divided into a plurality of tiles 1210-1270. In some example embodiments, the quantized weights stored in the weight area WA may be stored in the plurality of weight tiles 1210-1260 in a distributed manner, and the zero point weights stored in the zero point area ZA may be stored in one of the zero point areas ZA1-ZAn included in the zero point tile 1270.

For example, when the cell array 1201 includes 496 row lines and 128 column lines, data may be stored in the weight tiles 1210-1260 each having 31 row lines and 32 column lines and in the single zero point tile 1270. Accordingly, in the example illustrated in FIG. 24, the number of tiles 1210-1270 used to implement a single layer may be greater than in the example illustrated in FIG. 23.

However, differently from the example illustrated in FIG. 23, in the example illustrated in FIG. 24, the zero point weight may be stored in one of the zero point areas ZA1-ZAn of the separately implemented zero point tile 1270. The result of the multiplication and accumulation computation performed in a single layer may correspond to the result of weight computation obtained by quantizing the input values and inputting the values to the plurality of weight tiles 1210-1260 and the result of zero point computation obtained by quantizing the input values and inputting the values to one of the zero point areas ZA1-ZAn.

Accordingly, since the multiplication and accumulation computations of the zero point weight of a single layer and the quantized input values may be executed once in the example illustrated in FIG. 24, the power consumption of the neuromorphic device 1200 may be reduced. Also, differently from the example in FIG. 23 in which an entirety of the plurality of tiles 1110-1160 have the zero point area ZA, the zero point areas ZA1-ZAn may be collected in a different zero point tile 1270, such that integration density of the neuromorphic device 1200 may also improve.

Figure 25:
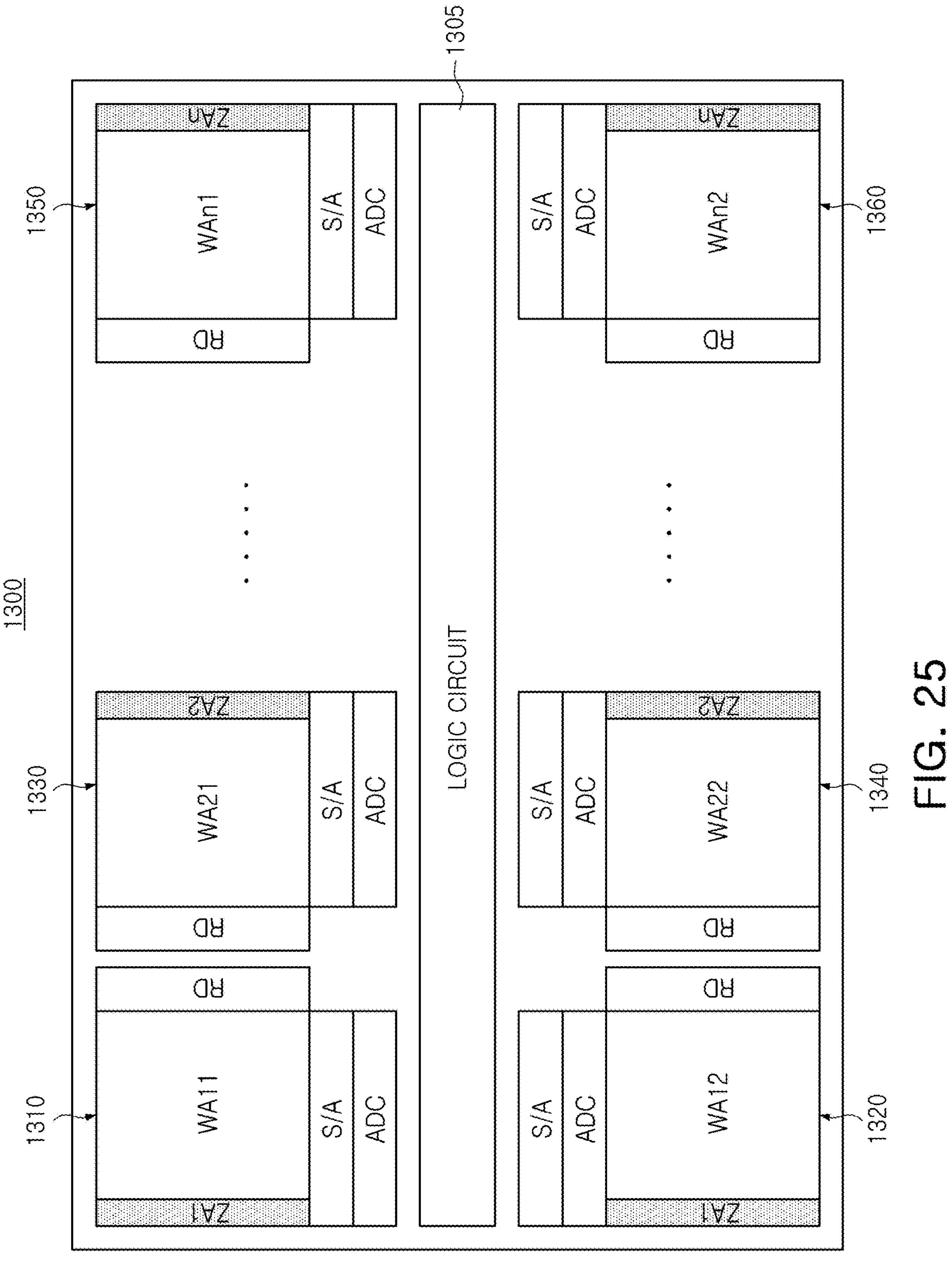
FIGS. 25 and 26 are diagrams illustrating neuromorphic device according to some example embodiments of the present disclosure.
Figure 26:
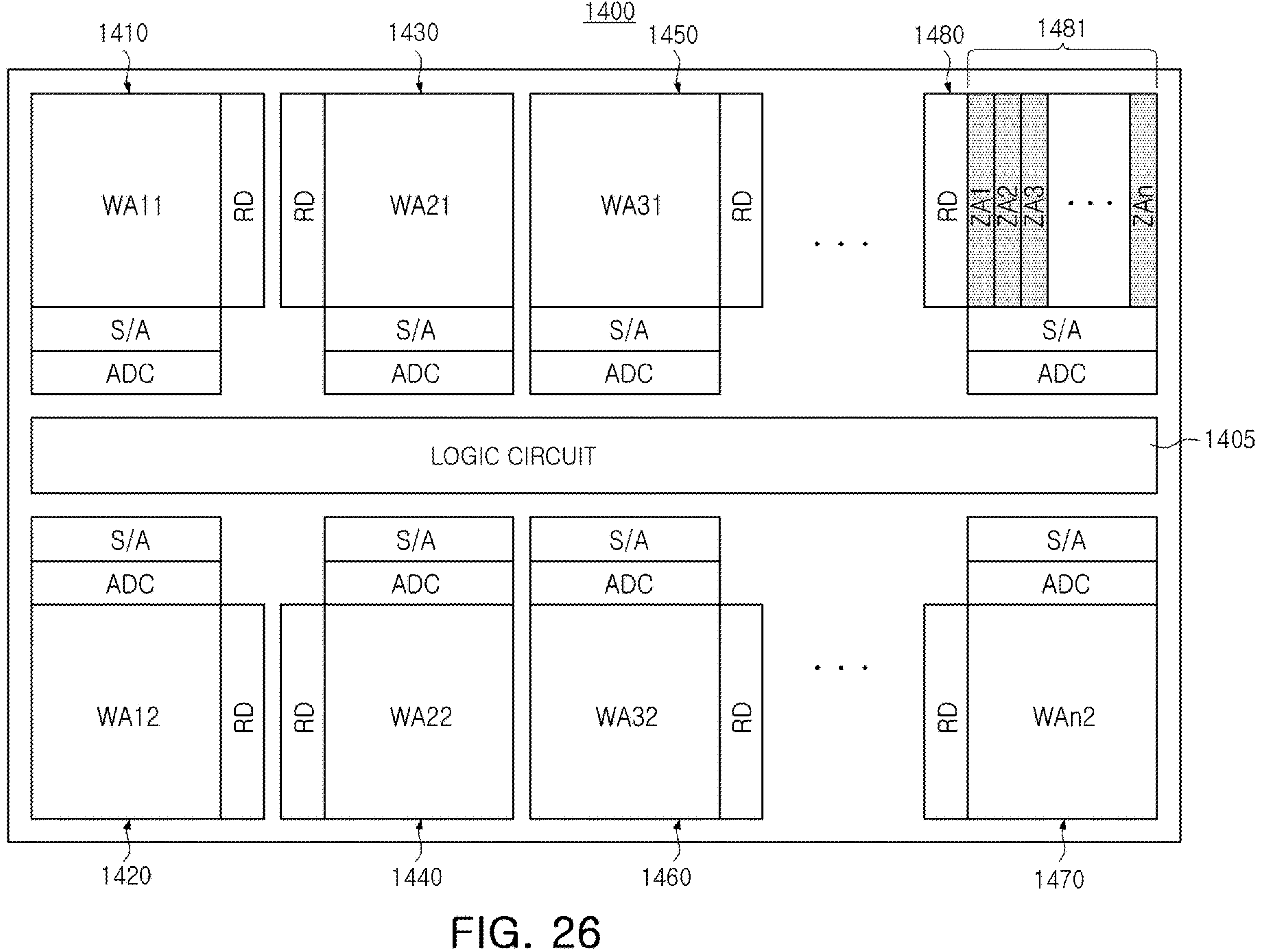

FIGS. 25 and 26 are diagrams illustrating a neuromorphic device according to some example embodiments.

In some example embodiments, a neuromorphic device 1300 may include a logic circuit 1305 and a plurality of tiles 1310-1360. The logic circuit 1305 may include a circuit for writing data to and reading data from the plurality of tiles 1310-1360, an input/output interface circuit connected to an external device, and a power circuit. For example, the logic circuit 1305 may perform multiplication and accumulation computations using the plurality of banks 1310-1360.

Each of the plurality of banks 1310-1360 may include a cell array in which a plurality of memory cells is disposed, a row driver RD, a sense amplifier circuit S/A, and an analog-to-digital converter (ADC) circuit ADC, and the cell array may include a weight area in which weight cells among the memory cells are disposed and a zero point area in which zero point cells among the memory cells are disposed. As described above, quantized weights obtained by quantizing weights included in one of the layers of the neural network may be stored in the weight cells. Also, the zero point weights obtained by quantizing the weights may be stored in the zero point cells.

In some example embodiment, real weights included in each of the layers of the neural network may be stored in two of the tiles 1310-1360 in a distributed manner. For example, real weights included in the first hidden layer among the layers of the neural network may be quantized and may be stored in the first tile 1310 and the second tile 1320 in a distributed manner. Also, real weights included in the second hidden layer may be quantized and may be stored in the third tile 1330 and the fourth tile 1340 in a distributed manner.

A zero point weight generated in the process of quantizing real weights included in each of the layers of the neural network may have a single value in a single layer. For example, the real weights included in a single layer may have the same zero point weight after quantization. Accordingly, the first zero point area ZA1 of the first tile 1310 and the second tile 1320 may store the same data, and the second zero point area ZA2 of the third tile 1330 and the fourth tile 1340 may also store the same data. Accordingly, since the zero point areas ZA1-ZAn storing the same data are repeatedly arranged, integration density of the neuromorphic apparatus 1300 may be reduced.

In some example embodiments, the above issue may be addressed by collecting zero point areas and arranging the areas on a single zero point tile. For example, referring to FIG. 26, zero point weights generated in the process of quantizing real weights of respective layers of the neural network may be stored in a zero point tile 1480. The zero point tile 1480 may include a zero point array 1481 including zero point cells in which zero point weights are stored.

The quantized weights generated by quantizing the real weights of each of the layers of the neural network may be stored in the weight tiles 1410-1470 in a distributed manner for each layer. Similarly to the example described above with reference to FIG. 25, quantized weights generated from real weights included in a single layer may be stored in two of the weight tiles 1410-1470.

As for the examples in FIGS. 25 and 26, a single first zero point area ZA1 in which zero point weights obtained by quantizing real weights included in the first hidden layer are stored may be present in the example in FIG. 26, differently from FIG. 25. Since zero point weights corresponding to real weights of the neural network are stored in the zero point tile 1480, the neuromorphic device 1400 according to the example illustrated in FIG. 26 may have integration density higher than that of the example illustrated in FIG. 25.

Also, in the neuromorphic apparatus 1400 according to some example embodiments, the amount of computation may be reduced. When multiplication and accumulation computations are performed by inputting input values to the first hidden layer, in the example embodiment illustrated in FIG. 26, the result of weight computation obtained by inputting input values to each of the first weight tile 1410 and the second weight tile 1420 and the result of zero point computation obtained by inputting input values into the first zero point area ZA1 included in the zero point array 1481 may be summed. In other words, the multiplication and accumulation computations performed by inputting the input values into the first zero point area ZA1 may only be executed once, and accordingly, the amount of computation may be reduced.

Figure 27:
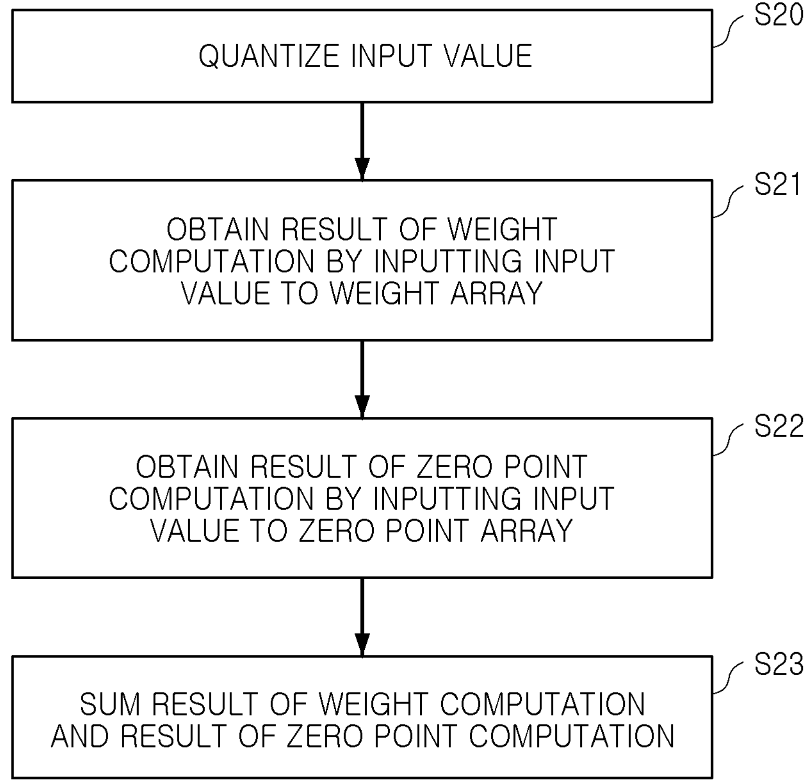
FIG. 27 is a flowchart illustrating operations of a neuromorphic device according to an example embodiment of the present disclosure.

FIG. 27 is a flowchart illustrating operations of a neuromorphic device according to some example embodiments.

Figure 28:
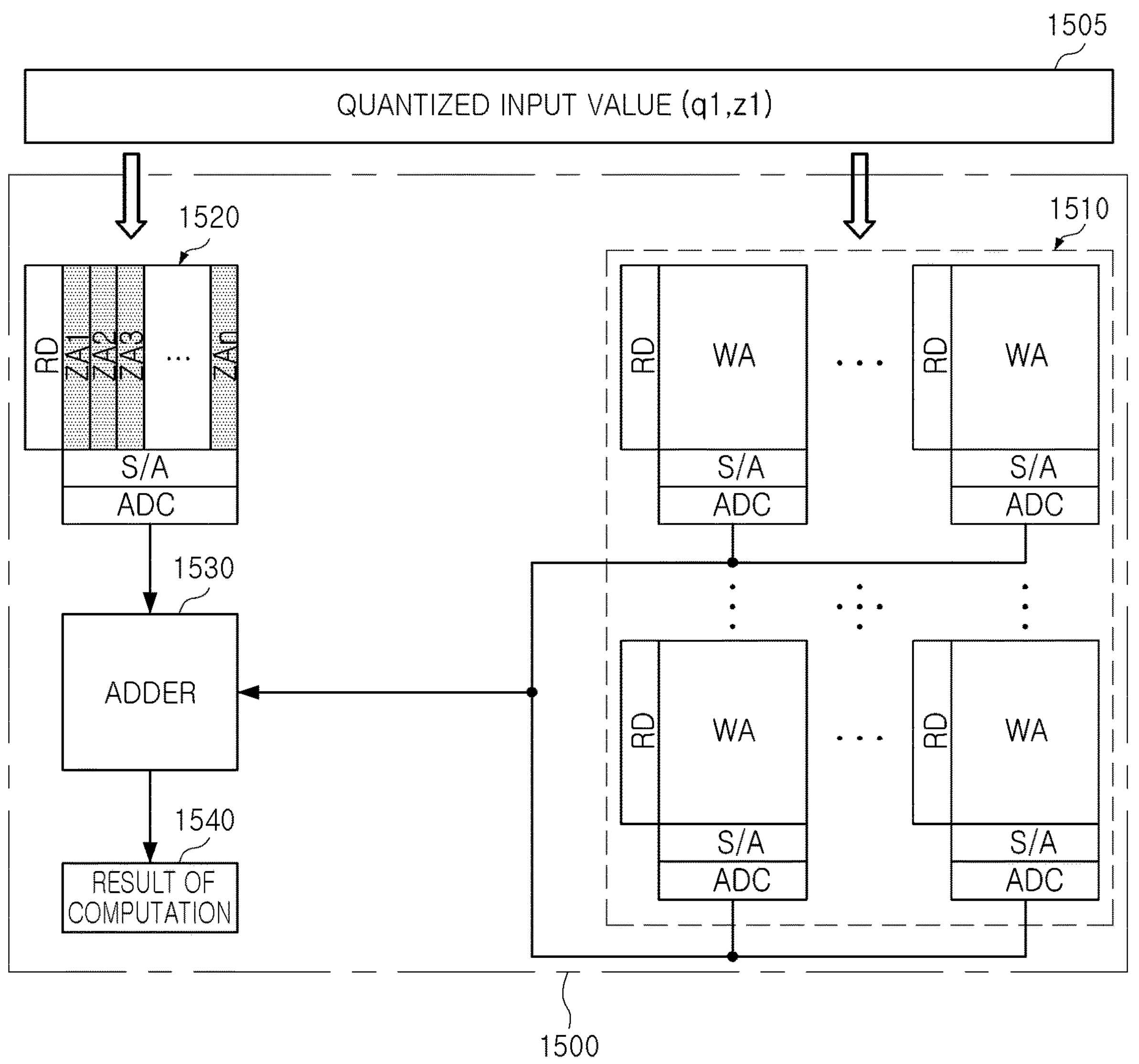
FIG. 28 is a diagram illustrating operations of a neuromorphic device according to some example embodiments of the present disclosure.

FIG. 28 is a diagram illustrating operations of a neuromorphic device according to some example embodiments.

Referring to FIGS. 27 and 28, the operation of the neuromorphic device 1500 may start by quantizing an input value (S20). For example, a quantized input value 1505 may be input to the neuromorphic device 1500. In operation S20, an actual input value represented as a floating point may be quantized, and accordingly, a quantized input value q1 and a zero point input value z1 may be generated.

Thereafter, the neuromorphic device 1500 may input the quantized input value q1 and the zero point input value z1 to at least one weight array among the weight tiles 1510 and may obtain a result of weight computation (S21). Similarly to the input values q1 and z1, real weights included in layers in the neural network may be quantized and may be stored in the neuromorphic device 1500. For example, quantized weights and zero point weights may be obtained by quantizing real weights represented in floating point numbers, and the quantized weights may be stored in a weight array of each of the weight tiles 1510, and the zero point weight may be stored in a zero point array of a different zero point tile 1520.

In some example embodiments, the quantized weights obtained by quantizing the real weights included in one of the layers of the neural network implemented by the neuromorphic device 1500 may be stored in a plurality of weight tiles 1510 in a distributed manner Each of the plurality of weight tiles 1510 may include a weight area WA in which weight cells for storing weights are disposed, a row driver RD, a sense amplifier circuit S/A, and an analog-to-digital converter (ADC) circuit ADC. The zero point weight obtained by quantizing the real weights included in the layer may be stored in the zero point tile 1520. For example, when the single layer is the first hidden layer, the zero point weight may be stored in the first zero point area ZA1.

When the quantized weights are defined as q2 and the zero point weight is defined as z2, the result of weight computations output by the plurality of weight tiles 1511-1514 may include a result (q1*q2) of multiplication of the quantized input values q1 and the quantized weights q2 and a result (q2*z1) of multiplication of the zero point input value z1 and the quantized weights q2 as described with reference to Equation 5.

The neuromorphic apparatus 1500 may obtain a result of zero point computation by inputting the quantized input values q1 and the zero point input value z1 to the zero point tile 1520 (S22). The zero point weight z2 may be stored in one of the zero point areas ZA1-ZAn included in the zero point tile 1520. The neuromorphic device 900 may input the quantized input values q1 and the zero point input value z1 to the zero point tile 1520 via the row driver RD, and the result of zero point computation may be read via column lines connected to a single area among the zero point areas ZA1-ZAn T in which the zero point weight z2 is stored.

As described with reference to Equation 5, the result of zero point computation may include a result (q1*z2) of multiplication of the quantized input values q1 and the zero point weight z2, and a result (z1*z2) of multiplication of the zero point input value z1 and the zero point weight z2. For example, operations S21 and S22 may be simultaneously executed.

The neuromorphic apparatus 1500 may obtain a result of computation 1540 including output values of the single layer included in the neural network by summing the result of weight computation and the result of zero point computation (S23). Referring to FIG. 28, the result of weight computation output by at least one of the weight tiles 1510 and the result of zero point computation output by the zero point tile 1520 may be summed by a summer 1530. Since both the input values q1 and z1 and the weights q2 and z2 are represented as X-bit data, the summer 1530 may preferentially perform a multiplication of a multiplier of 2 before summing the result of weight computation and the result of zero point computation.

Figure 29:
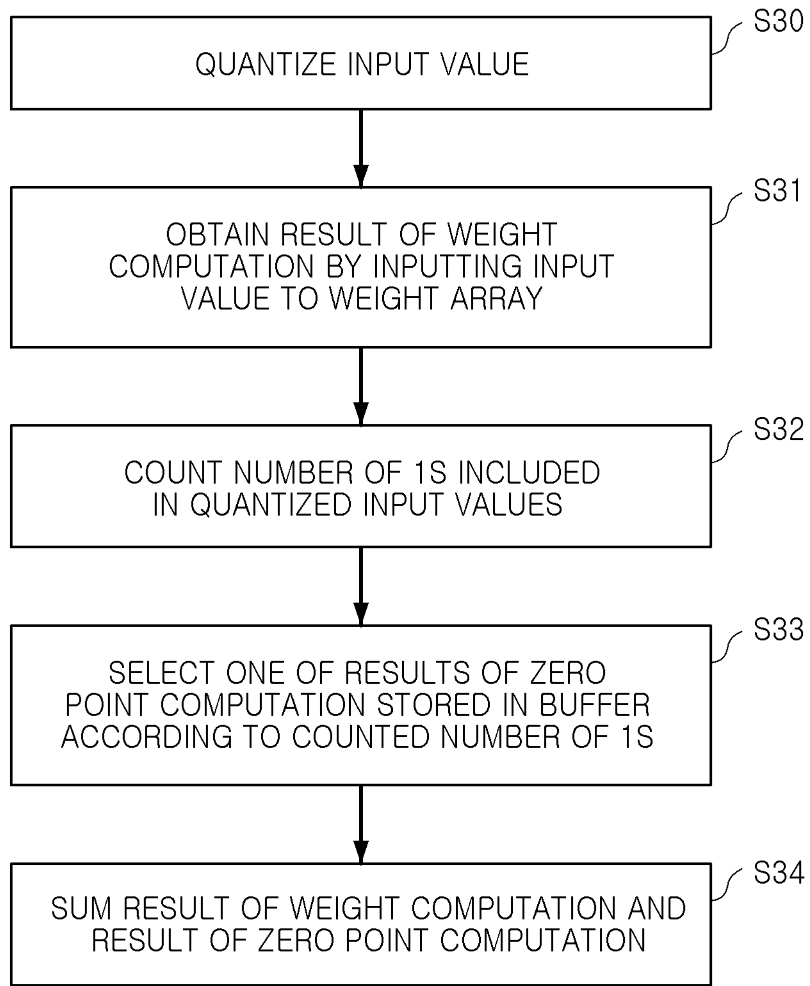
FIG. 29 is a flowchart illustrating operations of a neuromorphic device according to some example embodiments of the present disclosure.
Figure 30:
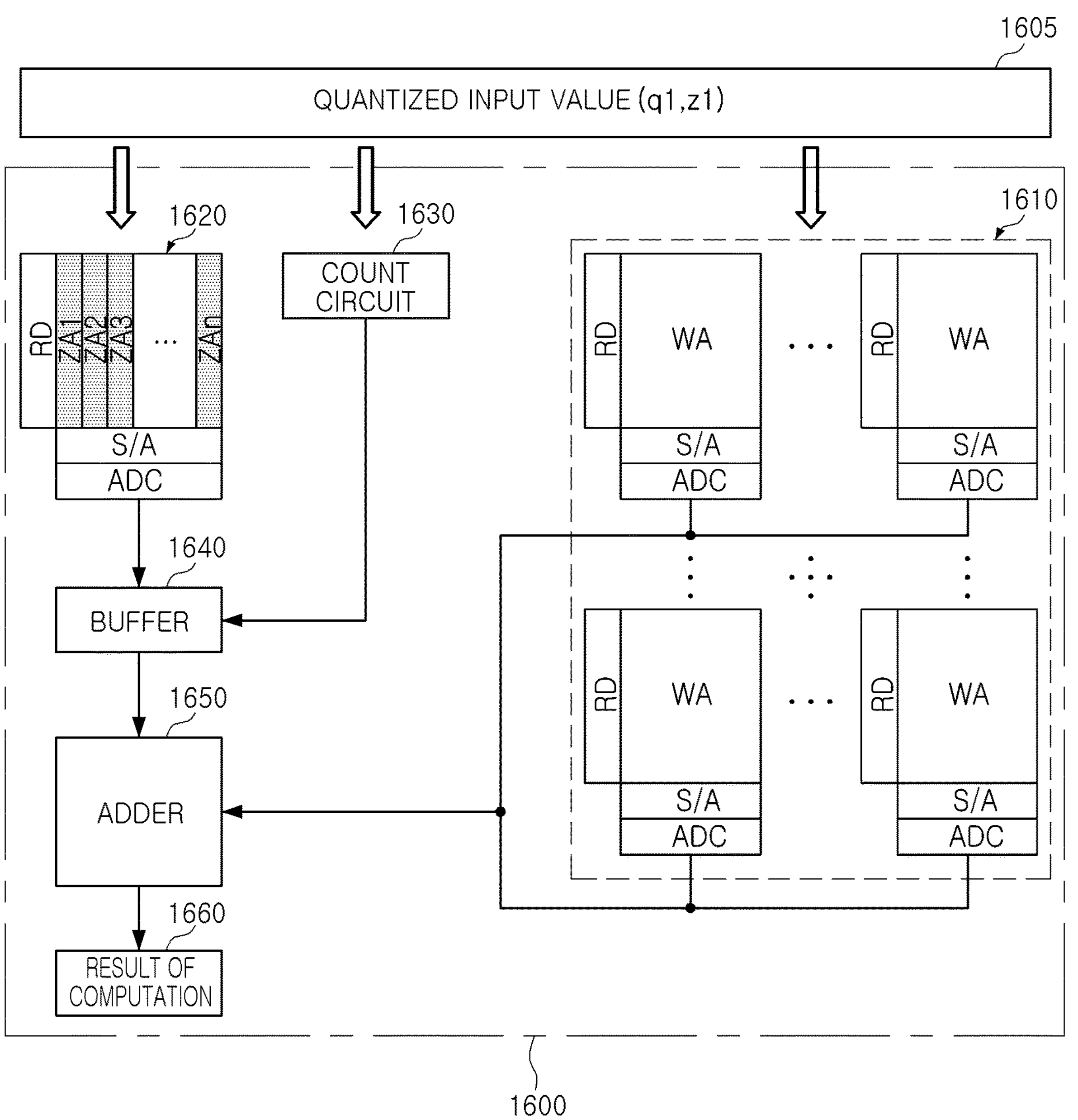
FIG. 30 is a diagram illustrating operations of a neuromorphic device according to some example embodiments of the present disclosure.

FIG. 29 is a flowchart illustrating operations of a neuromorphic device according to some example embodiments. FIG. 30 is a diagram illustrating operations of a neuromorphic device according to some example embodiments.

Referring to FIGS. 29 and 30, the operation of the neuromorphic device 1600 may start with quantizing input values 1605 (S30). For example, quantized input values q1 and zero point input values z1 may be obtained by quantizing the input values.

The neuromorphic apparatus 1600 may obtain a result of weight computation by inputting the input values q1 and z1 into at least one weight array among weight tiles 1610 (S31). The weight tiles 1610 may store quantized weights q2 obtained by quantizing weights included in one of the layers of the neural network. For example, the result of weight computation may include a result of multiplication (q1*q2) of the quantized input values q1 and the quantized weights q2, and a result (q2*z1) of multiplication of the zero point input value z1 and the quantized weights q2.

In some example embodiments, the neuromorphic device 1600 may store the zero point weight z2 obtained by quantizing the weights included in the single layer in one of the zero point areas ZA1-ZAn of the zero point tile 1020. However, instead of obtaining a result of zero point computation by directly inputting the input values q1 and z1 to the zero point tile 1620, the neuromorphic device 1600 may count the number of 1s included in the input values q1 and z1 (S32), and may select one of the results of zero point computation pre-stored in the buffer 1640 according to the count value (S33).

As described above, the zero point weight z2 generated by quantizing the weights included in single layer may have a single value. Accordingly, the zero point cells connected to a single column line in common in the zero point tile 1620 may store the same data.

Since zero point cells connected to each of the column lines store the same data, data output by each of the column lines storing a single zero point weight z2 may be determined by the number of 1s included in the input values q1 and z1 input to the zero point cells via the row driver RD. In an example embodiment, the result of zero point computation according to the number of 1s included in the input values q1 and z1 may be stored in the buffer 1640 in advance. The buffer 1640 may classify the result of zero point computation according to the layers included in the neural network and the number of 1s included in the input values q1 and z1 and may store the result. This may be because different zero point weights may be generated when weights are quantized in each of the layers included in the neural network.

The neuromorphic device 1600 may count the number of 1s in the input values q1 and z1 using the counter circuit 1630, and may read the result of zero point computation corresponding to the input values q1 and z1 from the buffer 1640 with reference to the count value. The neuromorphic apparatus 1600 may sum the result of zero point computation read from the buffer 1640 and the result of weight computation output by at least one of the weight tiles 1610 in the summer 1650, and accordingly, the result of computation 1660 may be obtained. Similarly to the example described above, the summer 1650 may preferentially perform a computation of multiplying a multiplier of 2 before summing the result of weight computation and the result of zero point computation.

In some example embodiments, the results of zero point computation according to the number of 1s included in the input values q1 and z1 may be classified according to the layers included in the neural network and may store the results in the buffer 1640 in advance. Also, in the process of executing multiplication and accumulation computations of the neural network, the neuromorphic device 1600 may obtain the result of zero point computation by simply counting the number of 1s in the input values q1 and z1 input to the corresponding layer and reads from the buffer 1640 and reading the number of 1s. Accordingly, the computation burden and power consumption of the neuromorphic device 1600 may be reduced.

Figures 31, 32:
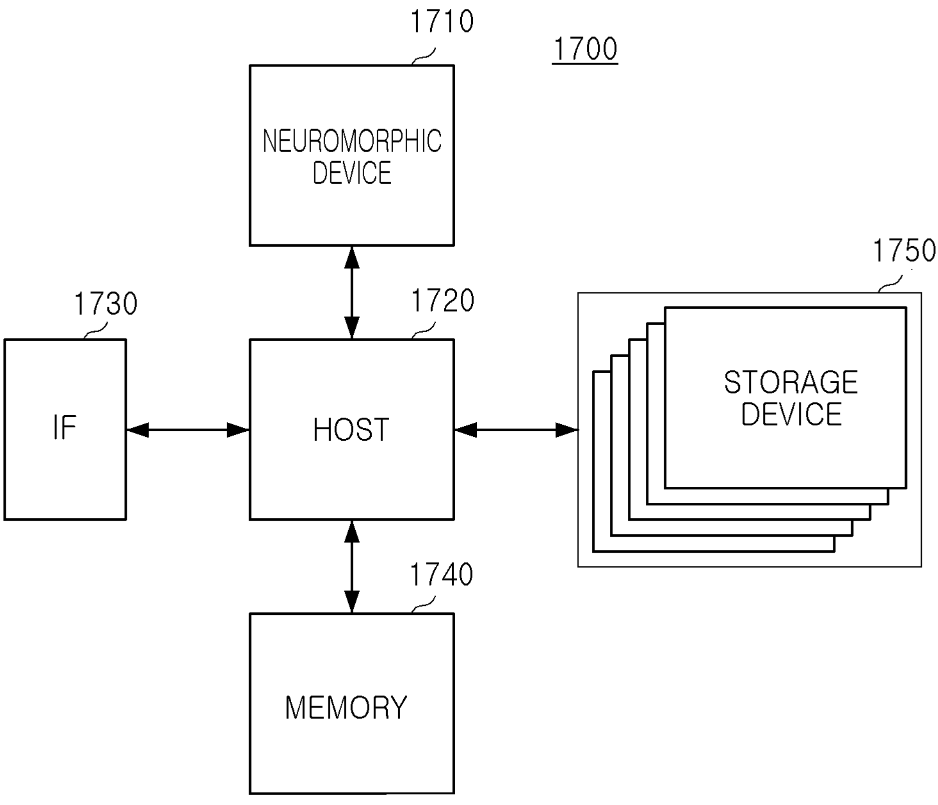
FIG. 31 is a diagram illustrating data stored in a buffer of a neuromorphic device according to some example embodiments of the present disclosure.
FIGS. 32 and 33 are block diagrams illustrating electronic devices including a neuromorphic device according to some example embodiments of the present disclosure.

FIG. 31 is a diagram illustrating data stored in a buffer of a neuromorphic device according to some example embodiments.

Referring to FIG. 31, results of zero point computations BUF1-BUF32 may be stored in the buffer of the neuromorphic device. As described above with reference to Equation 5, the results of zero point computation BUF1-BUF32 may include the result (q1*z2) of multiplication of the quantized input values q1 and the zero point weight z2, and a result (z1*z2) of multiplication of the zero point input value z1 and the zero point weight z2.

In some example embodiments, the results of zero point computation BUF1-BUF32 may be classified according to the number of 1s included in the input values In[1]-In[32] and the layers Layer1-LayerN included in the neural network and may be stored. This may be because different zero point weights may be generated in the process of quantizing the real weights of each of the layers included in the neural network, and the result of zero point computation may be determined based on the number of 1s included in the input values In[1]-In[32].

When multiplication and accumulation computations corresponding to one of the layers Layer1-LayerN included in the neural network are executed in the neuromorphic device, the neuromorphic device may count the number of 1s included in the input value In[1]-In[32]. Also, the neuromorphic apparatus may select one of the results of zero point computation BUF1-BUF32 stored in the buffer based on the count value, and may add the result of weight computation to the selected result of zero point computation. Accordingly, since a result of zero point computation may be obtained by simply executing the computation for storing the results of zero point computation BUF1-BUF32 in the buffer in advance and counting the number of 1s included in the input value In[1]-In[32] in the actual multiplication and accumulation computations using the neural network, the computation burden and power consumption of the neuromorphic device may be reduced.

Figure 33:
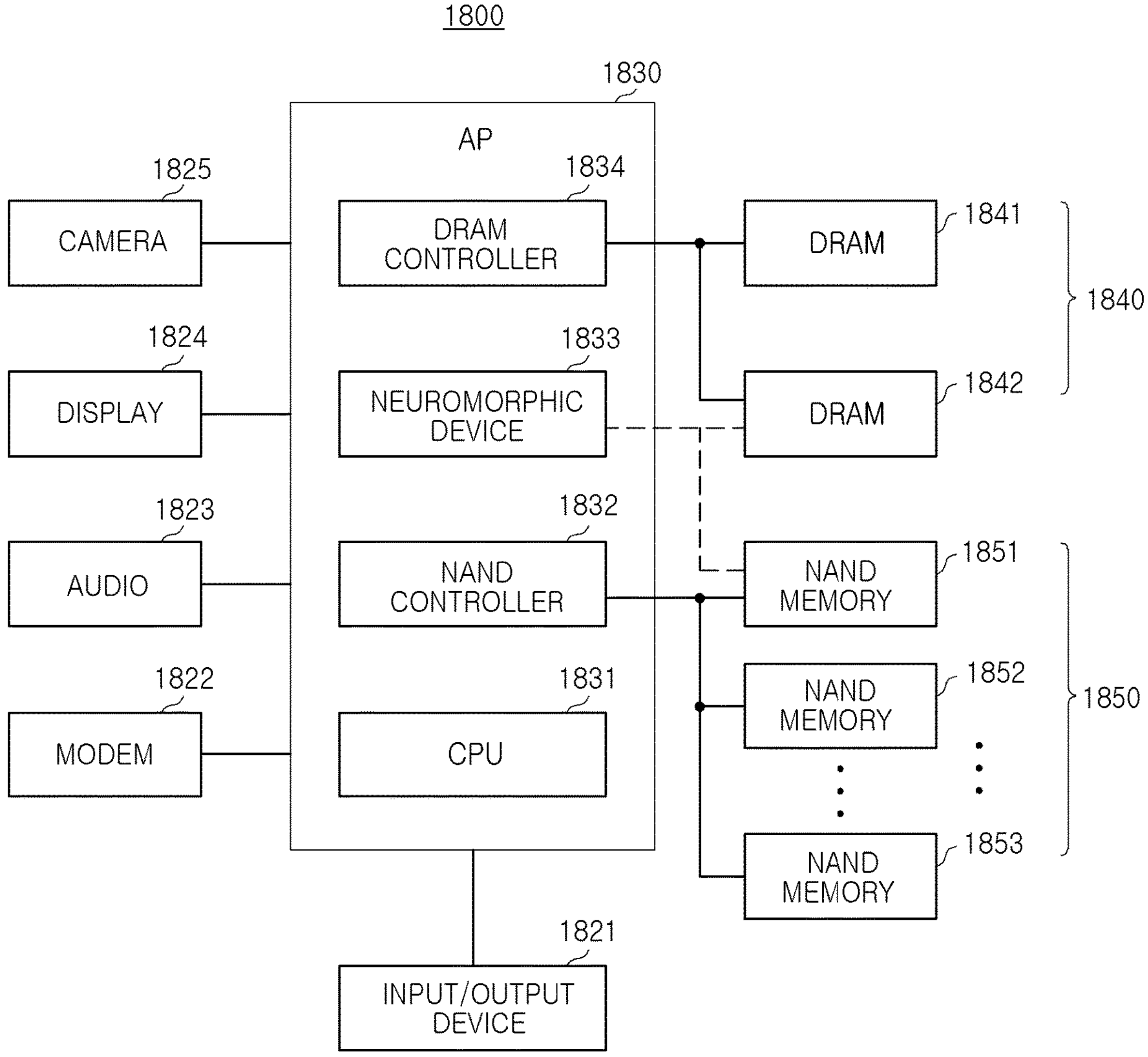

FIGS. 32 and 33 are block diagrams illustrating electronic devices including a neuromorphic device according to some example embodiments.

Referring to FIG. 32 a neuromorphic device 1710 may be included in the electronic device 1700 in a stand-alone form. The electronic device 1700 may include a host 1720, an interface 1730, a memory 1740, and/or a storage 1750 in addition to the neuromorphic device 1710. For example, the electronic device 1710 may be an application server and/or a storage server disposed in a data center, and may be connected to a network via the interface 1730.

The host 1720 may be (and/or include) at least one processor (e.g., a central processing unit (CPU)) controlling overall operation of the electronic device 1710, and/or may be implemented as at least one processor including at least one core. The host 1720 may write data in the storage 1750 including a plurality of storage devices, may read data stored in the storage 1750, and/or may delete data stored in the storage 1750. The memory 1740 may be implemented as volatile and/or non-volatile memory. For example the memory 1740 may include a dynamic random access memory, and the host 1720 may execute commands and/or data loaded to the memory 1740.

The neuromorphic device 1710 may execute a neuromorphic computation for the operation of the electronic device 1700, and may be implemented in a stand-alone form as described above. For example, in some example embodiments, the neuromorphic device 1710 is implemented separately from the host 1720, and for example, the neuromorphic device 1710 and the host 1720 may be included in the electronic device 1700 in the form of separate packages.

In some example embodiments, the host 1720 may process a portion of the neuromorphic computations of the neuromorphic device 1710, and may transfer the result of the computation processing to the neuromorphic device 1710. As an example, the neuromorphic device 1710 may execute a MAC computation corresponding to the neural network as described above, and may process the MAC computation by quantizing each of the weights and input values of one of the layers of the neural network. In some example embodiments, to reduce the computation burden of the neuromorphic device 1710, the host 1720 may process the multiplication computation of the input values and the zero point weight generated by quantizing the weights, and may transfer the result of the computation processing to the neuromorphic device 1710.

Referring next to FIG. 33, the neuromorphic device 1833 may be included in an application processor (AP) 1830 (e.g., in the form of a system-on-chip) together with a CPU 1831, a NAND controller 1832 and a DRAM controller 1834. In some example embodiments, the electronic device 1800 may be implemented as a mobile device such as a laptop computer, a mobile phone, a smartphone, a tablet personal computer, a wearable device, a healthcare device, Internet-of-Things (IoT), and/or the like.

Referring to FIG. 33, the electronic device 1800 may include an input/output device 1821, a modem 1822, an audio 1823, a display 1824, a camera 1825, an application processor 1830, and a DRAM 1841-1842 (1840), and a NAND memory 1851-1853 (1850).

The camera 1825 may obtain a still image and/or a video (e.g., according to a user control_. The electronic device 1800 may obtain and recognize specific information using still images and videos obtained by the camera 1825, may inform relevant information, may convert still images and videos into other types of data such as text, and may store the data. Alternatively, the electronic device 1800 may recognize a character string included in a still image/video obtained by the camera 1825 and may provide a text/audio translation of the text corresponding to the character string.

The display 1824 may be implemented in various forms such as a liquid crystal display (LCD), organic light emitting diodes (OLED) display, active-matrix organic light-emitting diode (AM-OLED), plasma display panel (PDP), field emission display (FED), an electronic paper, and/or the like. In some example embodiments, the display 1824 may be used as an input device of the electronic device 1800 by providing a touch screen function, and/or may be integrated with a fingerprint sensor and may provide a security function of the electronic device 1800.

The audio 1823 may process audio data stored in the electronic device 1800 and/or audio data included in the content of the network received from an external entity via the modem 1822 or the input/output device 1821, and may output the data. The audio 1823 may, for example, include a speaker and/or a microphone to receive and/or output data as audio. The modem 1822 may modulate a signal to transmit/receive wired/wireless data and may transmit the signal, and may demodulate original data from a signal received from an external entity. The input/output device 1821 may provide digital input/output, and may include a port connectable to an external recording medium, an input device such as a touch screen or a mechanical button key, and an output device outputting vibration in a haptic manner Though illustrated as separate functional blocks, the example embodiments are not so limited. For example, more or fewer functional blocks may be included, and/or some of the functional blocks may combined.

The application processor 1830 may control the overall operation of the electronic device 1800. Specifically, the application processor 1830 may control the display 1824 such that a portion of the content stored in the NAND memory 50 may be displayed on the display 1824. Also, the application processor 1830 may perform a control operation corresponding to a user input received via the input/output device 1821.

The application processor 1830 may be provided as a system-on-chip (hereinafter "SoC") for driving an application program, and an operating system (OS). Accordingly, the application processor 1830 may include the CPU 1831 executing an operation or driving an application program and/or an operating system, and various other peripheral components connected to the CPU 1831 via a system bus. The peripheral components may include a DRAM controller 1834, a neuromorphic device 1833, a NAND controller 1832, an internal memory, a power management block, an error detection block, and a monitoring block. The CPU 1831 may include one or more cores.

In some example embodiment, the neuromorphic device 1833 may include a dedicated circuit for neuromorphic computations. The neuromorphic device 1833 may be directly connected to at least one of the DRAM 1840 and/or the NAND memory 1850 and may include, for example, a computation circuit for implementing a neural network. The neuromorphic device 1833 may include an analog circuit and/or a digital circuit for AI data operation, and similarly to the example described with reference to FIG. 32, a portion of the neuromorphic computations of the neuromorphic device 1833 may be processed in the CPU 1831. Accordingly, the computation burden of the neuromorphic device 1833 and an area required to implement the neuromorphic device 1833 may be reduced.

Figure 34:
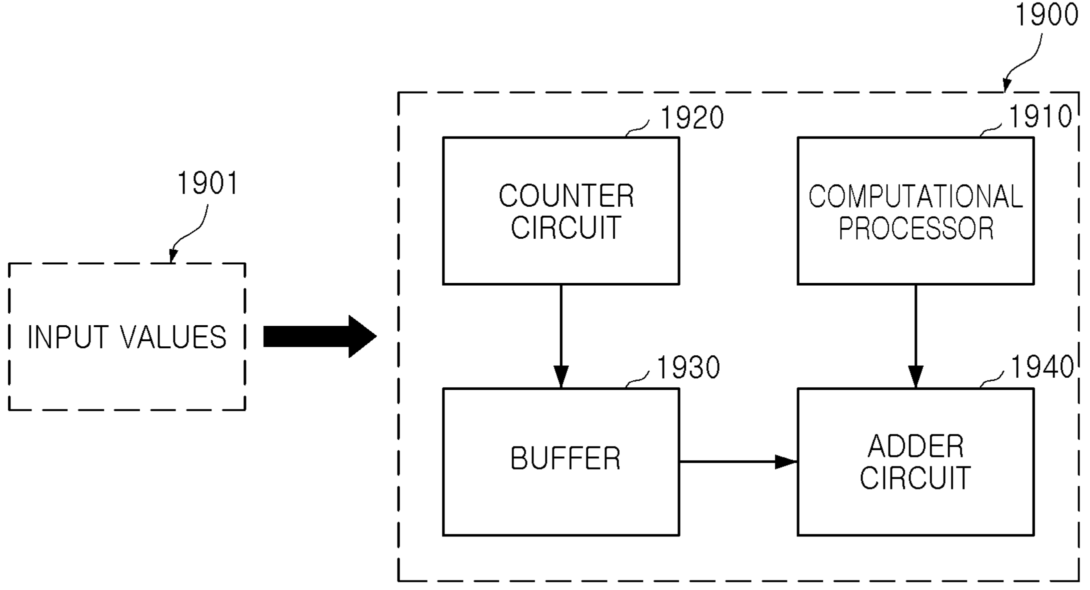
FIG. 34 is a block diagram illustrating a neuromorphic device according to some example embodiments of the present disclosure.
Figures 35A, 35B:
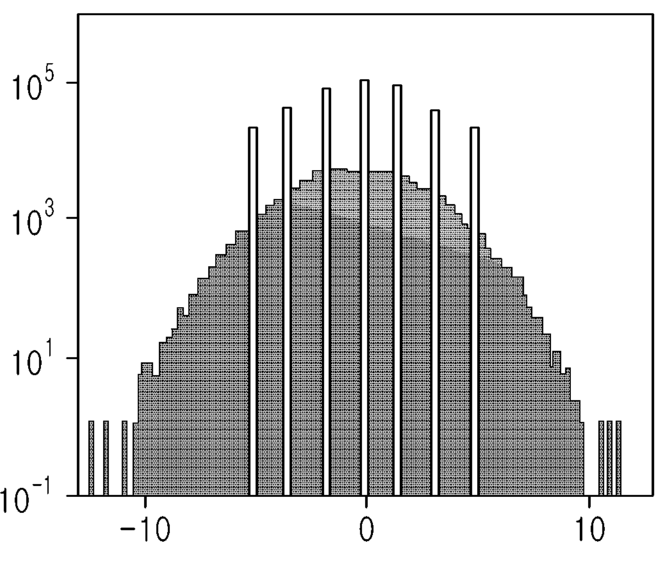
FIGS. 35A to 35D are diagrams illustrating quantization in a neuromorphic device according to some example embodiments of the present disclosure.
Figure 35C:
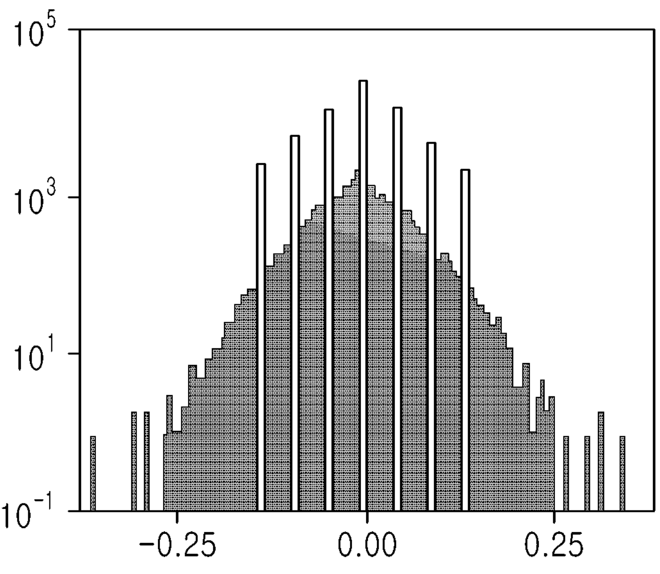
Figure 35D:
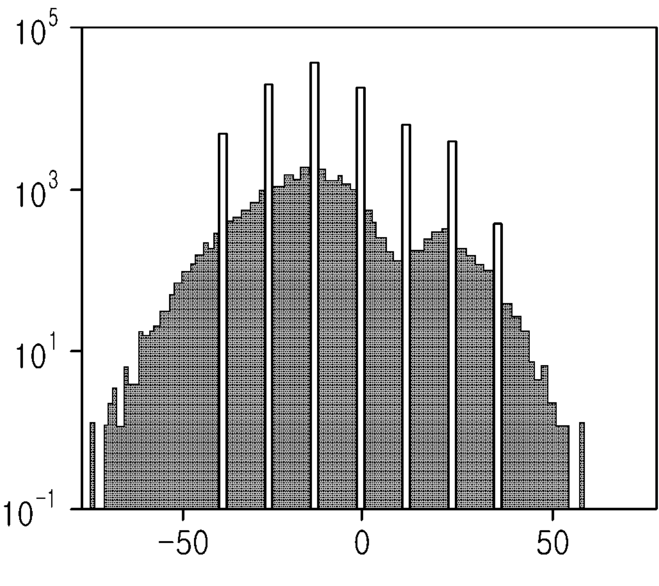

FIG. 34 is a block diagram illustrating a neuromorphic device according to some example embodiments. FIGS. 35A to 35D are diagrams illustrating quantization in a neuromorphic device according to an example embodiment.

Referring to FIG. 34, a neuromorphic device 1900 may include a computational processor 1910, a counter circuit 1920, a buffer 1930, and an adder circuit 1940. The neuromorphic device 1900 may receive input values 1901 from an external entity, and may perform a MAC computation using weights and input values 1901 included in at least one of the layers included in the neural network.

In some example embodiments, the neuromorphic apparatus 1900 may quantize each of the input values 1901 and weights and may execute a MAC computation. Hereinafter, a quantization method for an MAC computation will be described with reference to FIGS. 35A to 35D.

FIGS. 35A to 35D are diagrams illustrating examples of the distribution of real weights connecting at least a portion of the layers included in a neural network to each other and a result of quantization thereof. Real weights in each of the layers of the neural network of which training has been completed may be represented as floating point numbers and may have positive or negative signs. Quantization of the real weights may be determined according to the distribution of weights included in each of the hidden layers in the neural network of which training has been completed. For example, a reference value may be determined based on the distribution of weights in each of the hidden layers, the reference value may be determined as a zero point weight, and weights greater than the reference value and weights less than the reference value may be quantized as quantized weights. Accordingly, when quantization is completed, each value of the real weights represented as floating-point values may be represented as a quantized weight and a zero point weight. Both the quantized weight and the zero point weight may be represented in an integer form.

Similarly, the input values 1901 may also be quantized into a zero point input value corresponding to a reference value, and quantized input values. As an example, the quantization of the weights and the input values 1901 may be performed as in Equation 2 described above. For example, as illustrated in Equation 2, the actual value r of the weights may be represented as a zero point weight z, a quantized weight q, and a scale value s applied to quantization.

In each of the example illustrated in FIGS. 35A to 35D, the number of quantum states qs1 allocated to real weights greater than the zero point weight z may be equal to the number of quantum states qs2 allocated to the real weights smaller than the zero point weight z. However, according to the distribution of real weights, as illustrated in FIG. 5D, the number of real weights allocated to each of the quantum states qs1 and qs2 symmetric to each other with respect to the zero point weight z may be varied.

The quantization method for the input values 1901 may be similarly to the quantization method for the weights, and may be performed as in Equation 3 described above. For example, in a first hidden layer and a second hidden layer adjacent to each other among the plurality of layers of the neural network, input values r1 output by the first hidden layer and received by the second hidden layer, and each of the real weights r2 connecting the first hidden layer to the second hidden layer may be quantized as in Equation 3.

Multiplication and accumulation computations may be performed between layers included in the neural network. Accordingly, the output values r3 output by the second hidden nodes may be represented as in Equation 4 described above.

In the process of quantizing the real weights r2, the real weights r2 connecting a single hidden layer to another hidden layer may be quantized based on one zero point weight z2. Accordingly, the result of zero point computation may be varied only according to the number of 1s included in the input values 1901. In some example embodiments, the result of zero point computation according to the number of 1s included in the input values 1901 may be stored in the buffer 1930 in advance, and the counter circuit 1920 may count the number of is included in the input values 1901 and may select one of the values stored in the buffer, thereby swiftly calculating the result of zero point computation.

The result of zero point computation stored in the buffer 1930 may be calculated by an external device of the neuromorphic device 1900, such as, for example, a host able to communicate with the neuromorphic device 1900, rather than by the neuromorphic device 1900, and may be stored in the buffer 1930 of the neuromorphic device 1900. In other words, the MAC computation for obtaining the result of zero point computation may be performed by an external host, not by the neuromorphic device 1900. For example, the MAC computation for obtaining the result of zero point computation may be executed in a digital computation circuit of the host. Accordingly, power consumption and computation burden of the neuromorphic device 1900 may be reduced, and the area of a circuit required for the MAC computation may be reduced.

A method for the neuromorphic device 1900 to receive a result of zero point computation from an external host and to store the result in the buffer 1930 may be varied in example embodiments. As described above, the zero point result of computation may vary only depending on the number of 1s included in the input values 1901, and the number of 1s able to be included in the input values 1901 may depend on the number of bits of the input values 1901, and accordingly, the external host may generate the result of zero point computation regardless of the actual output value of each of the layers. The external host may generate the result of zero point computation in advance using the zero point weight for the real weights of each of the layers of the neural network and the number of 1s included in the input values 1901, and may store the result in an external storage of the neuromorphic device 1900 in advance. When a neural network to perform the MAC computation is determined in the neuromorphic device 1900, the external host may read out the results of zero point computation corresponding to the neural network from among the results of zero point computation stored in the storage, and may transfer the result to the neuromorphic device 1900. In this case, the buffer 130 may be implemented as a volatile memory.

Alternatively, the buffer 1930 may be implemented as a nonvolatile memory. The external host may generate a result of zero point computation in advance using the zero point weight for the real weights of each of the layers of the neural network and the number of 1s included in the input values 1901, and may store the result in the buffer 1930 in the neuromorphic device 1900. Accordingly, when the counter circuit 1920 determines the number of 1s in the input values 1901, the result of zero point computation stored in the buffer 1930 may be transmitted to the adder circuit 1940. In the above embodiment, while the neuromorphic device 1900 performs the MAC computation, the result of zero point computation may not be separately received from the external host.

The external host may obtain the result of zero point computation using the zero point weights stored in the nonvolatile memory area in the neuromorphic device 1900. For example, when the neural network is determined, the external host may receive zero point weights stored in the neuromorphic device 1900 and may generate a result of zero point computation, and may transfer the result to the neuromorphic device 1900. The result of zero point computation may be stored in the buffer 1930, and in this case, the buffer 1930 may be implemented as a volatile memory.

The external host may generate a result of zero point computation in the process of generating the neural network, and may store the result in the buffer 1930 of the neuromorphic device 1900. For example, the external host may determine the zero point weights by quantizing real weights included in the plurality of layers in the neural network of which training has been completed. Since the number of 1s included in the input values may vary depending on the number of bits of the input values, the external host may generate the result of zero point computation according to the number of 1s included in the input values and may transmit the result to the neuromorphic device 1900. The neuromorphic apparatus 1900 may read out the result of zero point computation stored in the buffer 1930 and may use the result when performing inference using the neural network. Accordingly, since the computation using the zero point weights during the inference operation based on the neural network may not be executed in the neuromorphic device 1900 and also in the external host, the computation burden and power consumption may be reduced.

Figure 36:
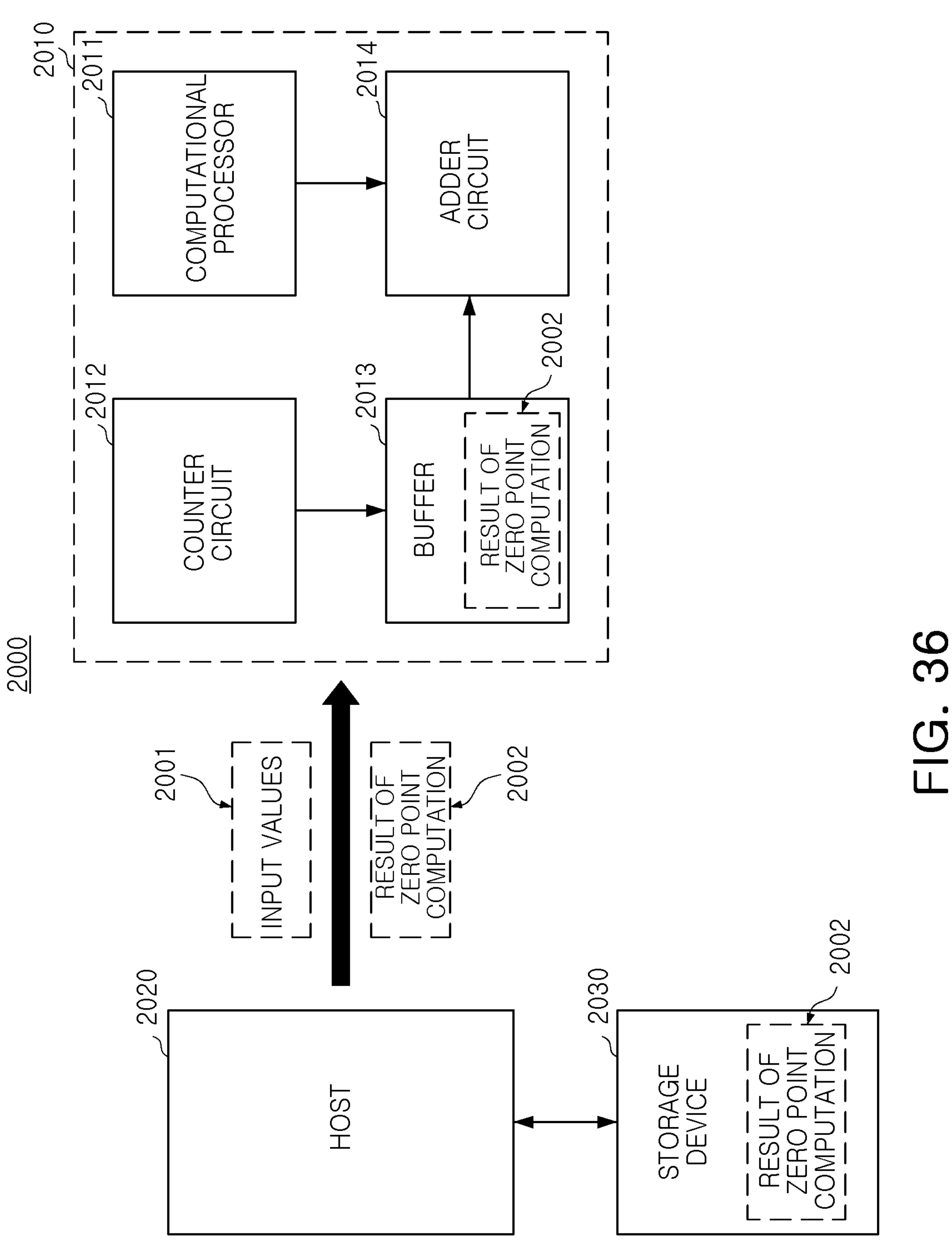
FIG. 36 is a block diagram illustrating a neuromorphic device according to some example embodiments of the present disclosure.

FIG. 36 is a block diagram illustrating a neuromorphic device according to some example embodiments.

Referring to FIG. 36, the neuromorphic device 2010 may include a computational processor 2011, a counter circuit 2012, a buffer 2013 and an adder circuit 2014, and may be mounted on the electronic device 2000 together with the external host 2020 and the storage device 2030. As described above, the neuromorphic device 2010 may be implemented as a single semiconductor package with the host 2020, and/or may be implemented as a stand-alone type neuromorphic device and may be provided as a semiconductor package separate from the host 2020.

The neuromorphic device 2010 may execute a MAC computation corresponding to the neural network. For example, the neuromorphic device 2010 may perform the MAC computation by quantizing weights corresponding to nodes connecting the layers of the neural network to each other and input values 2001 transferred between the layers.

The result 2002 of zero point computation obtained by executing the MAC computation using the zero point weight and the input values 2001 may be executed in the host 2020 instead of the neuromorphic device 2010. As described above, when the zero point weight is determined by quantizing the weights included in the neural network, the result 2002 of zero point computation may be varied only depending on the number of 1s included in the input values 2001. Since the number of 1s included in the input values 2001 depends on the number of bits of the input values 2001, the host 2020 may obtain the result 2002 of zero point computation using the zero point weight corresponding to each of the layers of the neural network in advance and may store the result in the storage device 2030.

When the MAC computation for the neural network starts in the neuromorphic device 2010, the host 2020 may read out the result 2002 of zero point computation stored in the storage device 2030 and may transmit the results to the neuromorphic device 2010 along with the input values 2001. The neuromorphic device 2010 may store the result 2002 of zero point computation in the buffer 2013, and the buffer 2013 may be implemented as a volatile memory. For example, the neuromorphic device 2010 may receive the result 2002 of zero point computation for each of the layers included in the neural network in sequence and may store the result in the buffer 2013, or may simultaneously receive the results 2002 of zero point computation for the layers included in the neural network and may store the result in the buffer 2013.

The input values 2001 received from the host 2020 may be transmitted to the computational processor 2011 and the counter circuit 2012. The computational processor 2011 may execute a MAC computation using the input values 2001 and the quantized weights. The computational processor 2011 may execute the MAC computation in an analog or digital manner. For example, the computational processor 2011 may include a cell array in which a plurality of memory cells storing quantized weights are arranged, and by inputting the input values 2001 into the cell array, the result of weight computation, which may be the result of MAC computation of the quantized weights, may be obtained.

Alternatively, the computational processor 2011 may include a computation circuit implemented with a plurality of logic gates, receiving the input values 2001 and quantized weights and outputting a result of weight computation. For example, the computational processor 2011 may receive input values 2001 necessary for generating the result of weight computation and also the quantized weights from the host 2020.

The counter circuit 2012 receiving the input values 2001 may count the number of is included in the input values 2001 and may transmit the count result to the buffer 2013. The buffer 2013 may read out the result 2002 of zero point computation corresponding to the number of 1s received from the counter circuit 2012 and may transmit the result to the adder circuit 2014. The adder circuit 2014 may sum the result 2002 of zero point computation and the result of weight computation output by the computational processor 2011 and may output a result of computation value for at least one of the layers included in the neural network.

FIG. 37 is a diagram illustrating data stored in a buffer of a neuromorphic device according to some example embodiments.

Referring to FIG. 37, a result of zero point computation may be stored in the buffer of the neuromorphic device. As described above with reference to Equation 5, the result of zero point computation may include a result of multiplication computation of quantized input values and a zero point weight, and a result of multiplication computation of a zero point input value and a zero point weight. However, as described above, the result of zero point computation may be determined according to the number of 1s included in the input values. In the example illustrated in FIG. 37, the number of 1s included in each of the input values may range from a minimum of 0 to a maximum of 32.

In some example embodiments, the results of zero point computation may be classified according to the number of 1s included in input values and layers Layer1-LayerN included in the neural network and may be stored. This may be because different zero point weights may be generated in the process of quantizing the real weights of each of the layers included in the neural network, and the result of zero point computation may be determined according to the number of 1s included in the input value.

As an example, a result of multiplying a first zero point weight L1_Z2 obtained by quantizing the weights of nodes connecting the first layer LAYER1 to the immediately preceding layer by the number of 1s of each of the input values input from the to the immediately preceding layer to the first layer LAYER1 may be stored in the buffer as a result of the zero point computation of the first layer LAYER1. Also, result of multiplying a second zero point weight L2_Z2 obtained by quantizing the weights of the nodes connecting the second layer LAYER2 to the first layer LAYER1 by the number of 1s included in each of the input values input from the first layer LAYER1 to the second layer LAYER2 may be stored in the buffer as a result of the zero point computation of the second layer LAYER2.

As such, since the result of zero point computation is determined according to the number of 1s included in each of the input values and the zero point weight, the neuromorphic device may count the number of 1s included in the input values received from an external entity, and may read the result of zero point computation from the buffer. Accordingly, the neuromorphic device may not execute the computation for obtaining the result of zero point computation for every MAC computation, and the computation burden and power consumption of the neuromorphic device may be reduced, and the circuit area of the neuromorphic device may also be reduced.

Figure 38:
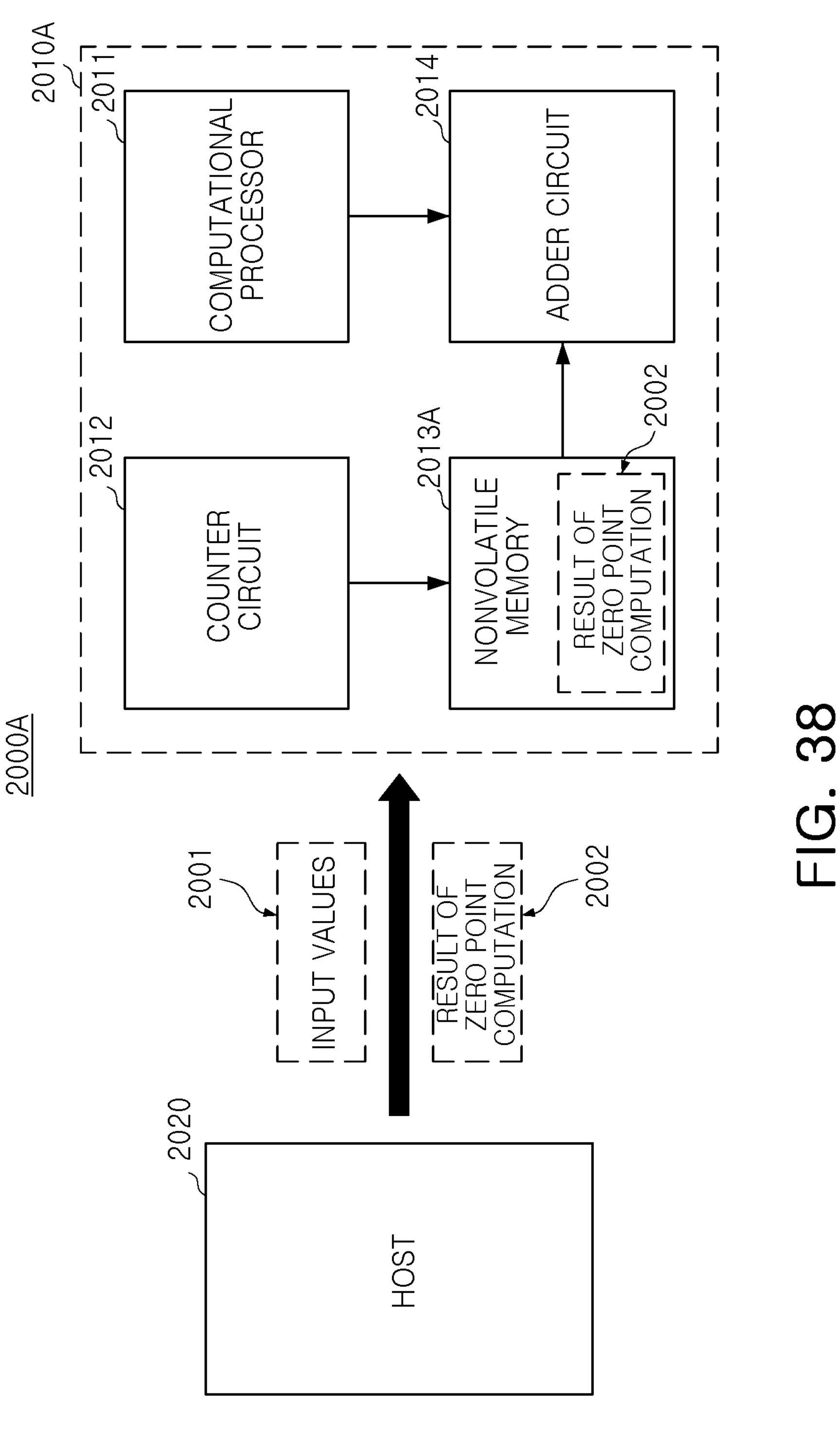
FIGS. 38 and 39 are block diagrams illustrating neuromorphic devices according to some example embodiments of the present disclosure.
Figure 39:
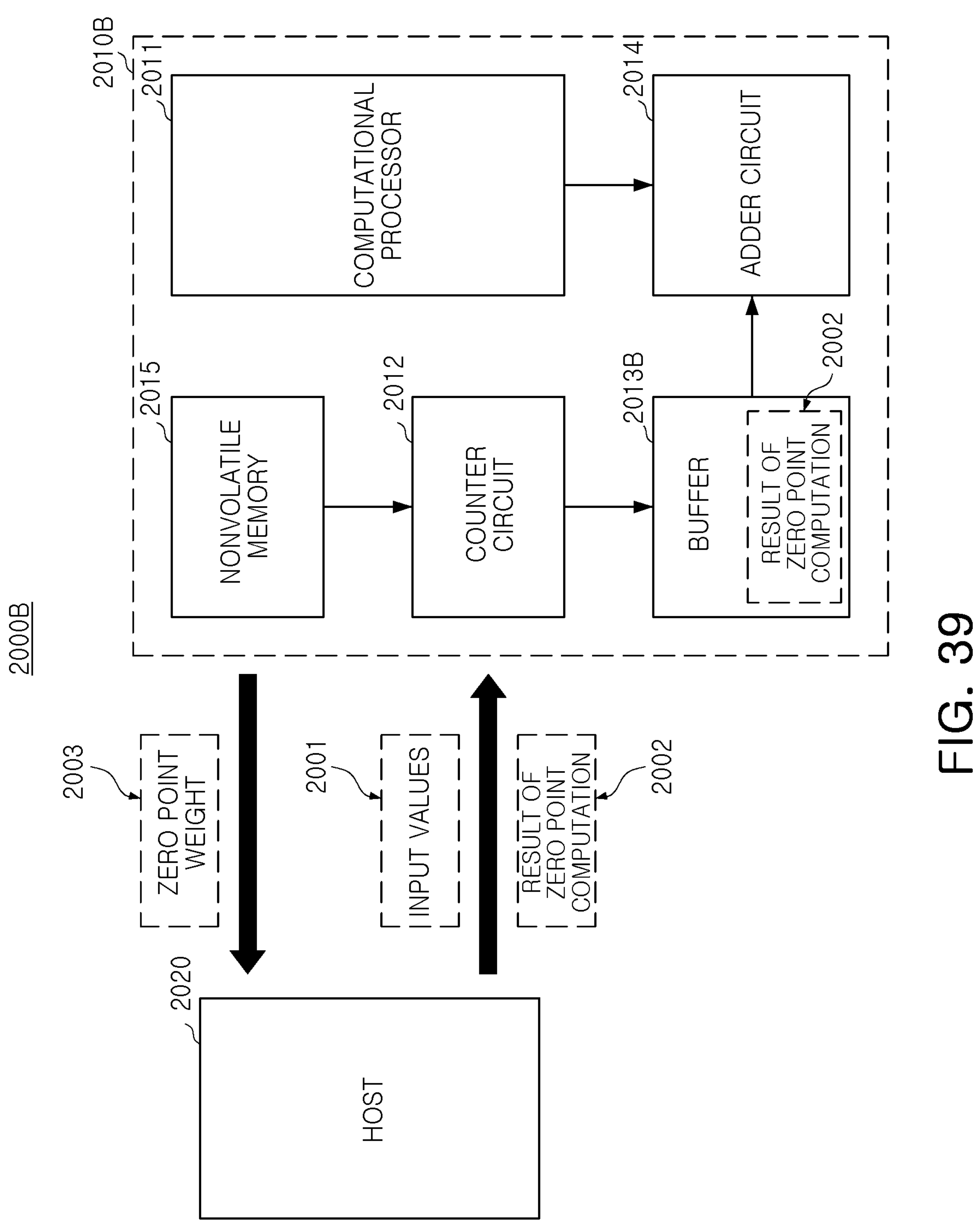

FIGS. 38 and 39 are block diagrams illustrating neuromorphic devices according to some example embodiments.

Referring first to FIG. 38, the neuromorphic device 2010A may include a computational processor 2011, a counter circuit 2012, a nonvolatile memory 2013A, and an adder circuit 2014, and may be mounted on the electronic device 2000A together with the external host 2020. The neuromorphic device 2010A may execute a MAC computation corresponding to the neural network.

The result 2002 of zero point computation obtained by executing the MAC computation using the zero point weight and the input values 2001 may be executed in the host 2020 instead of the neuromorphic device 2010. As described above, when the zero point weight is determined by quantizing the weights included in the neural network, the result 2002 of zero point computation may be varied only depending on the number of 1 s included in the input values 2001. Since the number of 1s included in the input values 2001 may depend on the number of bits of the input values 2001, the host 2020 may obtain the result 2002 of zero point computation using the zero point weight corresponding to each of the layers of the neural network in advance and may store the result in the nonvolatile memory 2013A in the neuromorphic device 2010A.

When the MAC computation for the neural network starts, the neuromorphic device 2010 may receive input values 2001 for the neural network from the host 2020. The input values 2001 may be quantized by the neuromorphic device 2010 or may be transmitted to the neuromorphic device 2010 after being quantized by the host 2020. The computational processor 2011 may perform a MAC computation of the zero point input value obtained by quantizing the input values 2001 and the quantized input values with the quantized weights and may output the result of weight computation to the adder circuit 2014. The computational processor 2011 may generate a result of weight computation using a computation circuit implemented as a cell array or a logic gate.

The counter circuit 2012 may transmit a result of counting the number of 1s included in the input values 2001 to the nonvolatile memory 2013A. The nonvolatile memory 2013A may receive the result 2002 of zero point computation from the host 2020 in advance and may store the result, and may select one of the results 2002 of zero point computation based on the count result received from the counter circuit 2012 and may output the result to the adder circuit 2014. The adder circuit 2014 may sum the result of weight computation and the result of zero point computation and may output a result value of computation for at least one of the layers included in the neural network.

Referring to FIG. 39, the neuromorphic device 2010B may include a computational processor 2011, a counter circuit 2012, a buffer 2013B, an adder circuit 2014, and a nonvolatile memory 2015, and may be mounted in the electronic device 2000B together with an external host 2020.

The neuromorphic device 2010B may execute a MAC computation corresponding to the neural network.

The result 2002 of zero point computation obtained by executing the MAC computation using the zero point weight and input values 2001 may be executed in the host 2020 instead of the neuromorphic device 2010. For example, the zero point weight 2003 generated by quantizing the weights in each of the layers included in the neural network may be stored in the nonvolatile memory 2015 in the neuromorphic device 2010. When the MAC computation for the neural network starts, the host 2010 may receive the zero point weight 2003 stored in the nonvolatile memory 2015 of the neuromorphic device 2010B. The host 2010 may generate a result of zero point computation using the zero point weight 2003 and the input values 2001, and may transmit the result to the neuromorphic device 2010B together with the input values 2001. For example, the host 2020 may generate a result of zero point computation using a zero point input value obtained by quantizing the input values 2001 and the quantized input values, and may transmit the zero point input value and the quantized input values to the neuromorphic device 2010B together with the result 2002 of zero point computation.

The neuromorphic device 2010B may store the result 2002 of zero point computation received from the host 2020 in the buffer 2013B. The computational processor 2011 may perform a MAC computation of the zero point input value obtained by quantizing the input values 2001 and the quantized input values with the quantized weights and may output the result of weight computation to the adder circuit 2014. The computational processor 2011 may generate a result of weight computation using a computation circuit implemented as a cell array or a logic gate.

The counter circuit 2012 may transmit a result of counting the number of 1s included in the input values 2001 to the buffer 213. The buffer 2013B may select one of the results 2002 of zero point computation based on the count result received from the counter circuit 2012 and may output the result to the adder circuit 2014. The adder circuit 2014 may output a result value of the MAC computation for at least one of the layers included in the neural network by summing the result of weight computation and the result of zero point computation.

Figure 40A:
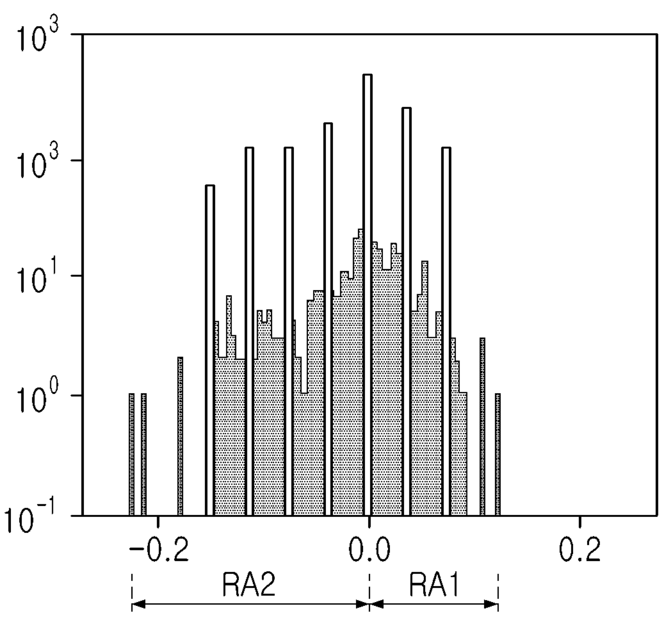
FIGS. 40A to 40C are diagrams illustrating quantization in a neuromorphic device according to some example embodiments of the present disclosure.
Figure 40B:
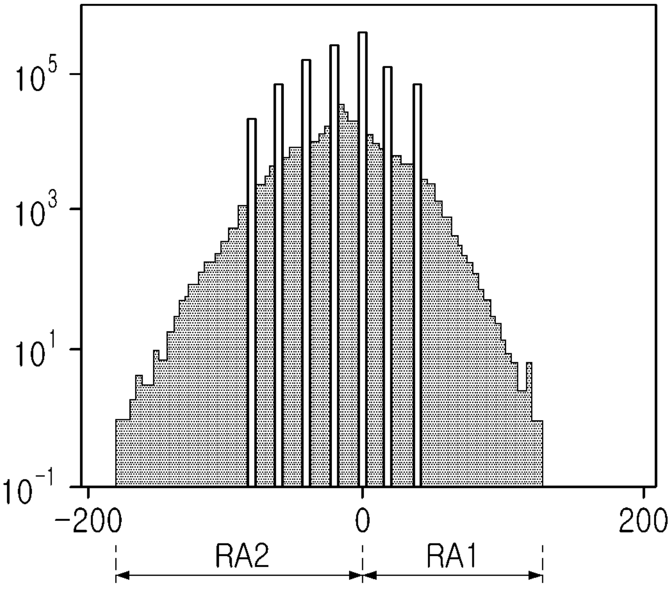
Figure 40C:
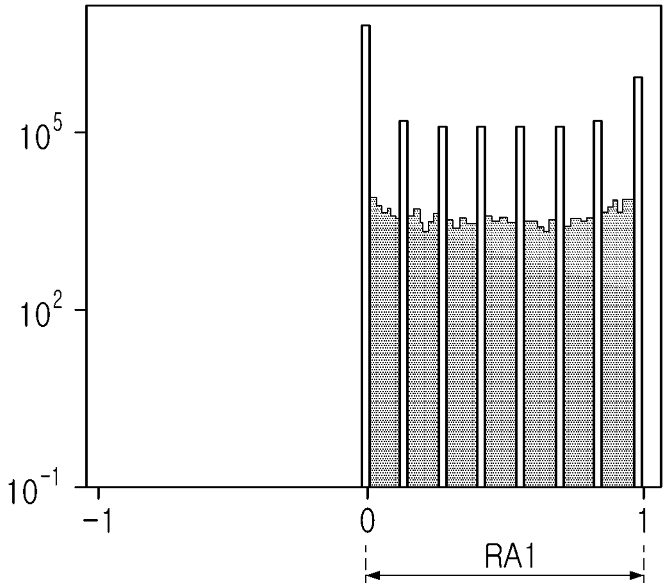

FIGS. 40A to 40C are diagrams illustrating quantization in a neuromorphic device according to some example embodiments.

Referring to FIGS. 40A to 40C are diagrams illustrating example distributions of real weights corresponding to nodes connecting layers adjacent to each other in a neural network, and quantum states allocated to quantize the real weights. Referring to FIGS. 40A to 40C, differently from the example embodiment described with reference to FIGS. 35A to 35D, the quantum states may be asymmetrically allocated around a zero point weight. When a range in which real weights equal to or greater than the zero point weight are distributed may be defined as a first range and a range in which real weights equal to or less than the zero point weight are distributed may be defined as a second range, in the examples illustrated in FIGS. 40A to 40C, real weights may be quantized differently the first range RA1 and in the second range RA2. In quantization such as the example embodiments illustrated in FIGS. 40A to 40C, quantized weights may have values represented as unsigned integers.

Referring to FIGS. 40A and 40B, three quantum states including a zero point weight may be allocated to the first range RA1, and five quantum states including a zero point weight may be allocated to the second range RA2. This may be because more real weights may be distributed in the second range RA2 than in the first range RA1. In the example illustrated in FIG. 40C, real weights may be distributed only in the first range RA1 with reference to the zero point weight. Accordingly, as illustrated in FIG. 40C, a plurality (e.g., eight) of quantum states may be allocated only to the first range RA1. As described above, by allocating different numbers of quantum states to each of the first range RA1 and the second range RA2 according to the distribution of real weights, a decrease in accuracy due to quantization of real weights may be reduced.

The quantization described with reference to FIGS. 40A to 40C may be similarly applied to quantization of input values. Also in quantizing input values, by defining each range above and below the zero point input value, which is a reference value, and allocating different numbers of quantum states according to the distribution of input values, a decrease in accuracy due to quantization may improve.

Figure 41:
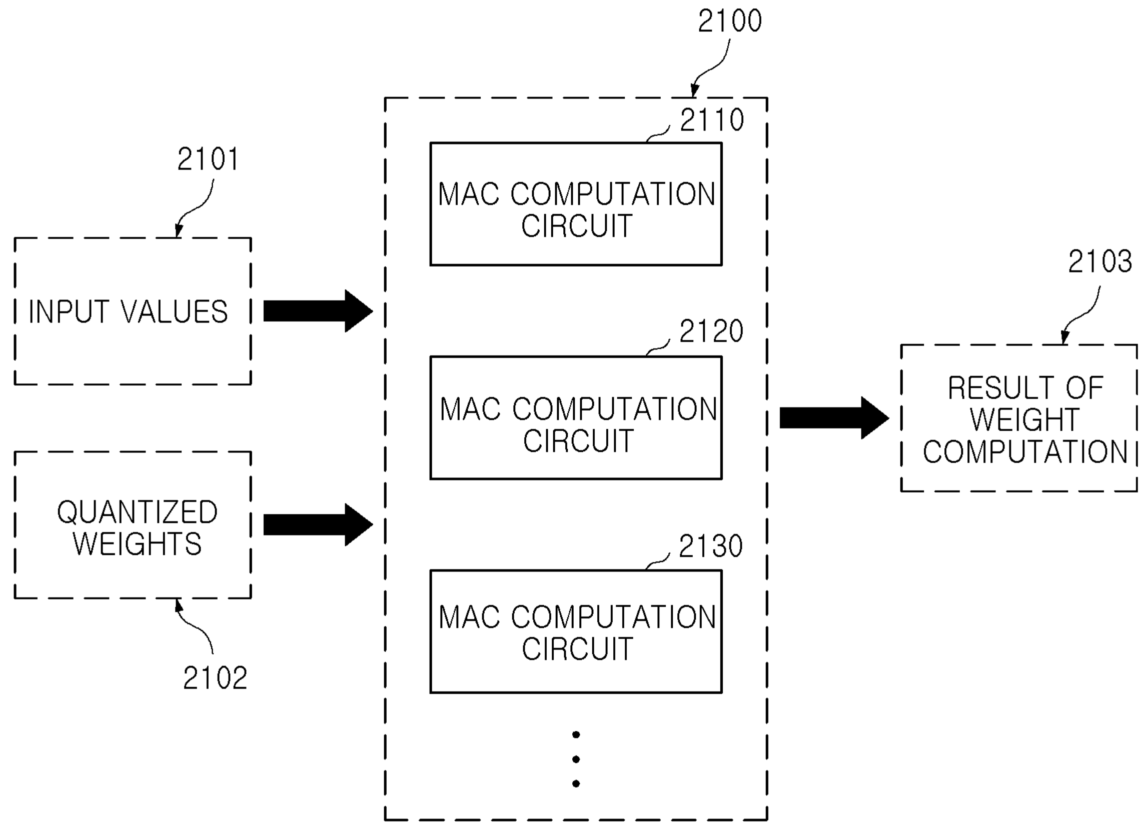
FIGS. 41 and 42 are diagrams illustrating operations of a computational processor included in a neuromorphic device according to some example embodiments of the present disclosure.
Figure 42:
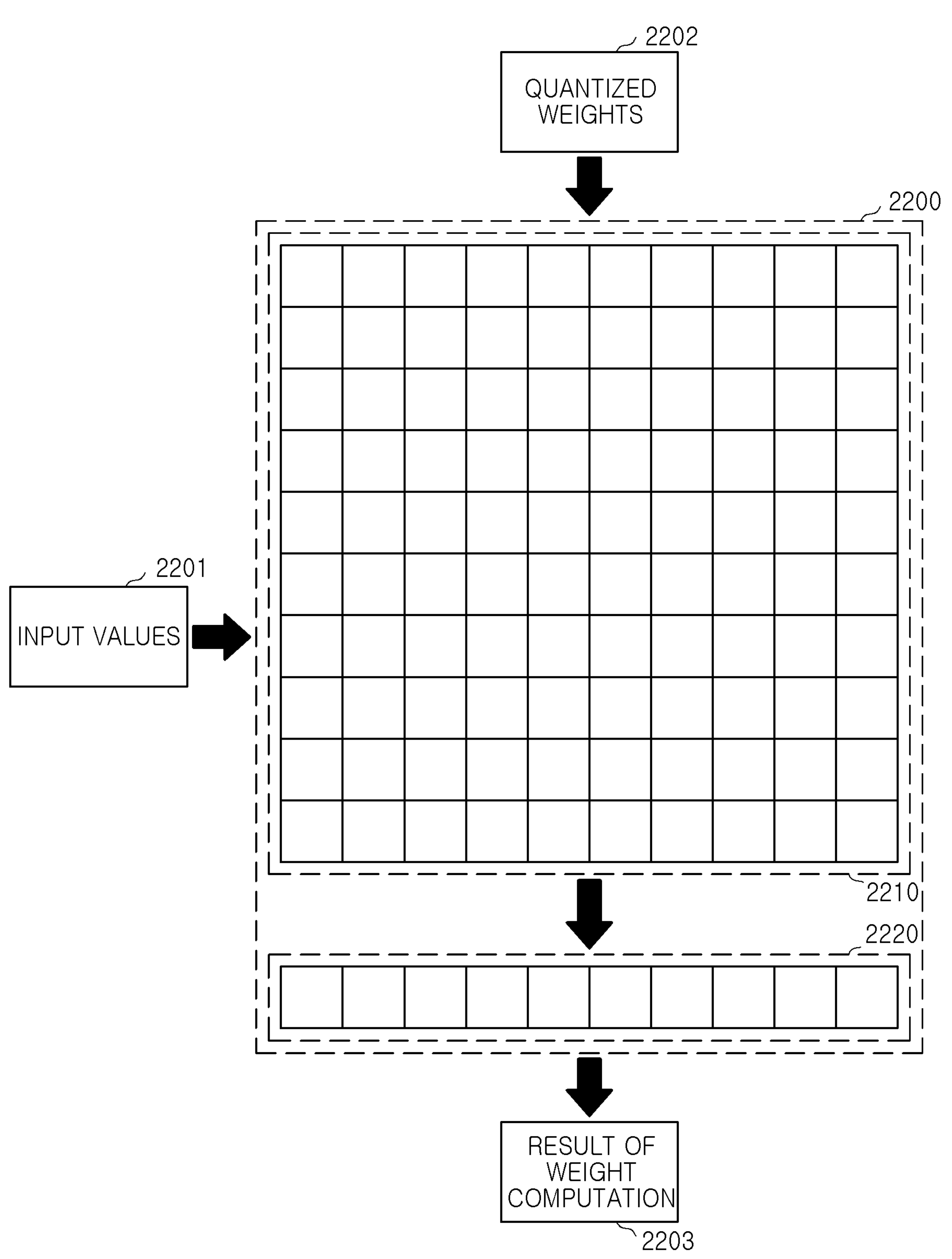

FIGS. 41 and 42 are diagrams illustrating operations of a computational processor included in a neuromorphic device according to some example embodiments.

FIGS. 41 and 42 may correspond to examples in which a computational processor of a neuromorphic device digitally executes a MAC computation and outputs a result of weight computation. For example, in the examples described with reference to FIGS. 41 and 42, the computational processor may not include memory cells storing quantized weights. Accordingly, the neuromorphic device may externally receive input values 2101 and 2201 and quantized weights 2102 and 2202 necessary for MAC computation.

FIG. 41 is a diagram illustrating an example method of digitally executing a MAC computation. Referring to FIG. 41, the computational processor 2100 of the neuromorphic device may include a plurality of MAC computation circuits 2110-2130. The plurality of MAC computation circuits 2110-2130 may receive the input values 2101 and the quantized weights 2102 from an external entity and may execute the MAC computation digitally. The quantized weights 2102 may be values allocated to quantum states for quantizing real weights provided to paths connecting layers to each other in a neural network, and may be a value obtained by converting an unsigned integer into binary data. The input values 2101 may also be quantized and may be input to the computational processor 2100.

For example, when the computational processor 2100 executes a MAC computation connecting an N number of previous nodes to an M number of current nodes, input values output by the N number of previous nodes may be input to the first MAC computation circuit 2110. Also, quantized weights 2102 obtained by quantizing real weights provided to paths connecting the first current node to N number of previous nodes may be input to the first MAC computation circuit 2110. Similarly, input values 2101 output by the N number of previous nodes may be input to the second MAC computation circuit 2120, and quantized weights 2102, obtained by quantizing real weights given to paths connecting the second current node to the N number of previous nodes, may be input to the second MAC computation circuit 2120.

Accordingly, each of the plurality of MAC computation circuits 2110-2130 may output a result of weight computation 2103 corresponding to each of the M number of current nodes. As described above, the neuromorphic device may determine the output value of each of the M number of current nodes by adding the result of weight computation 2103 output by the computational processor 2100 to the result of zero point computation read from the buffer.

FIG. 42 is an example illustrating a computational processor 2200 digitally executing a MAC computation. Referring to FIG. 42, the computational processor 2200 may include a multiplier array 2210 and an accumulator 2220 for MAC computation. The multiplier array 2210 may include a plurality of multipliers arranged along a plurality of rows and a plurality of columns, may receive input values 2201 in a plurality of rows, and may receive quantized weights 2202 quantized in a plurality of columns. The input values 2201 may be quantized and may be input to the multiplier array 2210 as a zero point input value and quantized input values.

In some example embodiments, each of the plurality of multipliers included in the multiplier array 2210 may multiply n-bit data and may output 2n-bit result data. Two or more multipliers connected to a single column among the plurality of multipliers may be connected to a single register included in an accumulator 2220. The accumulator 2220 may include a register and an adder, and may accumulate 2n-bit result data output by multipliers connected to a single column.

When weight computation for a single layer among a plurality of layers included in the neural network is completed, the accumulator 2220 may output a result of weight computation 2203. The neuromorphic device may add the result of weight computation output by the computational processor 2200 with the result of zero point computation selected in the buffer and may complete the MAC computation for the corresponding layer, and may start the MAC computation for a subsequent layer, or may output the result of MAC computation to an external host.

Each of the plurality of multipliers included in the multiplier array 2210 may include a plurality of AND gates and an adder circuit, and may execute a multiplication computation according to various multiplication rules. Hereinafter, an example method of performing a multiplication computation in each of a plurality of multipliers will be described in greater detail with reference to FIGS. 43 and 44.

Figure 43:
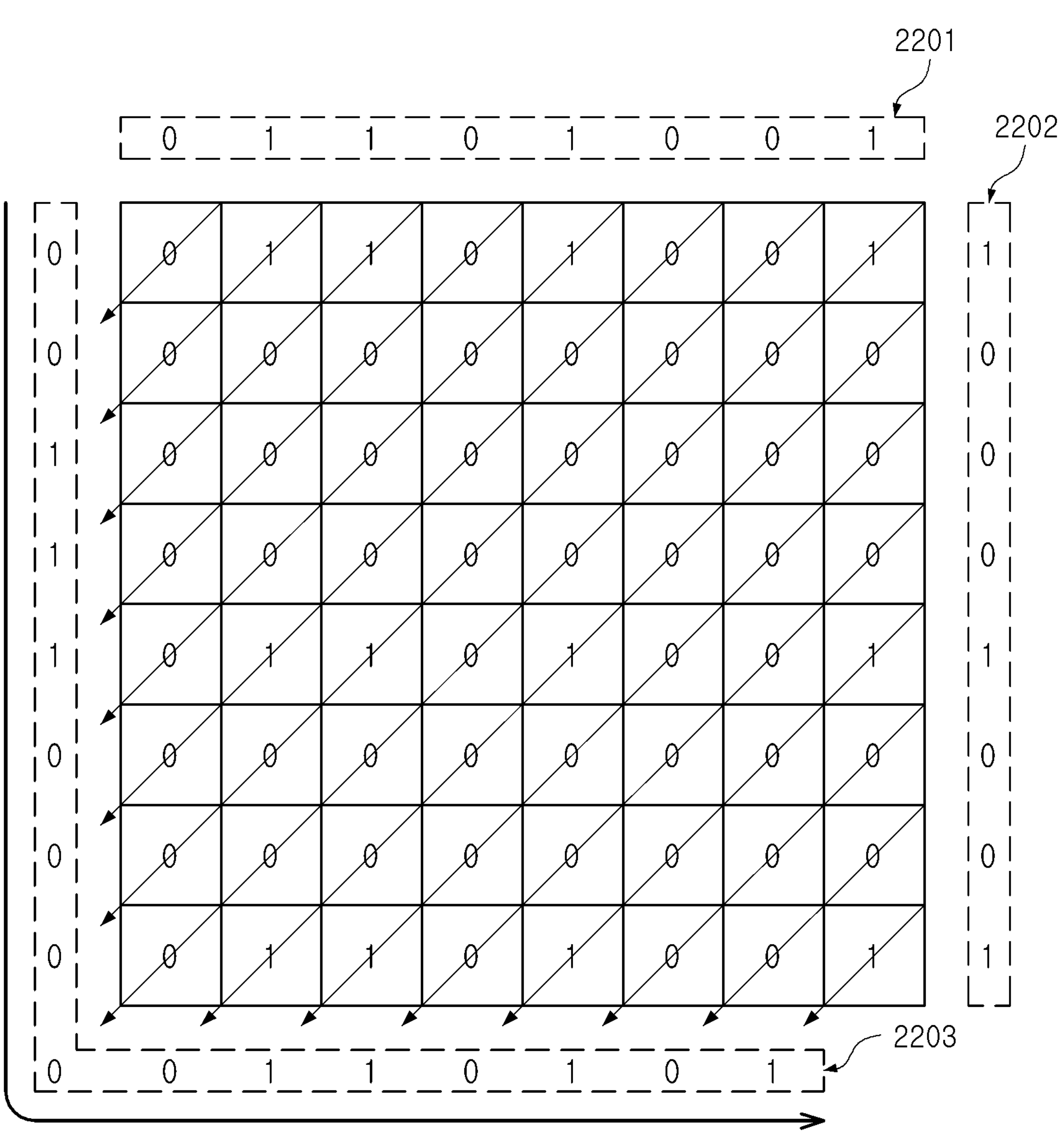
FIGS. 43 and 44 are diagrams illustrating operations of a computational processor included in a neuromorphic device according to some example embodiments of the present disclosure.
Figure 44:
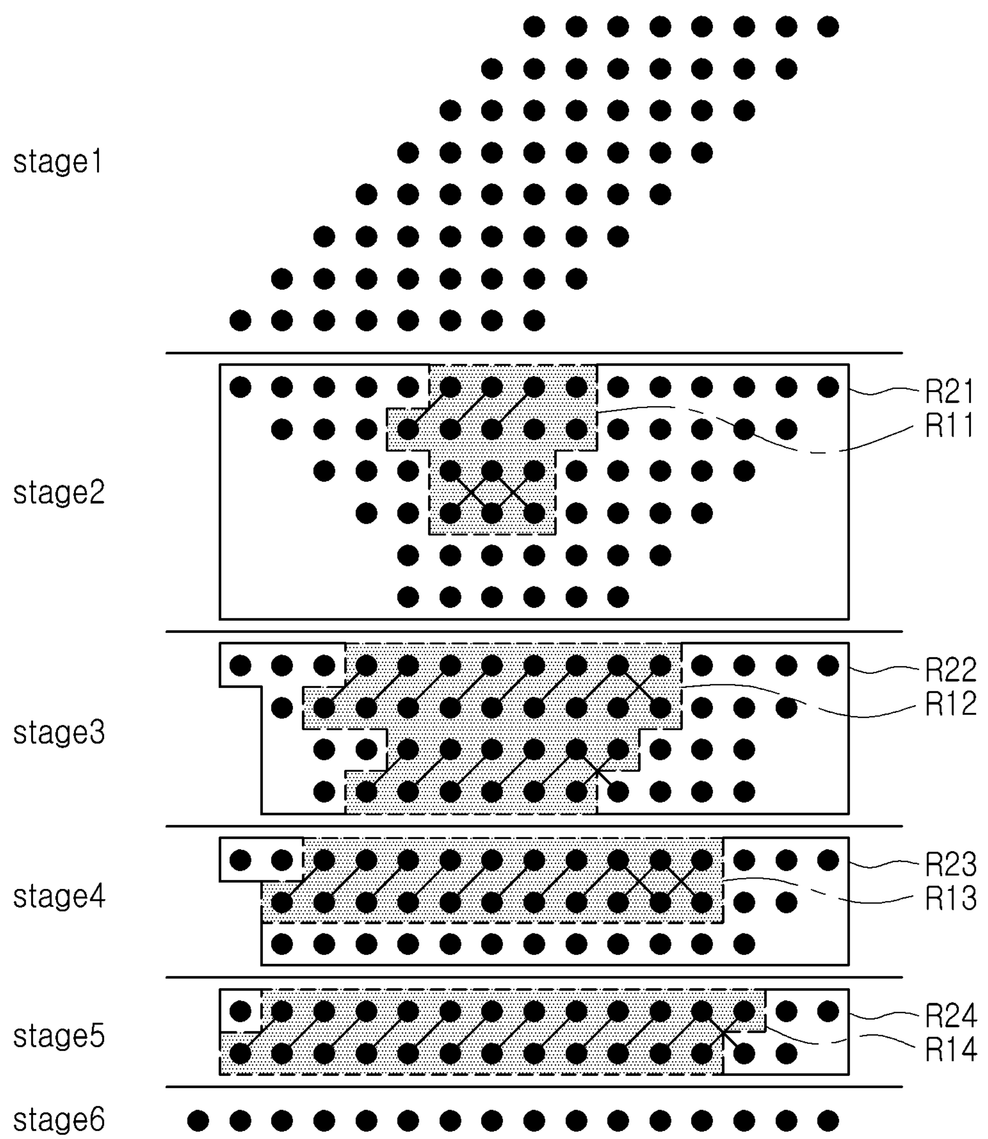

FIGS. 43 and 44 are diagrams illustrating operations of a computational processor included in a neuromorphic device according to some example embodiments.

When the computational processor does not include memory cells storing quantized weights, the computational processor may digitally execute the multiplication computation. As an example, the multiplier of the computational processor may execute a multiplication computation using at least one computation rule of DADDA multiplication, WALLACE multiplication, lattice multiplication, and booth multiplication, and a digital logic circuit for executing at least one of the computation rules.

FIG. 43 may be a diagram illustrating an example in which multiplication is performed by a lattice multiplication rule. For example, the multiplier of the computational processor may multiply the input value 2201 converted into 8-bit data by a weight 2202 converted into 8-bit data. In some example embodiments, the input value may be a zero point input value and/or a quantized input value, and the weight may be a quantized weight. In some example embodiments, the multiplication computation of the zero point weight and the input value may be performed in an external host (e.g., not in a neuromorphic device) including a computational processor.

Referring to FIG. 43, an input value 2201 may be disposed on an upper end of a lattice, a weight 2202 may be disposed on the right side of the lattice, and an AND computation may be performed bit by bit, and 64 pieces of data included in an 8×8 matrix may be defined. When the AND computation is finished, the MAC computation circuit may perform an addition computation by a bit unit in a diagonal direction illustrated in FIG. 43 from the lower right with respect to the lattice. For example, When a carry-on number appears as a result of performing the addition computation in the diagonal direction, "1" may be added to a plurality of pieces of data arranged in the subsequent diagonal direction. According to the above rule, the result of the addition computation in the fourth diagonal direction from the lower right side may be "0," and the result of the addition computation in the fifth diagonal direction may be "1."

When the addition computation in the diagonal direction for overall data in the lattice is completed, the output value 2203 may be derived by arranging bits in sequence from the upper left end of the lattice. In the example embodiment in FIG. 43, the result of multiplying the input value "01101001" by the weight "10001001" may be obtained as "0011100000110101."

To perform multiplication in the lattice multiplication method as described with reference to FIG. 43, the multiplier of the MAC computation circuit may include an AND gate and an adder circuit. For example, when a single multiplier may include 64 AND gates, the AND computation of each bit of the 8-bit input value 2201 and the 8-bit weight 2202 may be simultaneously performed, and 64 pieces of data included in the lattice may be combined. However, the number of AND gates included in the multiplier may be appropriately selected if desired.

FIG. 44 may be a diagram illustrating an example in which multiplication is performed by the DADDA rule. In the example illustrated in FIG. 44, similarly to the example described with reference to FIG. 43 above, the multiplier of the computational processor may multiply the input value converted into 8-bit data with a weight converted into 8-bit data. In some example embodiments, the input value may be a zero point input value and/or a quantized input value, and the weight may be a quantized weight. The multiplication computation of the zero point weight and the input value may be performed in an external host, rather than in a neuromorphic device including a computational processor.

By performing, an AND computation on an input value with each of the 8 bits included in the weight, 8 pieces of 8-bit data may be generated, and may be aligned as in the first stage STAGE1 illustrated in FIG. 44. Accordingly, the height of the first stage STAGE1 may be 8. Thereafter, a portion of bits arranged in the vertical direction among eight pieces of data included in the first stage STAGE1 may be summed to obtain each sum and a carry-on number, and a second stage STAGE2 may be configured using the obtained results. In the second stage STAGE2, the height may be reduced to 6.

In the DADDA multiplication, the result of multiplication may be obtained by repeating the process of calculating the sum and the number of carry-on numbers by summing a portion of the plurality of pieces of data included in the previous stage, and transferring the calculated result to a subsequent stage together with the remaining data. For example, the heights may decrease one by one in sequence in the third to fifth stages STAGE3-STAGES, and finally, a result of multiplication may be obtained in the sixth stage STAGE6.

For example, each of the areas R12-R24 illustrated in FIG. 44 may be areas for classifying the pieces of data on which a computation for matching the heights of the stages STAGE1-STAGE6 is executed. In each of the areas R12-R24 illustrated in FIG. 44, the bits indicated by the diagonal lines may be added by a half adder, and the bits indicated by the letter X may be added by the full adder.

To perform the multiplication in the DADDA multiplication method as described with reference to FIG. 44, the multiplier of the MAC computation circuit may include an AND gate, and an adder circuit. The adder circuit may include at least one half adder circuit and at least one full adder circuit.

In the neuromorphic device, the computational processor may digitally execute a MAC computation of input values and quantized weights. The digitally operating computational processor may not include a cell array storing quantized weights, and accordingly, the digitally operating computational processor may receive input values necessary for computation and quantized weights from an external entity and may perform the MAC computation. However, in some example embodiments, the computational processor may include a cell array storing quantized weights, and may perform a MAC computation using the cell array.

A computational processor digitally executing a MAC computation may include a plurality of MAC computation circuits, and each of the plurality of MAC computation circuits may include a multiplier, an adder, and a register. In each of the MAC computation circuits, the multiplier may include an AND gate, an adder logic circuit to digitally multiply N-bit input values and M-bit quantized weights.

Also, the computational processor may not execute the MAC computation using the zero point weight and input values. Instead, the MAC computation using the zero point weight and input values may be executed in an external host connected to the neuromorphic device, and the neuromorphic device may store the zero point result of computation transmitted by the external host as a result of the MAC computation in a buffer.

When the operation corresponding to the neural network starts, the neuromorphic device may count the number of 1s included in the input values transmitted between the layers of the neural network and may select the result of zero point computation from the buffer, and the output value of each of the nodes of the corresponding layer may be determined by summing the number of 1s with the result of weight computation output by the computational processor. In some example embodiments, the external host may execute the result of zero point computation and the computational processor may be digitally implemented if desired, thereby improving integration density and reducing power consumption and computation burden of the neuromorphic device, and decreasing the reduction in computational accuracy caused by quantization of input values and weights.

Figure 45:
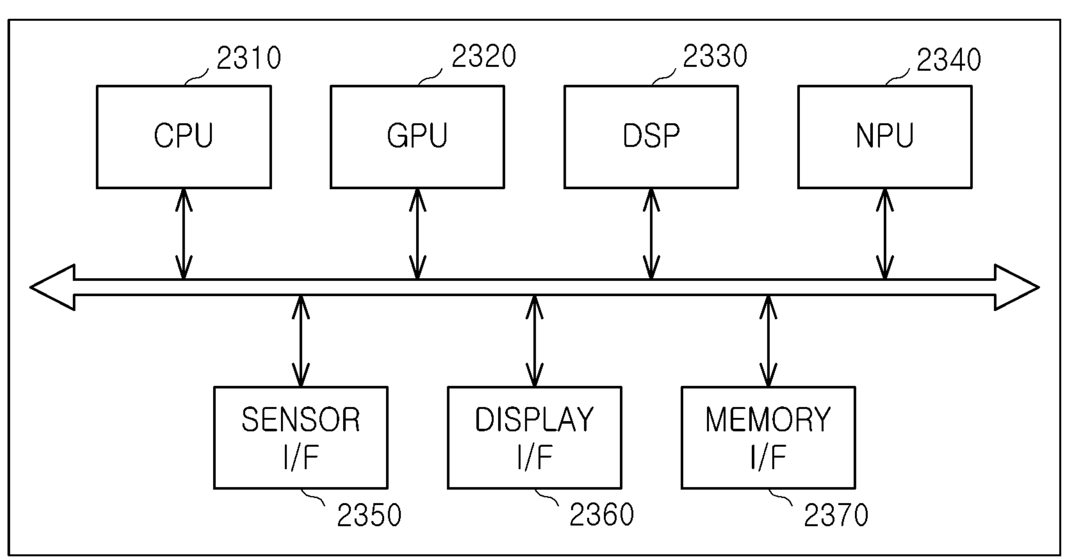
FIG. 45 is a block diagram illustrating a semiconductor device including a neuromorphic device according to some example embodiments of the present disclosure.

FIG. 45 is a block diagram illustrating a semiconductor device including a neuromorphic device according to some example embodiments.

Referring to FIG. 45, a semiconductor device 2300 may include a CPU 2310, a GPU 2320, a DSP 2330, an NPU 2340, a sensor interface 2350, a display interface 2360, and a memory interface 2370. In some example embodiment, the semiconductor device 2300 illustrated in FIG. 45 may be an application processor, a system-on-chip (SoC) mounted on an electronic device.

The CPU 2310 may include one or more cores, cache memories, a bus, and/or a controller. The GPU 2320 may execute an operation related to graphic data processing, and the DSP 2330 may be an IP block processing a digital signal.

The NPU 2340 may execute a computation based on a neural network, and may include the neuromorphic device according to any of the example embodiments. For example, the NPU 2340 may quantize real weights of each of the layers included in the neural network, and may store the quantized weights in weight arrays and may store zero point weights in a zero point array, respectively. Accordingly, by preventing zero point cells storing zero point weights of each of the layers included in the neural network from overlapping, integration density of the NPU 2340 may improve.

Also, the NPU 2340 may execute a multiplication computation of the zero point weight and the input values in advance and may store the result thereof in the buffer as results of zero point computation, may select one of the results of zero point computation stored in the buffer according to the number of 1s included in the input values, and may sum the result and the result of weight computation. Accordingly, the computation burden and power consumption of the NPU 2340 may be reduced.

In the NPU 2340, a cell tile in which memory cells for storing weights are disposed and a reference tile in which reference cells for generating a reference current are disposed may be separately provided. The cell tile may output digital cell data, the reference tile may output digital reference data, and a comparator circuit may output the result of MAC computation by comparing the digital cell data with the digital reference data.

According to some of the aforementioned example embodiments, weights corresponding to a plurality of layers included in the neural network may be stored in memory cells of each of the cell arrays, and a reference cell array may provide reference currents separately from the cell arrays for accurate computation while the inference operation is executed. By obtaining results of computation from the plurality of cell arrays using the reference currents output by a single reference cell array, integration density and power consumption of the neuromorphic device may improve.

Also, the zero point weights and the quantized weights generated by quantizing the real weights may be stored in weight arrays and at least one zero point array, which are different cell arrays, in a divided manner. Also, by configuring a plurality of weight arrays in which quantized weights are stored to share a single zero point array, integration density and power consumption of the neuromorphic device may improve, and computation burden may be reduced.

Further, the neuromorphic device may not directly process the zero point computation using the zero point weight, and may receive the result of zero point computation from the external host and may execute the computation for implementing the neural network. Accordingly, integration density and power consumption of the neuromorphic device may increase, and computation errors may be reduced, thereby improving performance.

While some example embodiments have been illustrated and described above, it will be apparent to those skilled in the art that modifications and variations could be made without departing from the scope of the present disclosure as defined by the appended claims.

What is claimed is:

1. A neuromorphic device, comprising:
- a plurality of cell tiles, each of the plurality of cell tiles including:
  - a cell array including a plurality of memory cells configured to store weights of a neural network,
  - a row driver connected to the plurality of memory cells via a plurality of row lines, and
  - at least one cell analog-digital converter (ADC) connected to the plurality of memory cells via a plurality of column lines, the at least one cell ADC configured to convert cell currents read via the plurality of column lines into a plurality of pieces of digital cell data;

a reference tile distinct from the plurality of cell tiles, the reference tile including:

a reference cell array including a plurality of reference cells, the reference cell array distinct from the cell array of each of the plurality of cell tiles, a reference row driver connected to the plurality of reference cells via a plurality of reference row lines, the reference row driver distinct from the row driver connected to the plurality of memory cells, and at least one reference ADC connected to the plurality of reference cells via a plurality of reference column lines, the at least one reference ADC configured to convert reference currents read via the plurality of reference column lines into a plurality of pieces of digital reference data, wherein the at least one reference ADC is distinct from the at least one ADC connected to the plurality of memory cells; and at least one comparator circuit configured to compare the plurality of pieces of digital cell data with the plurality of pieces of digital reference data.

2. The neuromorphic device of claim 1, wherein the reference tile further includes:

a buffer configured to store the plurality of pieces of digital reference data output by the at least one reference ADC.

3. The neuromorphic device of claim 1, wherein the neuromorphic device is configured such that, when an inference using the neural network starts, the reference tile converts the reference currents into the plurality of pieces of digital reference data and stores the data in a buffer, and the at least one comparator circuit compares the plurality of pieces of digital cell data output by each of the plurality of cell tiles with the plurality of pieces of digital reference data stored in the buffer.

4. The neuromorphic device of claim 1, wherein:

the at least one comparator circuit includes a plurality of comparator circuits, each of the plurality of comparator circuits including a plurality of comparators, respectively, and the plurality of comparator circuits are connected to the plurality of cell tiles, respectively, and a number of the plurality of comparators included in the plurality of comparator circuits is equal to a number of the plurality of column lines included in the plurality of cell tiles.

5. The neuromorphic device of claim 1, wherein the at least one comparator circuit includes a plurality of comparators, and the plurality of comparators are connected to the plurality of cell tiles, respectively.

6. The neuromorphic device of claim 1, wherein:

the at least one comparator circuit includes a plurality of comparator circuits having a plurality of comparators, respectively, each of the plurality of comparator circuits is connected to two or more cell tiles of the plurality of cell tiles, and the two or more cell tiles are configured to store weights included in a single layer among a plurality of layers included in the neural network.

7. The neuromorphic device of claim 1, wherein the comparator circuit includes a plurality of comparators, and each of the plurality of comparators is connected to two or more of the plurality of cell tiles.

* * * * *